(12) United States Patent
Blumrich et al.

(10) Patent No.: US 7,555,566 B2
(45) Date of Patent: Jun. 30, 2009

(54) MASSIVELY PARALLEL SUPERCOMPUTER

(75) Inventors: Matthias A. Blumrich, Ridgefield, CT (US); Dong Chen, Croton-On-Hudson, NY (US); George L. Chiu, Cross River, NY (US); Thomas M. Cipolla, Cross Katonah, NY (US); Paul W. Coteus, Yorktown Heights, NY (US); Alan G. Gara, Mount Kisco, NY (US); Mark E. Giampapa, Irvington, NY (US); Philip Heidelberger, Cortlandt Manor, NY (US); Gerard V. Kopcsay, Yorktown Heights, NY (US); Lawrence S. Mok, Brewster, NY (US); Todd E. Takken, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 1263 days.

(21) Appl. No.: 10/468,993

(22) PCT Filed: Feb. 25, 2002

(86) PCT No.: PCT/US02/05571

§ 371 (c)(1),
(2), (4) Date: Aug. 22, 2003

(87) PCT Pub. No.: WO02/084509

PCT Pub. Date: Oct. 24, 2002

(65) Prior Publication Data

US 2004/0103218 A1    May 27, 2004

Related U.S. Application Data

(60) Provisional application No. 60/271,124, filed on Feb. 24, 2001.

(51) Int. Cl.
*G06F 15/16* (2006.01)
(52) U.S. Cl. .................. 709/249; 709/200; 709/220; 712/1; 712/10
(58) Field of Classification Search .............. 709/201, 709/205, 220, 245, 249, 250, 200, 1; 712/1, 712/10
See application file for complete search history.

(56) References Cited

U.S. PATENT DOCUMENTS 5,353,412 A * 10/1994 Douglas et al. ............. 709/243
6,466,227 B1 * 10/2002 Pfister et al. ............... 345/619

OTHER PUBLICATIONS

Lakshmivarahan, et al., "Ring, torus and 1-9 hypercube architectures/algorithms for parallel computing", Parallel Computing, Elsevier Publishers, Amsterdam, NL, vol. 25, No. 13-14, Dec. 1, 1999, pp. 1877-1906, XP004363665, ISSN: 0167-8191.

* cited by examiner

*Primary Examiner*—Ario Etienne
*Assistant Examiner*—El Hadji M Sall
(74) *Attorney, Agent, or Firm*—Scully, Scott, Murphy & Presser, P.C.; Daniel P. Morris, Esq.

(57) ABSTRACT

A novel massively parallel supercomputer of hundreds of teraOPS-scale includes node architectures based upon System-On-a-Chip technology, i.e., each processing node comprises a single Application Specific Integrated Circuit (ASIC). Within each ASIC node is a plurality of processing elements each of which consists of a central processing unit (CPU) and plurality of floating point processors to enable optimal balance of computational performance, packaging density, low cost, and power and cooling requirements. The plurality of processors within a single node may be used individually or simultaneously to work on any combination of computation or communication as required by the particular algorithm being solved or executed at any point in time. The system-on-a-chip ASIC nodes are interconnected by multiple independent networks that optimally maximizes packet communications throughput and minimizes latency. In the preferred embodiment, the multiple networks include three high-speed networks for parallel algorithm message passing including a Torus, Global Tree, and a Global Asynchronous network that provides global barrier and notification functions. These multiple independent networks may be collaboratively or independently utilized according to the needs or phases of an algorithm for optimizing algorithm processing performance. For particular classes of parallel algorithms, or parts of parallel calculations, this architecture exhibits exceptional computational performance, and may be enabled to perform calculations for new classes of parallel algorithms. Additional networks are provided for external connectivity and used for Input/Output, System Management and Configuration, and Debug and Monitoring functions. Special node packaging techniques implementing midplane and other hardware devices facilitates partitioning of the supercomputer in multiple networks for optimizing supercomputing resources.

1 Claim, 22 Drawing Sheets

MASSIVELY PARALLEL SUPERCOMPUTER

CROSS-REFERENCE TO RELATED APPLICATION

The present invention claims the benefit of commonly-owned, co-pending U.S. Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending United States patent applications filed on even date herewith, the entire contents and disclosure of each of which is expressly incorporated by reference herein as if fully set forth herein. U.S. patent application Ser. No. 10/468,999, for "Class Networking Routing"; U.S. patent application Ser. No. 10/469,000, for "A Global Tree Network for Computing Structures"; U.S. patent application Ser. No. 10/468,997, for 'Global Interrupt and Barrier Networks"; U.S. patent application Ser. No. 10,469,001, for 'Optimized Scalable Network Switch"; U.S. patent application Ser. No. 10/468,991, for "Arithmetic Functions in Torus and Tree Networks'; U.S. patent application Ser. No. 10/469,992, for 'Data Capture Technique for High Speed Signaling"; U.S. patent application Ser. No. 10/468,995, for 'Managing Coherence Via Put/Get Windows'; U.S. patent application Ser. No. 11/617,276, for "Low Latency Memory Access And Synchronization"; U.S. patent application Ser. No. 10,468,990, for 'Twin-Tailed Fail-Over for Fileservers Maintaining Full Performance in the Presence of Failure"; U.S. patent application Ser. No. 10,469,996, for "Fault Isolation Through No-Overhead Link Level Checksums'; U.S. patent application Ser. No. 10/469,003, for "Ethernet Addressing Via Physical Location for Massively Parallel Systems"; U.S. patent application Ser. No. 10/469,002, for "Fault Tolerance in a Supercomputer Through Dynamic Repartitioning"; U.S. patent application Ser. No. 10/258,515, for "Checkpointing Filesystem"; U.S. patent application Ser. No. 10/468,998,for "Efficient Implementation of Multidimensional Fast Fourier Transform on a Distributed-Memory Parallel Multi-Node Computer"; U.S. patent application Ser. No. 10,468,993, for "A Novel Massively Parallel Supercomputer"; and U.S. patent application Ser. No. 10/437,766, for "Smart Fan Modules and System".

BACKGROUND OF THE INVENTION

1. Field of the Invention

This invention relates generally to the field of supercomputer systems and architectures and more particularly, to a novel massively parallel supercomputer.

2. Discussion of the Prior Art

Massively parallel computing structures (also referred to as "ultra-scale computers" or "supercomputers") interconnect large numbers of compute nodes, generally, in the form of very regular structures, such as grids, lattices or torus configurations. The conventional approach for the most cost/effective ultra-scale computers has been to use standard processors configured in uni-processors or symmetric multiprocessor (SMP) configurations, wherein the SMPs are interconnected with a network to support message passing communications. Today, these supercomputing machines exhibit computing performance achieving gigaOPS-scale. However, there are two long standing problems in the computer industry with the current cluster of SMPs approach to building ultra-scale computers: (1) the increasing distance, measured in clock cycles, between the processors and the memory and (2) the high power density of parallel computers built of mainstream uni-processors or symmetric multi-processors (SMPs').

In the first problem, the distance to memory problem (as measured by both latency and bandwidth metrics) is a key issue facing computer architects, as it addresses the problem of microprocessors increasing in performance at a rate far beyond the rate at which memory speeds increase and communication bandwidth increases per year. While memory hierarchy (caches) and latency hiding techniques provide exemplary solutions, these methods necessitate the applications programmer to utilize very regular program and memory reference patterns to attain good efficiency (i.e., minimize instruction pipeline bubbles and memory locality). This technique is thus not suited for modern applications techniques (e.g., complicated data structures for unstructured meshes and object oriented programming). In the second problem, high power density relates to the high cost of and facility requirements (power, cooling and floor space) for such gigaOPS-scale computers.

It would be highly desirable to provide an ultra-scale supercomputing architecture that will reduce latency to memory, as measured in processor cycles, by at least an order of magnitude, and optimize massively parallel computing at teraOPS-scale at decreased cost, power and footprint.

It would be highly desirable to provide an ultra-scale supercomputing architecture that exploits technological advances in VLSI that enables a computing model where many processors can be integrated into a single ASIC.

It would be highly desirable to provide an ultra-scale supercomputing architecture that comprises a unique interconnection of processing nodes for optimally achieving various levels of scalability.

It would be highly desirable to provide an ultra-scale supercomputing architecture that comprises a unique interconnection of processing nodes optimized for efficiently and reliably computing global reductions, distribute data, synchronize, and share limited resources.

SUMMARY OF THE INVENTION

It is an object of the present invention to provide a new class of massively-parallel, distributed-memory scalable computer architectures for achieving tera-OPS scale computing and beyond, at decreased cost, power and footprint.

It is another object of the present invention to provide a new class of massively-parallel, distributed-memory scalable computer architectures for achieving tera-OPS scale computing and beyond that allows for a maximum packing density of processing nodes from an interconnect point of view.

It is a further object of the present invention to provide an ultra-scale supercomputing architecture that exploits technological advances in VLSI that enables a computing model where many processors can be integrated into a single ASIC. Preferably, simple processing cores are utilized that have been optimized for minimum power consumption and capable of achieving superior price/performance to those obtainable from current architectures, while having system attributes of reliability, availability, and serviceability expected of large servers. Particularly, each computing node comprises a system-on-chip ASIC utilizing two or more processors integrated into one die, with each having full access to all system resources. Many processors on a single die enables adaptive partitioning of the processors to functions such as compute or messaging I/O on an application by application basis, and preferably, enable adaptive partitioning of functions in accordance with various algorithmic phases within an application, or if I/O or other processors are under utilized, then can participate in computation or communication.

It is yet another object of the present invention to provide an ultra-scale supercomputing architecture that incorporates a plurality of network interconnect paradigms. Preferably, these paradigms include a three dimensional torus, global tree and global asynchronous signal networks. The architecture allows parallel processing message-passing algorithms to exploit these interconnects individually or simultaneously, resulting in performance levels unobtainable with a single paradigm of interconnect. Additional synergies derive from the simultaneous use of the multiple processing elements within each node, which can simultaneously access any or all of these interconnects, employing each of them at peak capacity.

It is yet a further object of the present invention to provide a new class of massively-parallel, distributed-memory scalable computer architectures having low latency global communication functionality including the ability for any node to broadcast to all other nodes at high bandwidth and low latency and perform and perform global reduction operations. Such global communication functionality is beneficial for classes of applications involving global 'or' or global 'and' operations, in addition to simple arithmetic functions such as a global addition or maximum, and collective operations It is an additional object of the present invention to provide, in an ultra-scale scalable computer architecture, key synergies that allow new and novel techniques and algorithms to be executed in the massively parallel processing arts.

It is still another object of the present invention to provide a single physical network arranged as a tree interconnect for making both global, collective operations and filesystem I/O, wherein the both types of communications are carried in order to share the cost of the network. Preferably, the Tree network additionally separates I/O operations and collective traffic from the Torus, and provides a means to attach an arbitrary number of I/O service nodes to the application. Because these I/O nodes are physically and logically outside of the Torus, the application can perform I/O and external interactions without unbalancing the performance of the Torus nodes. This leads to significantly enhanced scalability because the Torus nodes all give predictable and repeatable performance, while the I/O nodes assume the burden of all the asynchronous and unpredictable external interactions.

Moreover, these techniques also provide for partitioning of the massively parallel supercomputer into a flexibly configurable number of smaller, independent parallel computers, each of which retain all of the features of the larger machine. Given the tremendous scale of this supercomputer, these partitioning techniques also provide the ability to transparently remove, or map around, any failed racks or parts of racks referred to herein as "midplanes," so they can be serviced without interfering with the remaining components of the system.

It is still another object of the present invention to add serviceability such as Ethernet addressing via physical location, and JTAG interfacing to Ethernet.

According to one aspect of the invention, there is provided a scalable, massively parallel supercomputer comprising: a plurality of processing nodes interconnected in n-dimensions by multiple independent networks, each node including one or more processing elements for performing computation or communication activity as required when performing parallel algorithm operations; and, the multiple independent networks comprising networks for enabling point-to-point and global tree communications among the nodes of independent partitioned subsets thereof, wherein combinations of said multiple independent networks interconnecting said nodes are collaboratively or independently utilized according to bandwidth and latency requirements of a parallel algorithm for optimizing parallel algorithm processing performance.

In the preferred embodiment, the node architecture is based upon System-On-a-Chip (SOC) Technology wherein the basic building block is a complete processing "node" comprising a single Application Specific Integrated Circuit (ASIC). When aggregated, each of these processing nodes is termed a 'Cell', allowing one to define this new class of massively parallel machine constructed from a plurality of identical cells as a "Cellular" computer. Each node preferably comprises a plurality (e.g., two or more) of processing elements each of which includes a central processing unit (CPU), a plurality of floating point processors, and a plurality of network interfaces. Preferably, for rapid low overhead coordination between these multiple processing elements, a novel "Lockbox" is provided.

The SOC ASIC design of the nodes permits optimal balance of computational performance, packaging density, low cost, and power and cooling requirements. It further enables scalability to unprecedented levels in conjunction with novel packaging technologies. The system-on-a-chip level integration allows for low latency to all levels of memory including a local main store associated with each node, thereby overcoming a performance bottleneck increasingly affecting traditional supercomputer systems. Within each Node, each of multiple processing elements may be used individually or simultaneously to work on any combination of computation or communication as required by the particular algorithm being solved or executed at any point in time.

In an example mode of operation, one of the processing elements performs calculations needed by the algorithm, while the other performs communication activities. This allows the computational power of one of the processing elements to be used to off-load complex message matching protocols, while the other processing element continues to calculate independently. Often with complex forms of messaging protocols, particular arithmetic functions, often called "reduction functions", are required to be invoked on message data as it arrives. One processor, the I/O Processor, may be implemented to perform these functions without distracting a second computation processor. Additionally, because of the computational power of the I/O Processor the application is able to define arbitrarily complex reduction functions, supporting new algorithmic development that associates increased computational power with communication activities. For particular classes of parallel algorithms, or parts of parallel calculations, this architecture may apply the power of both processing elements to work in collaboration on communication activities. For example, during periods when exchanges of large amounts of data is required, one of the processing elements can be sending data while the other is receiving data. For particular classes of parallel algorithms, or parts of parallel calculations, this architecture may realize approximately two times the expected computational performance. This architecture allows the multiple networks to be utilized simultaneously, independently, or in collaboration. Because of system-on-a-chip level integration, in collaboration with operating system software designed to take advantage of this architecture, alternating between such modes of operation can occur with minimal overheads. In cases where the computation is awaiting message arrival, this may happen automatically.

Multiple network paradigms are implemented to interconnect nodes for use individually or simultaneously and include three high-speed networks for parallel algorithm message passing. Additional networks are provided for external connectivity used for Input/Output, System Management and Configuration, and Debug and Monitoring services for the supercomputer nodes. The high-speed networks preferably include n-dimensional Torus, Global Tree, and Global Signal configurations. The use of each of these networks may switch back and forth based on algorithmic needs or phases of algorithms. For example, parts of calculations may be performed on the Torus, or part on the global Tree which facilitates the development of new parallel algorithms that simultaneously employ multiple networks in novel ways.

With respect to the Torus network, it is preferably of 3-dimensional design supporting cuboidal or rectangular communication and partitioning. A 3-Dimensional design allows a direct mapping of computational simulations of many physical phenomena to the Torus network. However, higher dimensionality, i.e., 4, 5 or 6-dimensional Toroids, allows shorter and lower latency paths at the expense of more chip-to-chip connections and significantly higher cabling costs. Lower dimensions give longer latency and fewer chip-to-chip communications. Additionally implemented is Minimal-Path Adaptive-Routed using Virtual Cut-Through (VCT) packet based switching network provides sustained high-bandwidth by automatically routing around any points of network congestion. It additionally provides for deterministic shortest-path routing for parallel calculations that benefit from it, or high-priority messages.

Additionally, the torus provides for automatic multi-cast using "Class Routing" techniques where a single packet injected into the network can be deposited at multiple destinations. Preferably, the network is deadlock free by employing two dynamic Virtual Circuits plus two escape "Bubble" circuits for deadlock avoidance. While Torus networks have been used before, as described in herein incorporated, commonly-owned, co-pending U.S. patent application Ser. No. 10/469,001 entitled "Optimized Scalable Network Switch", novel arbitration policies are used to achieve low latency and high throughput in massively scalable systems. A Point-to-Point token-based flow-control most effectively utilizes network buffering while distributing traffic away from hot spots. Guaranteed reliable delivery of packets is further enabled in the torus by employing separate CRC Error Detection on the headers, and full packet CRC error detection for automatic retransmission of corrupted network packets.

With respect to the Global Tree network, one primary functionality is to support global broadcast (down-tree) and global reduce (up-tree) operations. Additional functionality is provided to support programmable point-to-point or sub-tree messaging used for input/output, program load, system management, parallel job monitoring and debug. This functionality enables "service" or input/output nodes to be isolated from the Torus so as not to interfere with parallel computation. That is, all nodes in the Torus may operate at the full computational rate, while service nodes off-load asynchronous external interactions. This ensures scalability and repeatability of the parallel computation since all nodes performing the computation operate at the full and consistent rate. Preferably, the global tree supports the execution of those mathematical functions implementing reduction messaging operations. Preferably, the Global Tree network additionally supports multiple independent virtual channels, allowing multiple independent global operations to proceed simultaneously. The design is configurable and the ratio of computation nodes to service nodes is flexible depending on requirements of the parallel calculations. Alternate packaging strategies allow any ratio, including a machine comprised of all service or input/output nodes, as would be ideal for extremely data-intensive computations.

A third network includes a Global Signal Network that supports communications of multiple asynchronous 'signals' to provide global logical "AND" or "OR" functionality. This functionality is specifically provided to support global barrier operations ("AND"), for indicating to all nodes that, for example, all nodes in the partition have arrived at a specific point in the computation or phase of the parallel algorithm, and, global notification ("OR") functionality, for indicating to all nodes that, for example, one or any node in the partition has arrived at a particular state or condition. Use of this network type enables technology for novel parallel algorithms, coordination, and system management.

Further independent networks include an external I/O Network (such as a Gigabit Ethernet) that provides attachment of service or input/output nodes to external server and host computers; and, an IEEE 1149.1 Joint Test Access Group (JTAG) network that provides complete low-level debug, diagnostic and configuration capabilities for all nodes in the entire machine, and which may be executed remotely from an independent host machine. Preferably, use of the JTAG network operates with or without the cooperation of any software executing on the nodes of the parallel machine. Nodes may be debugged or inspected transparently to any software they may be executing as the networks provide the ability to address all nodes simultaneously or any subset of nodes in the machine. This level of diagnostics and debug is an enabling technology for massive levels of scalability for both the hardware and software.

Novel packaging technologies are employed for the supercomputing system that enables unprecedented levels of scalability permitting multiple networks, and multiple processor configurations. In one embodiment, there is provided multi-node "Node Cards" including a plurality of Compute Nodes, plus an optional I/O Node where the external I/O Network is enabled. In this way, the ratio of computation to external input/output may be flexibly selected by populating "midplane" units with the desired number of I/O Nodes. High speed serial signaling is conducted using a novel adaptive low-power data capture technique. The packaging technology permits multiple sub-network partitionability, enabling simultaneous work on multiple independent problems. Thus, smaller development, test and debug partitions may be generated that do not interfere with other partitions.

Connections between midplanes and racks are selected to be operable based on partitioning. Segmentation further creates isolated partitions, each maintaining the full capabilities of all interconnects, providing predictable and repeatable performance. This enables fine-grained application performance tuning and load balancing that remains valid on any partition of the same size and shape. In the case where extremely subtle errors or problems are encountered, this partitioning architecture allows precise repeatability of a large scale parallel application. Partitionability, as enabled by the present invention, provides the ability to segment so that a network configuration may be devised to avoid, or map around, non-working racks or midplanes in the supercomputing machine so that they may be serviced while the remaining components continue operation.

Advantageously, the novel packaging and system management methods and apparatuses of the present invention support the aggregation of the computing nodes to unprecedented levels of scalability, supporting the computation of "Grand Challenge" problems in parallel computing, and addressing a large class of problems including those where the high performance computational kernel involves finite difference equations, dense or sparse linear equation solution or Fourier transforms, and that can be naturally mapped onto a multidimensional grid. Classes of problems for which the present invention is particularly well-suited are encountered in the field of life sciences.

BRIEF DESCRIPTION OF THE DRAWINGS

Further features, aspects and advantages of the apparatus and methods of the present invention will become better understood with regard to the following description, appended claims, and the accompanying drawings where:

FIG. 8($b$) is a detailed diagram of an exemplary embodiment of the link output circuitry 74 of FIG. 7; FIG. 8($c$) is a detailed diagram illustrating an exemplary embodiment of the local network injection circuit 73 of FIG. 7; and, FIG. 8($d$) is a detailed diagram illustrating an exemplary embodiment of the local network reception circuit 76 of FIG. 7;

DETAILED DESCRIPTION OF THE PREFERRED EMBODIMENTS

Figure 1:
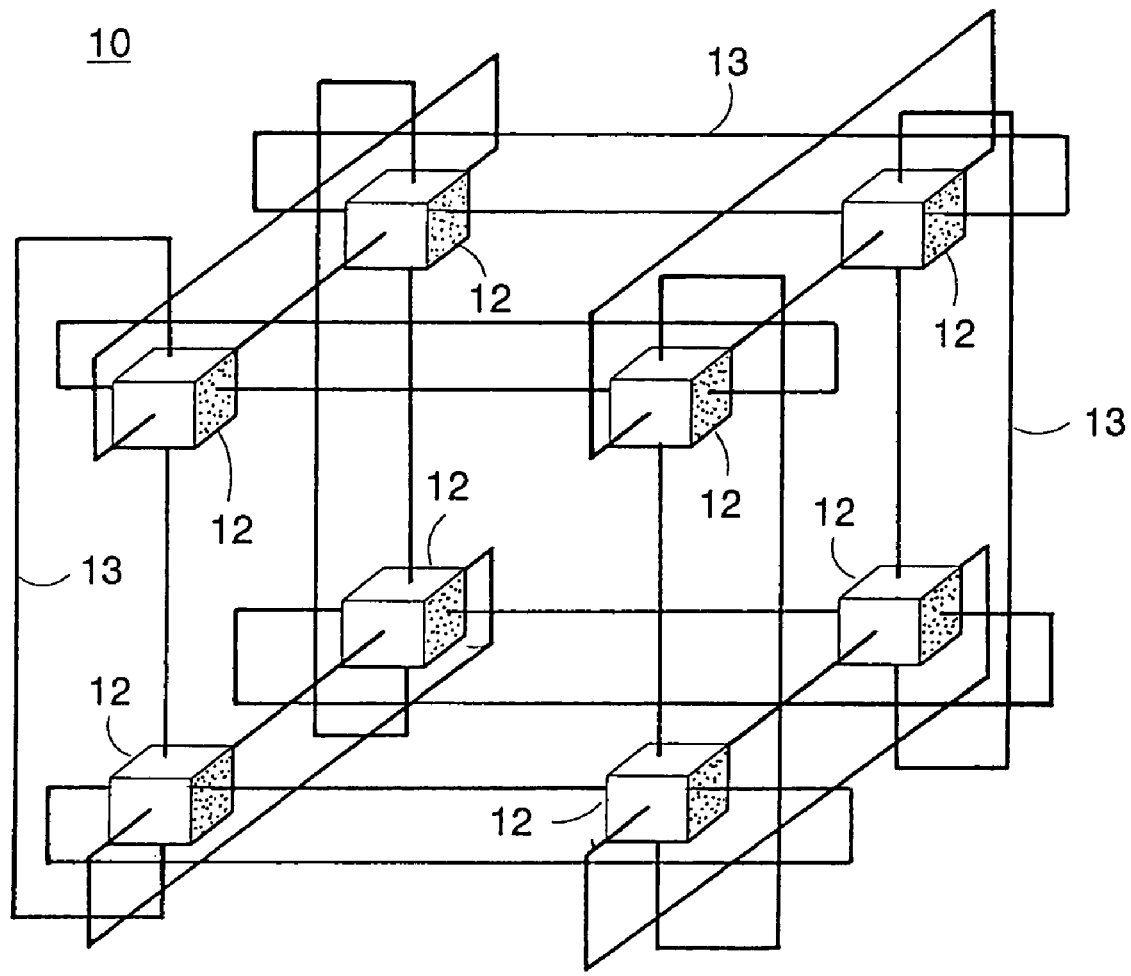
FIG. 1 depicts a small portion 10 of a three-dimensional torus interconnecting eight computing nodes.

The Massively Parallel Supercomputer architecture of the invention is in the form of a three-dimensional torus interconnected and designed to deliver processing power on the order of hundreds of teraOPS (trillion floating-point operations per second) for a wide range of applications. In an exemplary embodiment described herein, the Massively Parallel Supercomputer architecture comprises 64 k processing nodes organized as a 64×32×32 torus with each compute node 12 being connected to six (6) neighboring nodes 12 via 6 bi-directional torus links 13 as depicted in the three-dimensional torus sub-cube portion 10 shown in FIG. 1. It is understood however, that other architectures comprising more processing nodes in different torus configurations is contemplated.

As will be described in greater detail herein, each node 12 comprises a single ASIC and a plurality of SDRAM-DDR memory chips. The nodes are interconnected through at least six (6) networks, the highest aggregate bandwidth of which is a nearest neighbor link that maps the nodes into a physical 3-dimensional torus. In the described embodiment, the interconnect structure comprises a torus with preferably no asymmetries as the nodes communicate with the same bandwidth and nearly the same latency to nodes that are physically close as to those which are physically located on neighboring racks. This facilitates simpler programming models. The ASIC that powers the nodes is based on system-on-a-chip (s-o-c) technology and incorporates all of the functionality needed by the system. It additionally includes 4 Mb or more of extremely high bandwidth embedded DRAM. The nodes themselves are physically small allowing for a very high density of processing and optimizing cost/performance.

In the described embodiment, system packaging comprises 512 processing nodes on a doubled-sided board or "midplane". Each node contains a second processor for handling message passing operations. In addition, associated with a prescribed plurality of processing nodes is a dedicated I/O node that comprises a dual-processor with expanded external memory, for handling of I/O communications to and from the compute nodes. Each I/O node has a small operating system that can handle basic I/O tasks and all the functions necessary for high performance real time code. For compiling, diagnostics, and analysis a host machine is required. The I/O nodes contain a software layer above the layer on the compute nodes for handling host communications. The choice of host will depend on the class of applications and their bandwidth and performance requirements.

Node Overview

Figure 2:
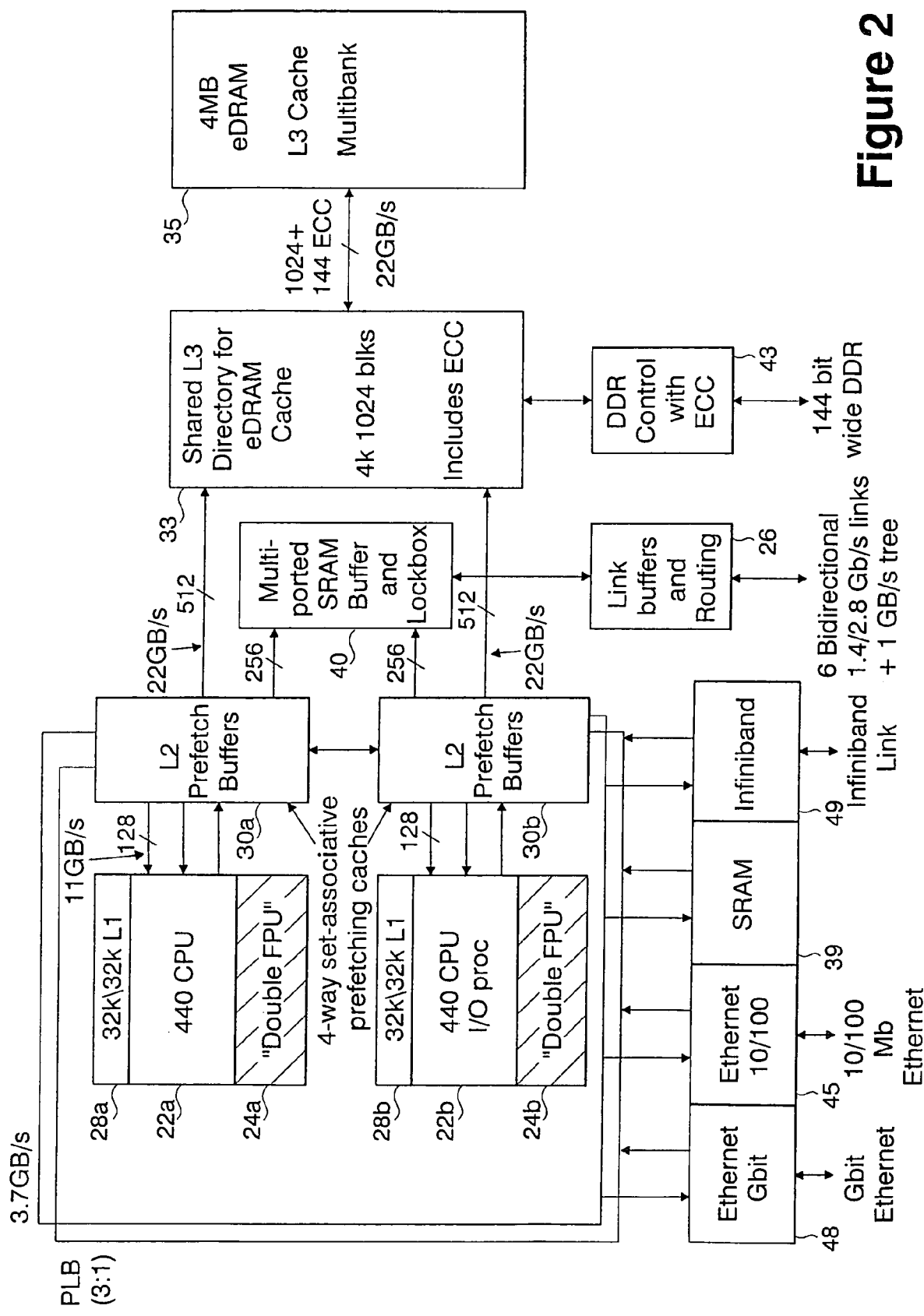
FIG. 2 is a detailed block diagram illustrating a computing node ASIC according to the principles of the invention.

FIG. 2 is a block diagram illustrating a single computing node ASIC 20 according to the principles of the invention. Each node 12 preferably is based on the system-on-a-chip process that integrates all the functions of a computer into a single compute ASIC 20 enabling dramatic reduction of node size and power consumption. In a supercomputer this can be further leveraged to increase node density thereby decreasing the overall cost/performance for the machine. As shown in FIG. 2, the ASIC of this design, which may function as both a compute node and an I/O node in the system, include two processing cores 22$a$, 22$b$ each having a "double" floating point unit 24$a$, 24$b$ respectively that includes two coupled standard floating point units giving a peak performance of four floating point operations per processor cycle. In one embodiment, the embedded processing core of the node is the PowerPC440 available from IBM microelectronics, although the next generation versions of this core may be used as technology improves. A description of the functionality of the PowerPC440 core may be found at http://www.ibm.com/chips/products/powerpc. The "Double" FPU unit 24a, 24b increases the data bandwidth by increasing the datapath from 64 bits to 128 bits to allow for quadword Floating Point loads and stores (i.e., is data moving). Additionally, this unit has been architected to allow two floating point multiply-add instructions to be dispatched and executed in one cycle by splitting these executions units into a real and imaginary complex pair. Newly architected (single instruction, multiple data) SIMD-like instructions feed this complex pair with the ability to execute two floating point multiply-add's per cycle while the normal scalar instruction will utilize the real or primary side only. As an example shown in Table 1, consider a code fragment which performs an operation A*B+C on three complex numbers, A, B, and C. Assume that prior to the computation, the registers ar and ai contain the real and imaginary parts of A, and similarly, the pairs br and bi, and cr and ci hold the values of B and C. A compiler would automatically be able to generate the following code, requiring just two instructions, which places the result into a register pair dr and di.

TABLE 1

Complex A * B + C on Double-FMA in SIMD Mode.

| | |
|---|---|
| ar * br + cr --> tr; ar * bi + ci --> ti | first FMA SIMD instruction |
| −ai * bi + tr --> dr; ai * br + ti --> di | second FMA SIMD instruction |

The node 12 further incorporates other functions into the ASIC 20. Besides the embedded processing core and floating point cores, the system includes embedded DRAM 35, an integrated external DDR memory controller 43, message processor, Ethernet adapter 45, 48 as well as all the network link cut-through buffers and routing control block 26 that allow any two nodes to communicate with low latency. The compute node 12 particularly includes two embedded cores, such as the IBM PowerPC 440, each capable of being utilized for message handling and computation operations. The architecture additionally supports virtual cut-through routing.

As further shown in FIG. 2, virtual cut-through routing is supported in hardware block 26 which is integrated into the ASIC allowing for the elimination of the network adapter. Preferably, a virtual channel routing network is supported with two (2) dynamic and two (2) deterministic channels.

Figure 3:
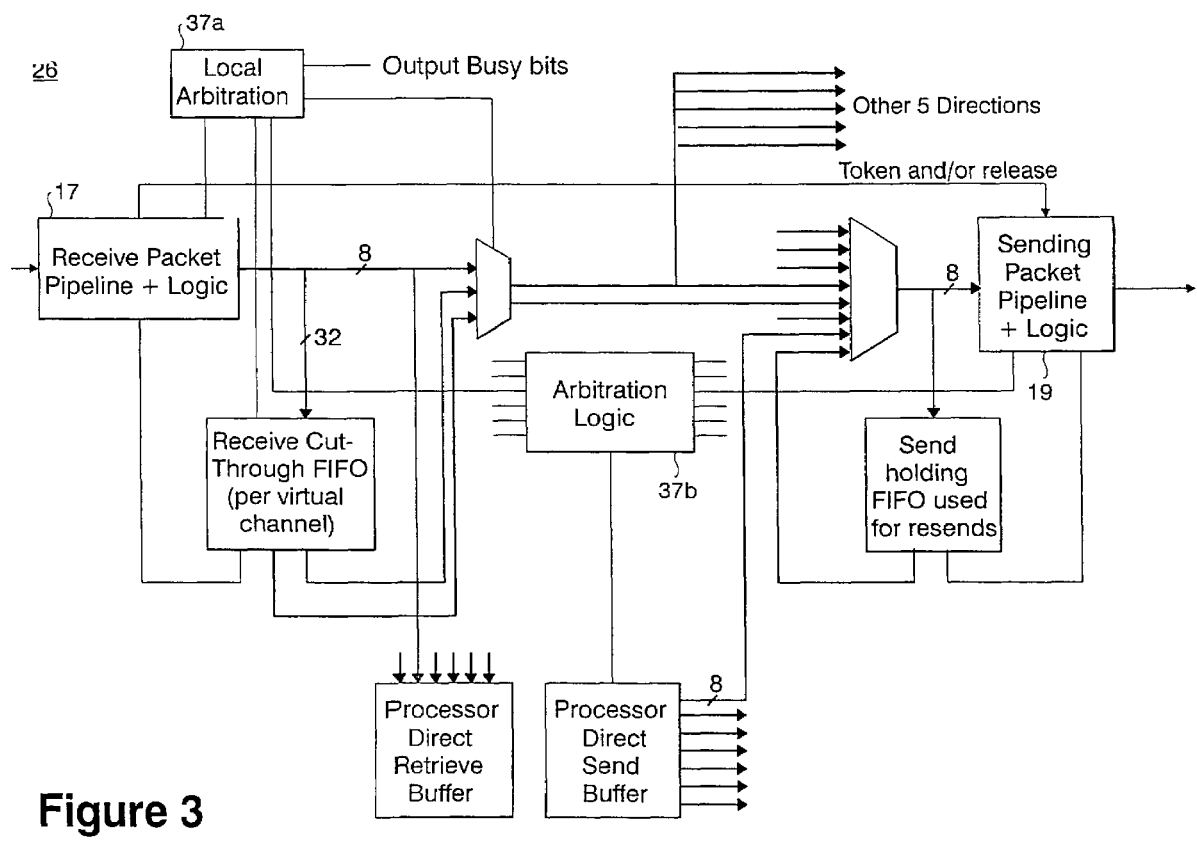
FIG. 3 is a detailed block diagram illustrating the link buffer and virtual cut-through routing control block 26 of FIG. 2.

FIG. 3 is a detailed diagram of the illustrating the link buffer and virtual routing block 26 for packet routing. The data flow is from left to right with only a single input 17 and output channel 19 being shown. Arbitration logic elements 37a,b are provided for output channel arbitration that is performed in hardware through a two stage process. The first stage 37a is local to the input virtual channels while the second stage 37b is local to the output channel. As shown, the block 26 includes the multiple output/input FIFOs for injecting/receiving packets into/from the network which enable full utilization of all 6 bi-directional link ports, simultaneously. Further details regarding operation of the link buffer and virtual routing block 26 may be found in herein-incorporated, commonly-owned, co-pending U.S. patent application Ser. No. 10,469,001 entitled "Optimized Scalable Network Switch".

Referring back to FIG. 2, a Scratch SRAM 39 is additionally provided to serve as a high-performance inter-processor communication mechanism. Both processors 22a, 22b have equal access to the SRAM which is critical for the efficient exchange of network communication descriptors between the "compute" processor and the "message" processor. The size of the Scratch SRAM may range on the order of 32-128 Kbytes. As a common bottleneck for inter-processor communication is the exchange of software locks, the node memory system includes a shared resource especially tailored for handling lock exchanges. That is, a "Lockbox" 40 is provided to enable rapid low overhead coordination between these multiple processing elements. Further details regarding the hardware locking device that provides support for synchronization between the multiple processors in the multiprocessor and the orderly sharing of the resources may be found in herein-incorporated, commonly-owned, co-pending U.S. patent application Ser. No. 11/617,276. entitled "Low Latency Memory Access and Synchronization". It should be further understood that suitable prefetching or coherence hardware may be provided in the node's memory system as described in herein-incorporated, commonly-owned, co-pending U.S. patent application Ser. No. 10/468,995entitled "Managing Coherence Via Put/Get Windows".

Referring back to FIG. 2, there is additionally provided a DDR controller 43 which enables use of the low cost commodity DDR external memory. As mentioned, the latency to this external memory is one of the critical design parameters and different memory configurations may be supported with the internal DDR controller thereby allowing many system memory configurations. One target memory system is based on 256 MB of DDR memory with a 128 bit data interface running at ½, or ⅓, the processor frequency. Additional memory is provided to support ECC and potentially prefetching pointers. When functioning as I/O nodes, the ASIC takes advantage of the flexibility of the DDR Controller and supports a larger external DDR memory, for example 512 MB.

In a preferred embodiment, the same compute node ASIC 20 may be used as an I/O node which is associated with a subset of the compute nodes, e.g. 64 nodes, for handling fileserver communication and I/O operations. That is, the I/O nodes are very similar to the compute nodes however, may differ only in the respect of external memory configuration and, in the addition of an external network interface, such as a Gigabit Ethernet, for example. While the compute nodes may have the integrated Gb Ethernet (they share a common ASIC), for purposes of discussion, the Gb Ethernet interface 48 is provided at the nodes providing service and I/O functionality. All nodes have direct connectivity to a 100 Mb Ethernet network 45.

The node ASIC additionally includes the I/O necessary to connect to an external file systems and to boot, debug and support RAS. There are two networks that may be integrated for this purpose, as shown in FIG. 2: 1) a 100 Mb/s Ethernet 45 with logical Ethernet functions may be integrated inside the ASIC. In this manner, each node ASIC will be independently addressable allowing the host computer direct access to any node in the system. This is an extremely powerful tool useful for booting and diagnostics. In another embodiment, multiple nodes may be connected on an 8-way compute card directly at the Media Independent Interface (MII) layer for reducing external component count, cost and improve reliability; and, 2) the Gb Ethernet 48 with the Gb Ethernet logical layer integrated into the node ASIC. Preferably, this network is utilized on the I/O nodes and the Gb Ethernet resides on the PLB (processor local bus) inside the ASIC. This allows the I/O processor within an I/O node to set up a DMA transfer and return to handling messages with very little overhead. Further, as shown in FIG. 2, high speed file and host I/O may be accommodated by an Infiniband link 49.

As mentioned, the computer utilizes up to six interconnect networks for I/O, debug, and various types of intra-processor communication. Gigabit Ethernet or Infiniband, depending on the availability of appropriate low cost switches and RAID systems, are used to support locally attached disk storage. Fast or 100 Mb/s Ethernet is used for diagnostics, debug, and some aspects of initialization. Two types of high bandwidth, low latency networks make up the system "fabric" and JTAG is used for access to internal processor elements. Thus, there is further integrated in the node an interface between the Ethernet MII layer (directly on the ASIC pins) to an internal JTAG controller (not shown) to facilitate debugging in the embedded arena.

Node Memory

The compute node memory system includes an on-chip cache hierarchy, an off-chip main store, and optimized on-chip support for locking and communication between the two ASIC processors $22a,b$. The memory system is architected for peak performance over the range of target applications, as will be described. The aggregate memory of the machine is completely distributed in the style of a multi-computer, with no hardware sharing between nodes. Each node may, for example, own 256 megabytes of physical memory, resulting in a total of 16 terabytes in a 64K-node system. As shown in FIG. 2, the physical memory of the node 12 is shared by the two processors within the ASIC, and the hardware provides optional coherence support.

Figure 4:
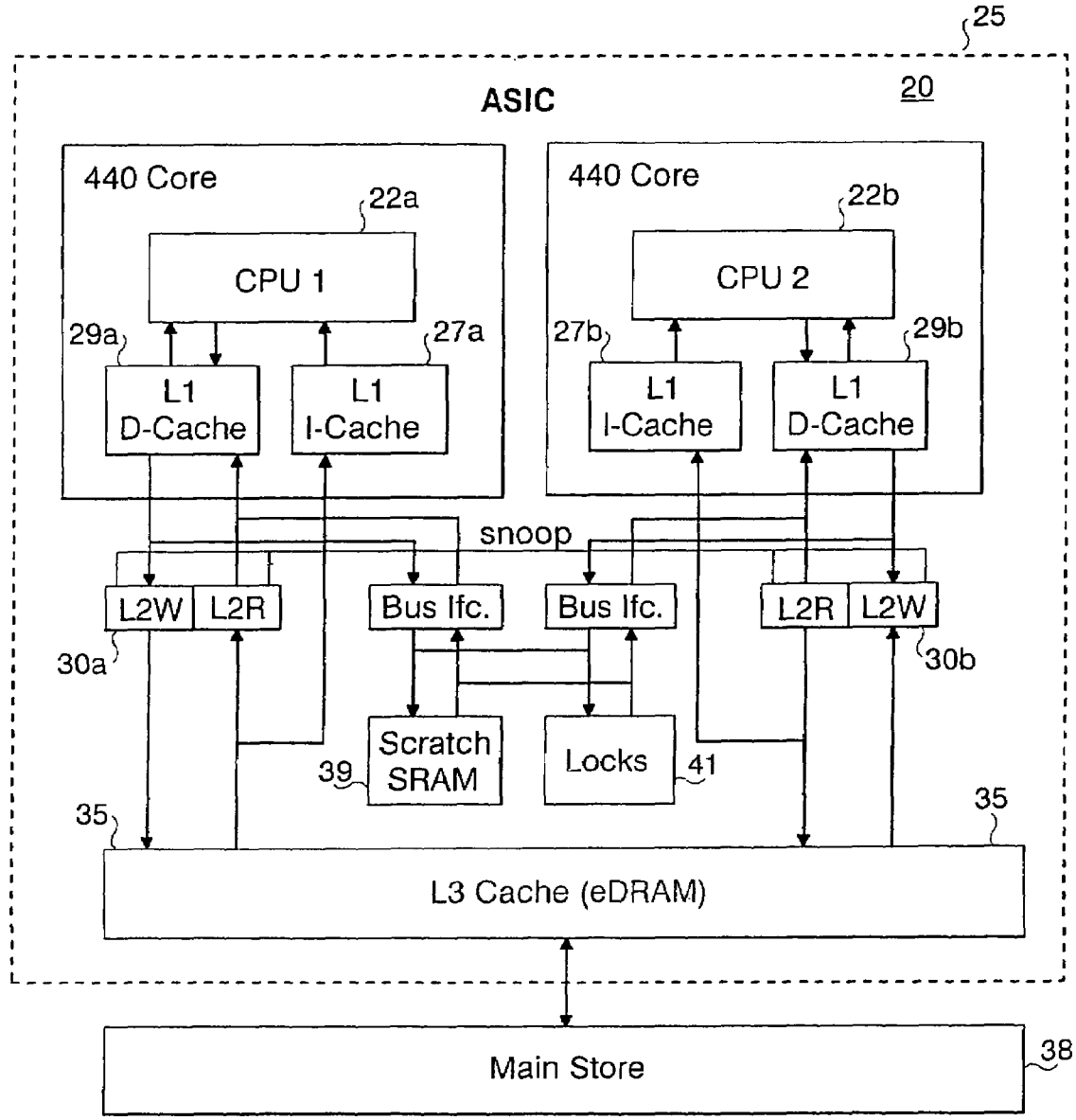
FIG. 4 is a detailed block diagram illustrating the memory system of a single node.

FIG. 4 illustrates the basic components of a single node's memory system 25. As shown in FIGS. 2 and 4, first-level (L1) caches $28a$, $28b$ are provided within the core macros $22a,b$ respectively. Respective second-level L2R and L2W caches $30a$, $30b$ are relatively smaller and basically serve as a prefetch and write-back buffers for L1 data. The third-level (L3) cache 35 is large, is shared by instructions and data, and provides high-bandwidth, low-power access to the working set of most applications. Finally, the nodal memory system includes a main store 38 that is composed of off-chip, double-data rate (DDR) DRAM. More particularly, The L1 instruction cache (I-Cache $27a$, $27b$) is part of each 440 core macro, and is separate from the data cache $29a$, $29b$. In an example embodiment, the I-Cache is 32 Kbytes in size, with a line size of 32 bytes. It is 64-way set-associative, and contains 16 sets. Lines are stored with virtual address tags, and are replaced in round-robin order. If enabled, the I-Cache can speculatively prefetch the next 3 lines following a cache miss. As shown in FIG. 2, I-Cache line fills are performed through a dedicated 128-bit bus emerging from each respective 440 core $22a,b$. Preferably, these fills go around the L2 cache, and are serviced from the L3 cache so they do not interfere with data accesses to the L2 cache. The L1 data cache (D-Cache $29a$, $29b$) is part of the 440 core macro, and is separate from the instruction cache. It has the same basic organization as the I-Cache, but is physically tagged. In one embodiment, the L1 data cache is 32 Kbytes in size, has a line size of 32 bytes, and is set-associative with 16 sets of 64 ways each. Like the I-Cache, it uses a round-robin replacement policy. The data cache produces two separate 128-bit data buses, one for reading and one for writing, each running at the processor frequency. As shown in FIG. 2, the L1 D-Cache buses are connected directly to the L2 Cache for very low-latency L2 hit accesses. A line transfer between the L1 and L2 caches would then require two consecutive 16-byte transfers, and optimally return the critical word first. The 440 memory system allows pages of memory to be mapped as write-back cacheable, write-through cacheable, or cache inhibited. The D-Cache does not support snooping or snarfing, so pages that are cached as write-back cannot be externally invalidated or updated. The D-Cache provides single-cycle hit latency, and, at the nominal design frequency of 700 MHz, for example, the peak fill rate is about 11.2 Gbyte/sec.

As shown in FIG. 4, each L2 cache $30a,b$ includes a read-only line store (L2R) and a write buffer (L2W). Each of the 440 cores has its own L2 structure, but hardware can maintain coherence between the two. Therefore, data which is cached write-back in the L1 can be shared coherently between the two cores. L2R is very small, and basically serves as a prefetch buffer for L1 line fills. L2R is preferably fully associative and contain includes 8 lines, each of which is 64 bytes in size (i.e. twice the size of an L1 line). An L2R hit is expected to have a latency of 3 cycles, and match the peak L1 fill rate. The presence of the L2 write buffer (L2W) allows the core to complete write-backs very quickly and allows for the larger L2/L3 line size to be aggregated before a store in executed. Both the L2 caches $30a,b$ implement some form of prefetching.

The L3 cache 35 is constructed of IMB CU-11 Embedded DRAM (EDRAM), and, in one embodiment, is 4 megabytes in size, or greater. Several options for the organization of the cache are possible. For example, in one embodiment, a straightforward set-associative cache, shared by both processors, is implemented. In another embodiment, two caches, each of which is shared, are implemented. The two-cache organization enables both processors to access the L3 simultaneously in the best case. The capability of partitioning off a portion of the L3 cache for direct access is additionally possible.

At a nominal design core frequency of 700 MHz, for example, the L1 cache may sustain a peak fill rate of 16 bytes every 1.4 nsec cycle. The EDRAM macro can provide 32 bytes of data every 5 nsec in page mode. Therefore, two EDRAM macros in parallel are needed to match the peak L1 fill rate, resulting in a minimum line size of 64 bytes for the L3 cache. The datapath between the L3 and L2 caches may operate at half the core frequency and return 32 bytes (256 bits) per cycle. Again, the L3 cache may be divided for simultaneous processor access, which would result in an implementation requiring four banks of EDRAM macros. As a direct-mapped, 4 Mbyte cache can store 1/64 of the expected 256 Mbyte main store, this results in a tag size of 6 bits. Assuming a line size of 64 bytes, the directory 33 would have 64K entries of 6 bits each, requiring 384 Kbits of SRAM. If the cache is 4-way set-associative, then the number of lines remains the same, but the tag size increases to 8 bits. The node memory system 25 additionally includes the shared resource 41 comprising locks for inter-processor communication and exchange for avoiding bottlenecks.

The main store is external to the node ASIC and, in an example embodiment, is 256 Mbytes in size. It is built from commodity double-data rate synchronous DRAM (SDRAM-DDR) devices. Further details regarding the node memory system may be found in herein-incorporated, commonly-owned, co-pending U.S. patent application Ser. No. 11/617,276

System Interconnect (Types and Topologies)

Ethernet and IEEE1149.1 (JTAG)

In one embodiment, the supercomputer will appear to a host computing system 50 or external server as a large number of nodes (e.g., 64 k) that are accessed through two standard networks. One network is "Fast", or 100 Mb Ethernet 98, used for initial program load and debug access to every node, which makes host control of the ASIC nodes very simple and straightforward. In addition, JTAG, which allows for access to the processor's registers through, for example, the IBM RiscWatch™ software layer, is connected to the 100 MHz Ethernet port 45 within the ASIC, and is accessible using standard Ethernet I/P.

Global Combining Tree

Figure 5:
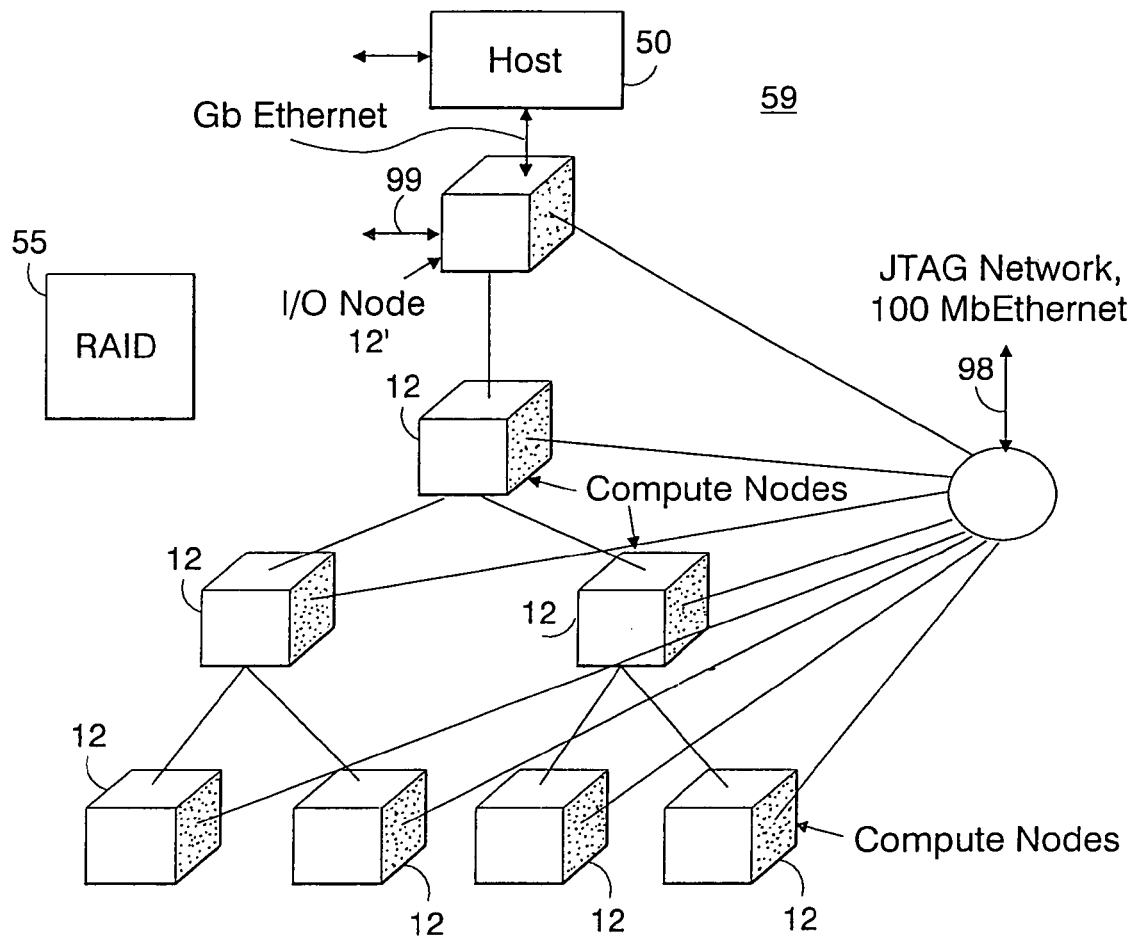
FIG. 5 illustrates a global combining tree network including global signals and external network connections according to the invention.

FIG. 5 illustrates a second network, referred to as the global combining tree network 59, interconnecting compute nodes 12 in a tree structure and including global signals and external network connections according to the invention. Included in the tree is an associated I/O processing node 12' that is connected through the Global Combining Tree to a predetermined number of compute nodes 12. In the preferred embodiment as shown in FIG. 5, one I/O node 12' is dedicated to providing service and I/O operations for 64 compute nodes 12. It should be understood that this ratio of I/O nodes to computer nodes is configurable to optimize physical packaging of the supercomputer. That is, the packaging design enables alternate configurations such that the ratio of computation nodes to service nodes may change depending on requirements of the parallel calculations. In a preferred embodiment, packaging technology supports ratios from 256:1 to 8:1. Alternate packaging strategies allow any ratio, including a machine comprised of all service or input/output nodes, as would be ideal for extremely data-intensive computations.

As shown in FIG. 5, the 100 Mb/s Ethernet network 98 connects both the compute nodes 12 and associated I/O node 12' into a large network, e.g., via network switch 18. As described in greater detail in herein-incorporated, commonly-owned, co-pending U.S. patent application Ser. No. 10/469,003 entitled "Ethernet Addressing Via Physical Location for Massively Parallel Systems", each node ASIC has a unique MAC address which allows a host system 50 to communicate to every node. The TCP/IP address associated with this MAC address contained the encoded geometric location of the node in the supercomputing machine. Thus, for example a diagnostic report from a faulty node can be traced directly through its TCP/IP address to the row and column of its rack, and its location within the rack of the supercomputer. Coupled with the high-speed networks, there is provided the ability to freeze the state of all nodes in the machine simultaneously. As one embodiment of the supercomputer comprises 81,920 compute nodes plus 1,280 input/output nodes, this provides unprecedented levels of diagnostics, debugging and inspection.

When functioning as I/O nodes 12', the ASIC 20 includes a Gigabit Ethernet 99 or like interface such as Infiniband, that may be used to access a large RAID disk system 55 that act as local disks to the nodes. The RAID system 55 is duplexed for redundancy and connected through switches (not shown) to the system through 1024 channels of Gigabit Ethernet 99 or Infiniband. The switches also interface to the host, allowing the host to access either the system nodes or to the RAID disk system through simple Ethernet I/P transactions. Inside the machine, dedicated I/O processors which are ASICs with additional external memory terminate the Gigabit Ethernet/Infiniband connection. Any I/O node can read or write the RAID disk at full gigabit speed. In the example embodiment described, the 64 k nodes of the system are configured to have a peak aggregate I/O bandwidth to disk or host of over 1 terabit per second.

Preferably, this binary-like combining tree 59 may extend over the entire supercomputer machine, allowing data to be sent from any node 12 to all others (broadcast), or a subset of nodes 12, with low latency. It is understood that the tree may have more than 3 ports (3 ports means binary (2 in, 1 out)). Just like in the torus, higher degree trees, i.e., 4-, 5- or 6-D, allows shorter and lower latency paths at the expense of more chip-to-chip connections and significantly higher cabling costs. Lower dimensions give longer latency and fewer chip-to-chip communications. Message passing is supported on the global combining tree 59, and controlled by either of said processors within each ASIC, allowing intensive operations like all-to-all communication to proceed independent of the compute nodes. Every branch of this tree has a preferred target bandwidth of 1.4 GB/s, or 2 bytes per processor cycle, in both the transmit and receive directions.

The hardware functionality built into the tree 59 is integer addition, subtraction, maximum, minimum, bitwise AND, OR, XOR, and broadcast. The functions are implemented in the lowest latency possible manner. For example, the addition function results in the lowest byte of the word being sent first on the global network. This low byte is immediately added to the other bytes (in hardware) from the other sources with the result being shifted out to the next level of the tree. In this way, a 64 bit word has already progressed up several layers of the tree before the high order byte is shifted out. This results in the possibility for a very low latency addition over the entire machine. This low latency addition is critical for iterative sparse linear equation solving techniques that require a global inner product.

The same tree may be utilized for global broadcast of data rather than shipping it around in rings. For communications from one-to-all this is a tremendous improvement, from a software point of view, over the nearest neighbor 3D link network. The broadcast functionality is also very useful when there are one-to-all transfers that need to be concurrent with communications over the 3D link network. A broadcast may also be handled over the 3D link network.

Finally, a global floating point sum over the entire machine may be performed in a few microseconds by utilizing the binary tree two times. The first time the maximum of all the exponents is obtained and the second time all the shifted integer numbers are added in global operations. Further details regarding the implementation of arithmentic functions over the torus may be found in herein-incorporated, commonly-owned, co-pending U.S. patent application Ser. No. 10/468,991 entitled "Arithmetic Functions in Torus and Tree Networks". Further details regarding the operation of the global combining tree network, particularly with respect to functionality supporting programmable point-to-point or sub-tree messaging used for input/output, program load, system management, parallel job monitoring and debug can be found in herein-incorporated, commonly-owned, co-pending U.S. patent application Ser. No. 10/469,000 entitled "A Global Tree Network for Computing Structures".

Global Combining Tree and Barrier Network

Figure 6:
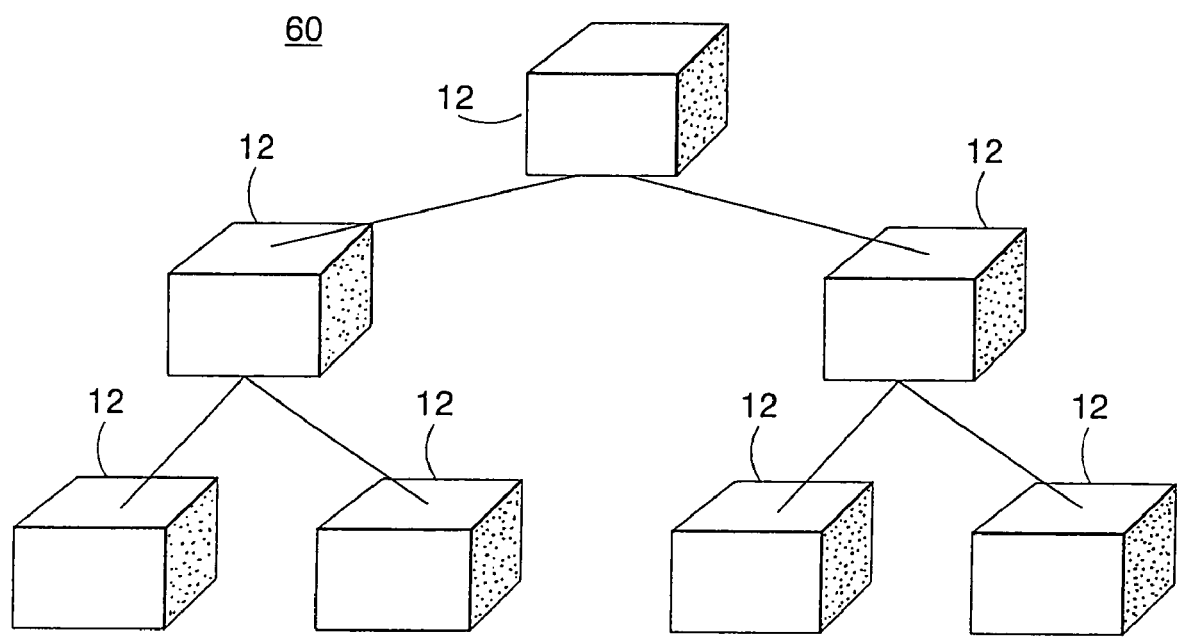
FIG. 6 illustrates the Global Combining Tree and Barrier Network according to the principles of the invention.

FIG. 6 illustrates the Global Combining Tree and Barrier Network 60 according to the principles of the invention. The functionality of the global interrupt and barrier network 60 (FIG. 6) is closely related to the functionality of a global combining tree network 59 (FIG. 5) and may function as a "sideband" network in parallel therewith. For example the global "or" function is an interrupt, and a global "and" is an "all wait". These functions are utilized in the global interrupt and barrier network 60 by generating and communicating global asynchronous signals comprising: (1) signals that each node in a logical partition (e.g., sub-tree network) can set and detect; (2) hardware logic functions that perform a global AND or OR of all the input signals; and (3) a global network to collect and distribute the results to each node. Several different signals may co-exist in a large system and the idea may be implemented in many ways. Preferably, a single bit wide differential pair is run in parallel to the combining tree 59 (FIG. 5) to facilitate low latency global interrupts and barriers.

Referring back to FIG. 6, each root node 65 of the global interrupt and barrier network 60 is connected along the route of the Global Combining Tree to a predetermined number of compute nodes 12 of the computing structure and operates in conjunction therewith for initiating global asynchronous operations in the computing structure, e.g., the massively-parallel supercomputer, as needed for a particular parallel algorithm. Preferably, this binary-like combining tree and barrier and interrupt networks may extend over the entire supercomputer machine, allowing data to be sent from any node 12 to all others (broadcast), or a subset of nodes 12, with low latency. It is understood that other tree embodiments, e.g., tertiary-tree, quaternary, etc. may be implemented with the trade-off for lower latency being more interconnects.

Figure 20:
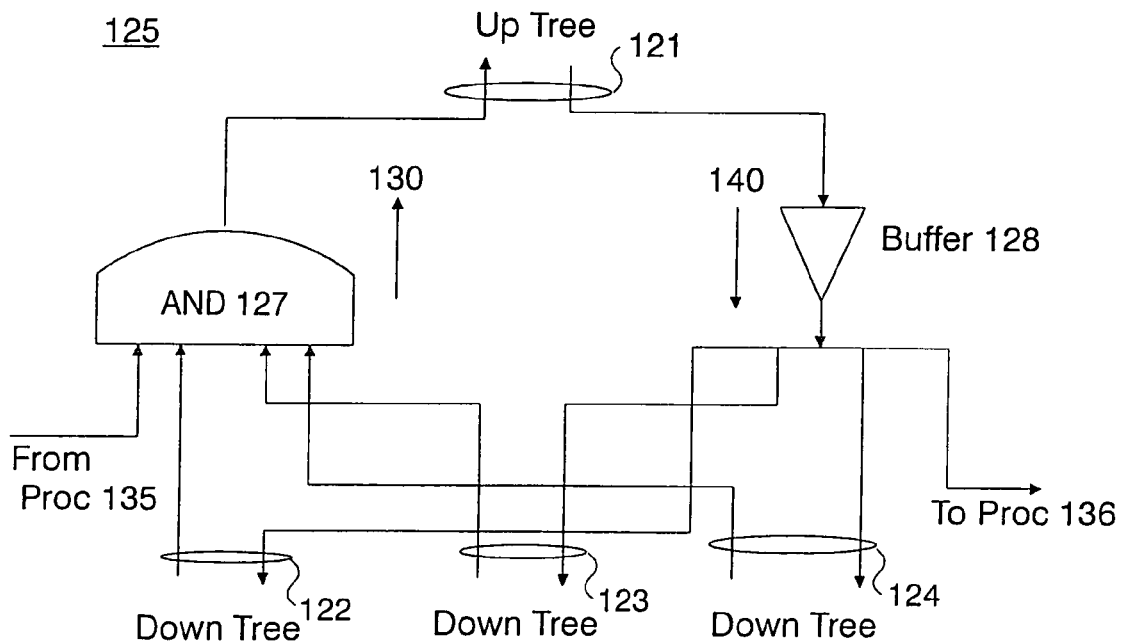

FIG. 20 depicts the logic utilized for asynchronous global signal generation that is implemented in the global interrupt and barrier network 60. Particularly, in view of FIG. 20, the global interrupt and barrier network 60 when implemented as a sideband network to the global combining tree network of FIG. 5, comprises a network of interconnected router devices, one per node. Each router device includes a number of ports that can either be connected to another router, or disabled when not connected. For purposes of discussion, however, as shown in FIG. 20, the router has four ports 121-124 providing datapaths, that permit a 3-tree to be constructed. Only one of the four ports, e.g., port 121 is designated as a connection to a parent node, and up to three of the remaining ports can be connected to child nodes. A leaf node at the bottom of the tree will have only the one port connected to its parent node enabled, while the root of the tree will have no parent enabled, but at least one child enabled.

FIG. 20 is a schematic diagram of the asynchronous logic 125 implemented in a router device included in each ASIC node 12 for global signal tree and barrier network of FIG. 6. In the global signal asynchronous network, for each side band signal, there are four (4) logical bi-directional ports, one up tree port (FIG. 20, 121) and three (3) down tree ports (FIG. 20, 122, 123 and 124). These four logical bi-directional ports are mapped onto four physical bi-directional ports. With software configuration, any one of the physical ports may be mapped as the up tree logical port. This allows flexibility in the layout of the board where a number of these nodes are put together. In addition to the up tree and down tree ports, there is an additional input signal 125 generated from an ASIC processor core at every node, and a result signal 126 for input to the processor's interrupt unit. On the up tree path 130, all inputs from down tree ports 122, 123, 124 plus the input 135 from the central processor (CPU) are input to a logic gate 127 before it is sent out on the uptree path. This logic gate 127 will perform a logic AND function when implemented to perform a global barrier operation (inputs transit from logic '0'→'1'), or, may be implemented as an OR function network when implemented to perform a global interrupt operation (inputs transit from logic '1'→'0'). On the down tree path 140, the input signal from up tree is buffered by buffer device 128 and then broadcast to all down tree ports 122, 123 and 124 and to the processor as signal 136. At the very top of the tree, the two signals for the up tree port (FIG. 20, 121) are simply connected together through an initial software configuration either in the top node or in a link chip device enabling torus and tree sub-network partitioning as described in greater detail herein. Further details regarding the operation of the global combining tree network, particularly with respect to functionality supporting generation and processing of global barriers and interrupts can be found in herein-incorporated, commonly-owned, co-pending U.S. patent application Ser. No. 10/468,996 entitled "Global Interrupt and Barrier Networks".

Three Dimensional Torus

As described with respect to FIG. 1, the physical machine architecture is related to a n-dimensional torus 10 which in the example embodiment, is a simple 3-dimensional nearest neighbor interconnect that is "wrapped" at the edges. All neighbors are equally distant, except for time-of-flight differences such as exist between different racks of ASICs, making code easy to write and optimize. The nearest neighbor links may be four times (4×) the processor speed (e.g., 2.8 Gb/s in each direction) in an example embodiment. Each node therefore supports 6 independent bi-directional nearest neighbor links with an aggregate bandwidth of 4.2 GB/s, for example. As will be described in further detail, the system circuit cards are wired in 2×2×2 sub-cubes while mid-planes, two per rack, are wired as 8×8×8 sub-cubes. The entire 64$k$ machine is a 64×32×32 torus, although other partitions are possible.

Message Passing

Torus

The torus network 10 of FIG. 1 is used for general-purpose, point-to-point message passing and multicast operations to a selected "class" of nodes. The topology is a three-dimensional torus constructed with bi-directional, point-to-point, serial links between routers embedded within the ASICs. Therefore, each ASIC has six nearest-neighbor connections, some of which may traverse relatively long cables. The torus network provides both adaptive and deterministic minimal-path routing, and is deadlock free. Throughput and latency are optimized through the use of virtual cut-through (VCT) routing as described herein and in the reference to P. Kermani and L. Kleinrock entitled "Virtual Cut-Through: A New Computer Communication Switching Technique," Computer Networks, Vol. 3, pp. 267-286, 1979 incorporated herein by reference. Messages may be composed of multiple packets, which are the atomic units of routing. Therefore, adaptively-routed packets from the same message may arrive out of order. Packets are variable in size, ranging from 32 bytes to 256 bytes with a granularity of 32 bytes (i.e. one to eight 32-byte chunks per packet).

Virtual channels (VCs) are used to provide deadlock-free adaptive routing and increase throughput and the torus network in the supercomputer may have four or more VCs in a configuration whereby two VCs employ adaptive routing, and two employ deterministic routing. One of the deterministic VCs is used as an "escape channel" for the adaptive sub-network in order to guarantee deadlock freedom, and the other is reserved for high-priority packets. Because it is expected that most traffic will be adaptively routed, two adaptive VCs are provided in order to reduce head-of-line blocking and allow for the use of simple FIFO buffers within the routers.

Flow control between routers is provided through the use of tokens because the latency across a cable allows multiple packets to be in flight simultaneously. There is sufficient VCT buffer space to maintain full link bandwidth in the absence of contention.

The network will reliably deliver a single copy of every packet injected. Routers guarantee reliable forwarding by keeping good copies of every packet until downstream routers acknowledge successful reception. Using link-level parity or CRC (or both), routers may detect packets corrupted in transmission. When this occurs, an "Error" indicator is appended to the packet indicating that it should be discarded by the receiver. Therefore, only a single, good copy of each packet will leave the network.

Thus, a scheme similar to the Unique Token Protocol of the Reliable Router scheme described in the reference to William J. Dally, Larry R. Dennison, David Harris, Kinhong Kan, and Thucydides Xanthoppulos entitled "Architecture and Implementation of the Reliable Router," Proceedings of HOT Interconnects II, pp. 122-133, August 1994 incorporated by reference herein, which maintains at least two copies of every packet in the network at all times, may be used. However, according to an example embodiment, the present invention maintains only a backup copy while a packet is at risk on a link, which is where almost all of the packet corruption occur. In the rare event that the router hardware corrupts a packet, error detection on the message level may submit a resend request to the sender.

Figure 7:
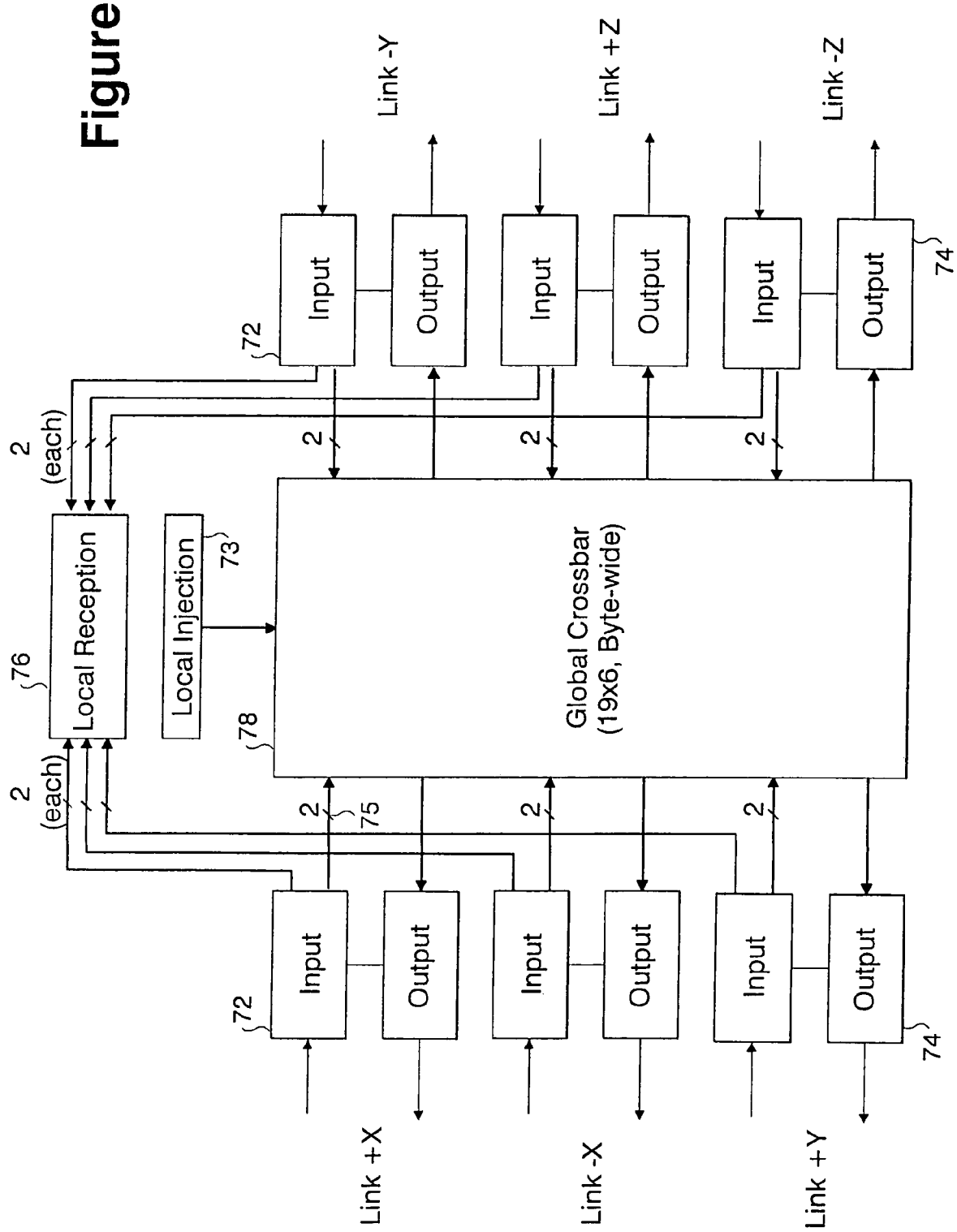
FIG. 7 illustrates the basic architecture of a single torus router 70.

FIG. 7 illustrates the basic architecture of a single torus router 70 including link input circuits 72 and link output circuits 74. Local Input includes seven (7) network injection queues 73, six of which are used for normal packets destined for any direction, and the seventh for high-priority packets destined for any direction. Local Output includes twelve (12) reception queues 76, six queues for normal packets from each direction and six queues for high-priority packets from each direction.

Each link input 72 includes at least four VCT queues (one for each virtual channel), and two input paths to a crossbar switch 78 to reduce head-of-line blocking. There is an associated input arbiter that determines which of the VCT FIFOs, or possibly an arriving packet, gets to use the crossbar inputs. Each link output 74 includes a re-transmission FIFO for reliability, and an output arbiter that schedules packets from the inputs or injection queues onto the associated link. It is understood that communication between the input and output circuitry is provided at each link port in order to coordinate the transmission of flow-control tokens. Further details regarding the implementation of VCT routing in the supercomputer of the present invention may be found in herein-incorporated, commonly-owned, co-pending U.S. patent application Ser. No. 10/469,001.

Router Input

Figure 8A:
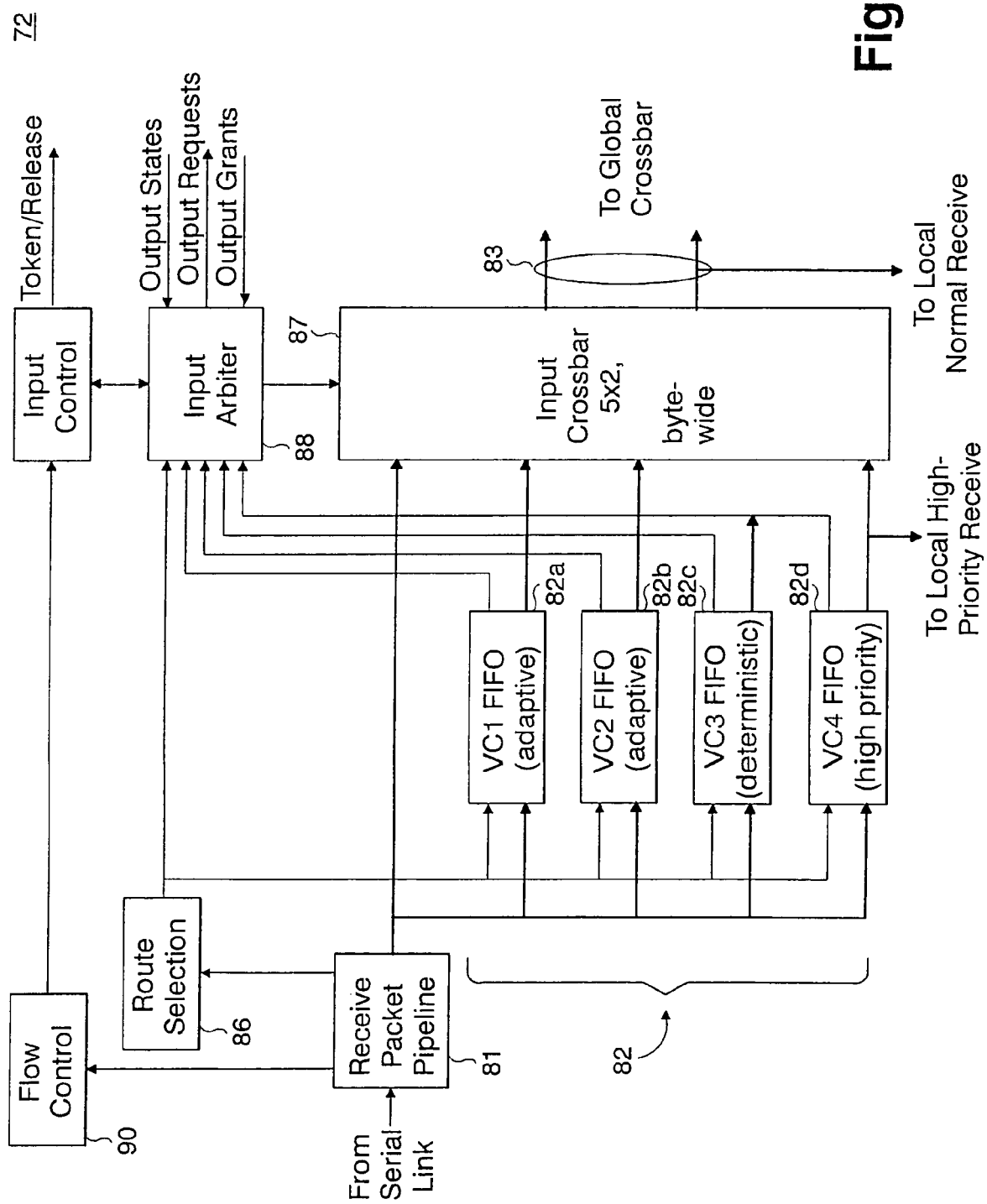
FIG. 8($a$) is a detailed diagram of an exemplary embodiment of the link input circuitry 72 of FIG. 7.
Figure 8B:
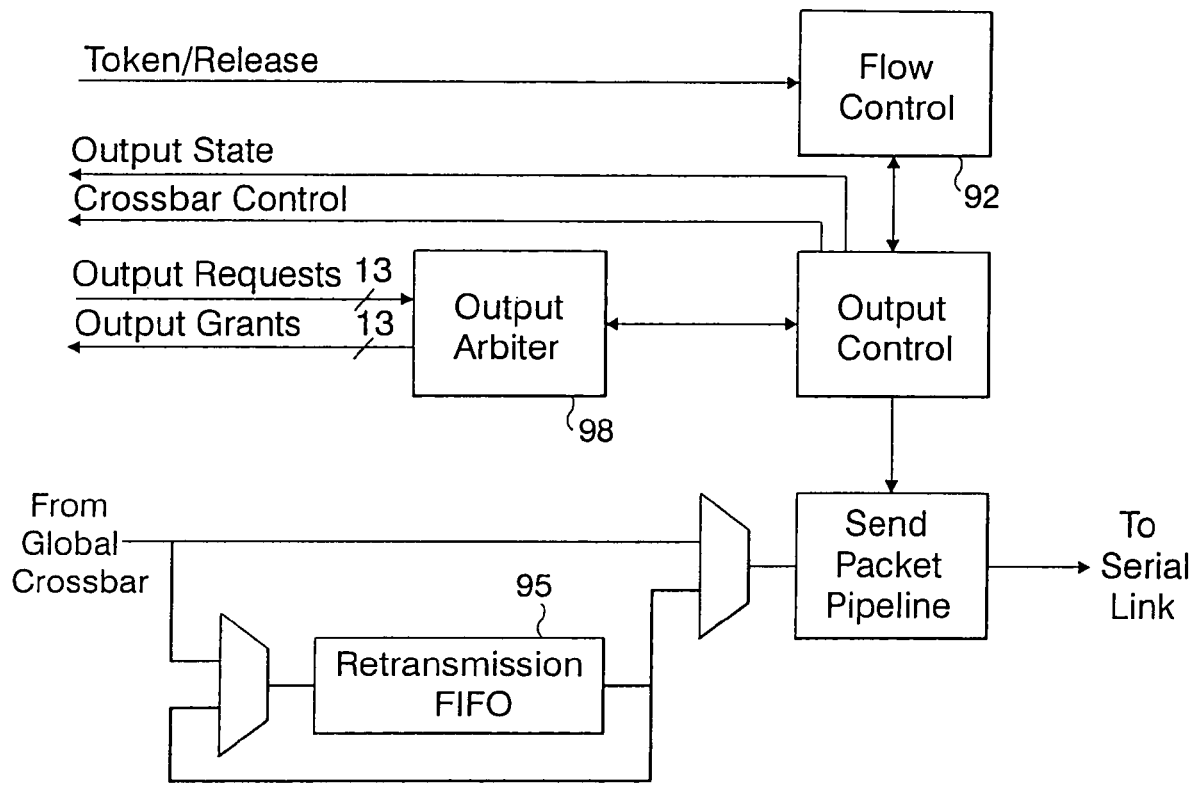
Figure 8C:
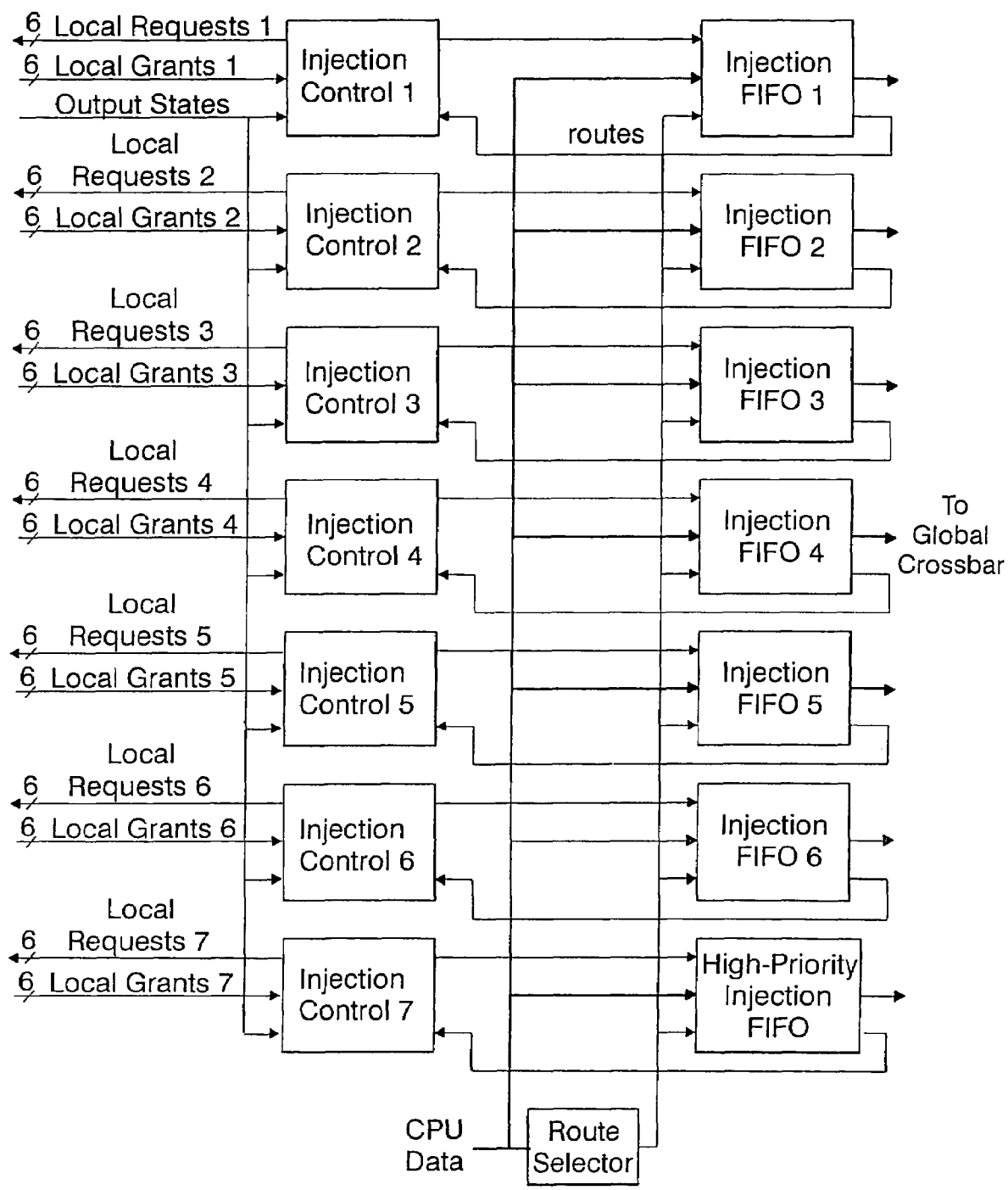
Figure 8D:
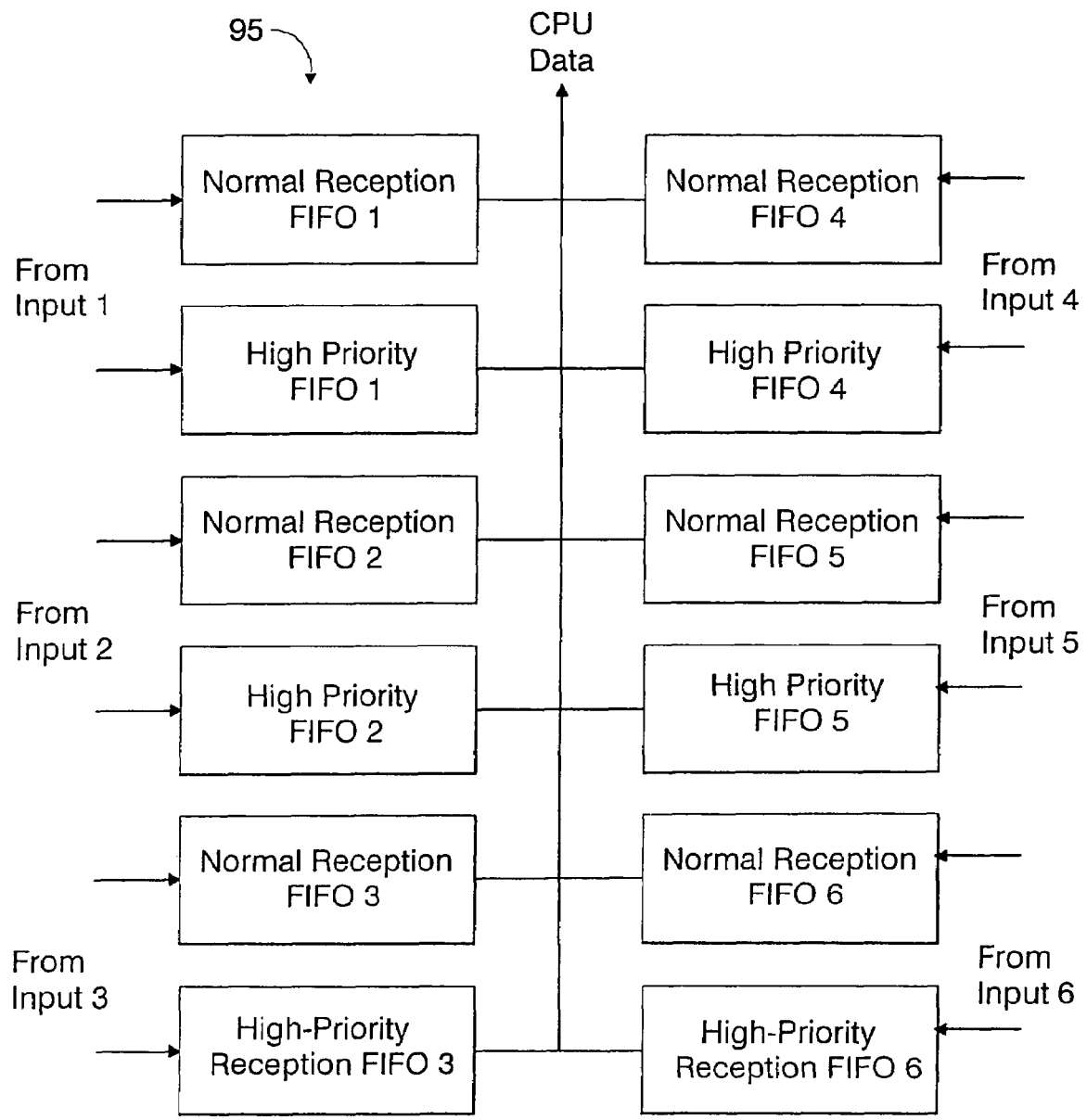

FIG. 8(a) is a detailed diagram of an exemplary embodiment of the link input circuitry 72 of FIG. 7. The basic responsibility of each input circuit 72 is to accept incoming packets, verify their integrity, buffer them if necessary, and ultimately forward them to output links or a CPU receive queue. As shown in FIG. 8(a), there are four virtual channel (VC) FIFOs 82, corresponding to two adaptive VCs 82a,b, one deterministic VC 82c and one high-priority, deterministic VC 82d. The actual number of VC FIFOs implemented is determined largely by the routing algorithm.

As mentioned, flow control is managed through the use of tokens, each of which is associated with 32 bytes of VC FIFO buffer space. Therefore, a single packet may consume multiple tokens. Tokens for each of the VC FIFOs are individually managed and granted by downstream routers to upstream routers in batches. An upstream router will never send a packet unless it has a sufficient number of tokens to cover the entire packet size. In other words, a packet is never sent unless there is sufficient buffer space at the downstream router to store it, if necessary. This is an important property for guaranteeing deadlock freedom.

Because a packet cannot be sent unless there is sufficient space to buffer it downstream, the size of the VC FIFOs is dictated by the link bandwidth and latency between adjacent routers. Their size allow for full utilization of the link bandwidth in the absence of contention. In the worst case, two adjacent routers can be separated by five cable hops when the machine is partitioned, and each cable hop has a latency of about 30 ns. As will be described, adjacent cable hops must traverse a link chip, which is expected to have a latency of about 10 ns. Therefore, the worst case link latency between adjacent routers is around 200 ns.

The following scenario can be used to calculate the VC FIFO size: an upstream router sends a 256-byte packet. The downstream router receives the packet in its entirety and verifies its integrity. Because the packet has been forwarded and not stored, the downstream router would like to return 8 tokens immediately. However, the upstream link is blocked by a 256-byte packet that has just started transmission. Once the upstream link is free, the tokens are returned. The VC FIFO must be large enough to store all the data that can be sent during the latency of this scenario. Assuming a 2.8 Gbit/sec link bandwidth, the calculation proceeds as follows:

| Event | Time | Explanation |
| --- | --- | --- |
| Begin sending 256 byte packet | 0 | |
| Header of packet arrives downstream | 200 | |
| Tail of packet arrives downstream | 928 | (2048 bits/2.8 Gbit/sec = 728 ns) |
| Packet is processed | 938 | |
| 256 byte "blocking" packet is complete | 1666 | |
| Token arrives at upstream router | 1866 | |
| Token is processed | 1876 | |

(1876 ns) × (2.8 bits/ns)/(8 bits/byte) = 657 bytes

Therefore, a VC FIFO size of approximately 657 bytes is sufficient. However, a larger FIFO allows for some slack so that tokens can be returned in batches, and allows for some amount of network congestion to be tolerated. Given the ASIC technology used in the present invention, it is easily feasible to implement a VC FIFO size of 2 K bytes or larger. The Input circuit has two connections (paths) 83 to the global crossbar in order to reduce head-of-line blocking. Therefore, the input circuit 72 includes a 5×2 crossbar 87 that allows two of the VC FIFOs, or one VC FIFO and an arriving packet, to proceed toward an output link. The local Input circuit 72 comprises two dedicated receive FIFOs for each of the six input directions: one for each of the 2 processors, plus two receive FIFOs (one for each processor) for high priority packets. When one processor is dedicated to communication, it can access both sets of FIFOs. Therefore, packets which terminate at a router can be forwarded directly to their associated receive FIFO without going through the Global Crossbar. However, normal priority packets may be received on any VC, so they are forwarded to the receive FIFO through the Input Crossbar.

When a packet arrives, the Route Selection function 86 is used to determine the set of potential output VCs that the packet can use. In general, this set will include both adaptive and deterministic VCs in profitable (i.e. minimal) directions. If the arriving packet is stored in a VC FIFO, then the potential routes will be stored along with it. Further details regarding routing of packets in the massively-parallel supercomputer may be found in herein-incorporated, commonly-owned, co-pending U.S. patent application Ser. No. 10/469,001.

Whenever a global crossbar connection is free (or will shortly become free), the Input Arbiter 88 selects one of the waiting packets or an arriving packet to arbitrate for an output. The selected packet will arbitrate for one of its potential outputs at a time for some number of attempts. If it does not attain an output in a finite number of attempts, then the Input Arbiter selects either the same or a different packet according it its priority rules to try for one of its outputs. Therefore, on every arbitration cycle, each Input circuit will request only one output VC until successful. High-priority packets are naturally given preference by the Input Arbiter 88. Normal priority packets are serviced according to a priority rule that gives preference to packets in the most full FIFO, but also prevents starvation by periodically servicing packets in a random, or round-robin order.

The Receive Packet Pipeline 81 is limited in depth, so if an arriving packet is not selected for arbitration or does not obtain an output VC in a timely manner, then it is routed into the appropriate VC FIFO. When the packet reaches the head of that FIFO, it can again arbitrate for an output. If the FIFO is empty, the packet can begin arbitrating again almost immediately. Therefore, it is possible for a packet to basically "flow through" the FIFO, leaving it at the same time as it enters, which is an important optimization. A separate CRC on the header of a packet is used to ensure that a packet only wins arbitration if the header is correctly received.

In order to improve the success rate, the Input Arbiter receives status indicators from the output VCs indicating which links are busy, which VCs cannot accept additional packets and the level of buffer space available in the VCs. An output VC is only arbitrated for when both the physical link is available and the VC can accept a packet. An adaptive packet has a preferred direction and VC which is the VC with the most available buffer space in a direction in which the link is free. The arbitration hardware is pipelined so that there are no gaps between the tail of one packet and the head of the next packet leaving the input link.

In addition to message traffic, the input circuit 72 receives flow control packets from the downstream router granting tokens or releasing copies of packets stored for reliability. These packets are detected by the FlowControl circuit 90 and result in a replenishment of the downstream token store in FlowControl circuit of the Output sharing the same physical link. Conversely, the Flow Control circuit detects correctly arriving packets and causes the Flow Control circuit of the Output sharing the same physical link to generate token granting packets.

Router Output

FIG. 8(*b*) is a detailed diagram illustrating an exemplary embodiment of the link output circuitry 74 of FIG. 7. The basic responsibility of this output circuit 74 is to schedule packets on the output link to obtain high throughput and fairness, retain a copy of all packets sent for reliability, and manage link-level flow control and retransmission.

In view of FIG. 8(*b*), the output arbiter circuit 98 receives up to 13 requests per arbitration cycle from each of the 6 Inputs and each of the 7 injection FIFOs (as will be described with respect to FIG. 8(*c*)). It will return only 1 grant and then wait for an acknowledgement. If the acknowledgement does not come by the next arbitration cycle, the arbiter will arbitrate again. If the acknowledgement does come, the Output Control will set the global crossbar so that the winning Input is connected to the Output.

The physical output link may be viewed both as a downstream connection for packets, and an upstream connection for flow control associated with traffic coming downstream on the corresponding input link. The Flow Control circuit 92 handles both of these responsibilities. It manages the token store for each VC on behalf of packets heading downstream, and generates flow control packets containing tokens or stored packet releases on behalf of upstream packets. Downstream tokens are consumed whenever a packet is sent, and replenished by the Flow Control circuit 92 of the Input sharing the same physical link. Conversely, the Flow Control circuit is also responsible for generating flow control packets when requested by the Flow Control circuit of the corresponding Input. The Retransmission FIFO 95 is the key component of the network reliability scheme. In operation, every packet that crosses the physical link is stored until an acknowledgement is returned from the downstream router. It is the responsibility of the downstream router to respond in a very timely manner with a positive acknowledgement. If the packet crosses the link successfully, a positive acknowledgement is returned, causing the packet to be deleted from the Retransmission FIFO. If a transmission error is detected, the tail of the packet is tagged with an error flag, and a positive acknowledgement is not returned to the upstream router, resulting in a timeout and retransmission. In the case of retransmission, the corrupted packet will always be at the head of the Retransmission FIFO 95 because acknowledgements are returned in order. Furthermore, packets are returned to the tail of the FIFO as they are re-transmitted in case of another failure. It should be understood that this scheme only covers transmission errors between routers. It does not prevent or detect corruption that occurs within the routers.

The size of the Retransmission FIFO can be calculated in a manner very similar to that of the VC FIFOs, which suggests a size of order 657 bytes. However, the size is larger in order to give the downstream router additional time to respond with acknowledgements. The benefit of using the Retransmission FIFO 95 on the output rather than using additional VC FIFO space is that a single FIFO suffices for all VCs. If the VC FIFOs were used to retain copies of forwarded packets, then each one would have to be extended by the same amount as the Retransmission FIFO size. Therefore, the memory savings is linear in the number of VCs. Furthermore, re-transmission is simplified because it is handled entirely at the output.

Local Injection in Detail

FIG. 8(*c*) is a detailed diagram illustrating an exemplary embodiment of the local network injection circuit 73 of FIG. 7. The basic responsibility of local injection circuit 73 is to allow a processor (usually the message processor) to inject packets into the network for transmission. As shown in FIG. 8(*c*), in the example embodiment, there are seven (7) injection FIFOs 94, six (6) for normal-priority packets and one (1) for high-priority packets. All of the FIFOs can be routed to any output VC, and they can all arbitrate simultaneously. This arrangement maximizes performance for nearest-neighbor communication. That is, the CPU may essentially dedicate each of the six normal-priority FIFOs to a single direction. The high-priority FIFO is envisioned to be useful for both scout packets preceding large message transfers, and software resolution of network congestion. High-priority packets bypass normal-priority packets on the high-priority VC, and are received in high-priority reception FIFOs, as will be discussed with respect to FIG. 8(*d*).

Local Reception in Detail

FIG. 8(*d*) is a detailed diagram illustrating an exemplary embodiment of the local network reception circuit 76 of FIG. 7. The basic responsibility of this circuit is to buffer packets terminating in the router. As shown in FIG. 8(*d*), there are twelve reception FIFOs 95, one high-priority and one low-priority for each of the six directions. Having FIFOs dedicated to each direction allows terminal packets to avoid the global crossbar. The separate high-priority FIFOs enables system software to recover from conditions of high congestion, and reduce the latency of large-message scout packets.

Torus Routing Algorithm

The torus routing algorithm attempts to maximize network throughput by routing individual packets adaptively whenever possible. The routing algorithm is provably deadlock free, and uses only minimal paths. Packet latency is minimized through the use of virtual cut-through (VCT) routing, which behaves like wormhole routing under modest load. Packets are variable in size, allowing software to favor latency or bandwidth. The basic idea behind the torus routing algorithm is to embed two virtual networks onto the physical network: an adaptive network and a deterministic network. The adaptive network is not deadlock free, but the deterministic network is. Because a packet can always choose the deterministic network, it serves as an escape route for deadlocks in the adaptive network. Further details regarding this approach may be found in the reference to José Duato entitled "A New Theory of Deadlock-Free Adaptive Routing in Wormhole Networks," IEEE Transactions on Parallel and Distributed Systems, Vol. 4, No. 12, pp. 1320-1331, December 1993 and the reference to Steven L. Scott and Gregory M. Thorson entitled "The Cray T3E Network: Adaptive Routing in a High Performance 3D Torus," In Proceedings of HOT Interconnects IV, August 1996, the contents and disclosures of each of which are incorporated by reference as if fully set forth herein. Such an algorithm is relatively easy to implement because the network uses VCT routing. Furthermore, a packet is never sent unless there is sufficient buffer space at the downstream router to hold the entire packet. Therefore, the time that a packet occupies a link is always finite and, as a result, deadlocks only occur as buffer space dependencies. The deterministic network routing algorithm is guaranteed not to have any cyclic buffer dependencies, and the adaptive network routing algorithm includes the possibility of switching to the deterministic network at each router.

In one embodiment, the adaptive network utilizes two equivalent VCs. That is, packets using the adaptive network will be free to use either VC at each hop. The advantage of the two adaptive VCs is simply to reduce head-of-line blocking between buffered packets. Consequently, two paths are needed into the Global Crossbar.

Only one VC is needed for the deterministic network if bubble flow control is used in the manner such as described in the reference to C. Carrión, R. Beivide, J. A. Gregorio, and F. Vallejo entitled "A Flow Control Mechanisn to Avoid Message Deadlock in k-ary n-cube Networks," Proceedings of the Fourth International Conference on High Performance Computing, pp. 322-329, December 1997, the contents and disclosure of which is incorporated by reference as if fully set forth herein. This algorithm insures that there is at least one free packet buffer in every network cycle so that deadlocks based on cyclic buffer dependencies are impossible. There are other well-known deterministic, deadlock-free routing algorithms that use more than one VC. For instance, the classic, dimension-ordered algorithm described in the reference to W. J. Dally and C. Seitz entitled "Deadlock-Free Message Routing in Multiprocessor Interconnection Networks," IEEE Transactions on Computers, pp. 547-553, May 1987, the contents and disclosure of which is incorporated by reference herein, requires only two VCs to implement. Therefore, the deterministic network preferably utilizes no more than two VCs.

Preferably, both the adaptive and deterministic networks use minimal-path routing. That is, packets are only free to move in profitable directions, where a profitable direction is one that moves the packet closer to its destination. Furthermore, the routing algorithms cannot tolerate any node failures, node failures are handled by repartitioning the machine, as will be explained in greater detail herein.

When a packet is injected into the network, software specifies whether the packet can or cannot use the adaptive network. It is expected that most traffic will use the adaptive network. A packet at the head of an injection queue is treated similarly to an incoming packet by the router.

Every incoming packet not terminating at the router triggers the Route Selection function 86 (see FIG. 8(a)), which generates a set of potential output VCs. That set remains with the packet until an output is granted. In a lightly loaded network, it is expected that the packet will be able to arbitrate and win an output quickly, avoiding buffering in a VC FIFO. Regardless, the packet can arbitrate when it reaches the head of the VC FIFO.

In order to guarantee freedom from deadlock, every packet is required to include in its set of potential output VCs the VC that conforms to the deterministic algorithm. At each hop, there is only one such VC. In addition, packets that are permitted to use the adaptive network will include both adaptive VCs in every profitable direction. Therefore, a deadlock in the adaptive network will always be resolved when one (or more) of the deadlocked packets chooses the deterministic VC. Eventually, this will always occur because the deterministic network is guaranteed to drain (and become available) in a finite amount of time.

A packet enabled for adaptive routing will always choose the first available VC, whether it is adaptive or deterministic. Therefore, the packet can jump between the two embedded networks. Because of VCT routing, this is still provably deadlock free. In short, a move from the adaptive network to the deterministic network is seen as an injection from the point of view of the deterministic network. Conversely, a move from the deterministic to the adaptive network is seen as a reception from the point of view of the deterministic network. Therefore, the combined network remains deadlock free.

Class Operations in Torus

Some algorithms such as linear solvers and FFTs require the broadcast of information within a group of nodes that map physically onto a one or two dimensional surface of the three dimensional torus. To efficiently support these multicast requirements, a second type of routing within the torus network is utilized which is referred to herein as "class routing". Class routing is preferably implemented through the use of a small number (e.g., four to sixteen) of local registers at the receiving end of every torus link. For messages which are demarcated as a "class" packet, the routing of the packet is determined not by the destination but rather by this local register which carries a bit for each of the possible outputs as well as a bit indicating whether the packet should be stored locally in addition to possibly continuing. This routing enables efficient multicast onto a wide range of geometric shapes. Further details regarding Class Network Routing Operations in Torus may be found in herein-incorporated, commonly-owned, co-pending U.S. patent application Ser. No. 10/468,999 entitled "Class Networking Routing".

Packet Format

It is the responsibility of the communication sub-system to deliver entire messages reliably: including packetizing, re-assembly, and verification. Furthermore, the communication sub-system includes features to enhance the performance of a Message Passing Interface (MPI). The packet is the atomic unit of routing, but is often a piece of a larger message. Because of adaptive routing, packets may arrive out of order. Therefore, each packet must include enough information to specify which message it belongs to, and where it belongs within that message. As far as the network hardware is concerned, its only responsibility is to transport each packet reliably from the Injection FIFO of a source router to the Reception FIFO of a destination router.

Figure 9:
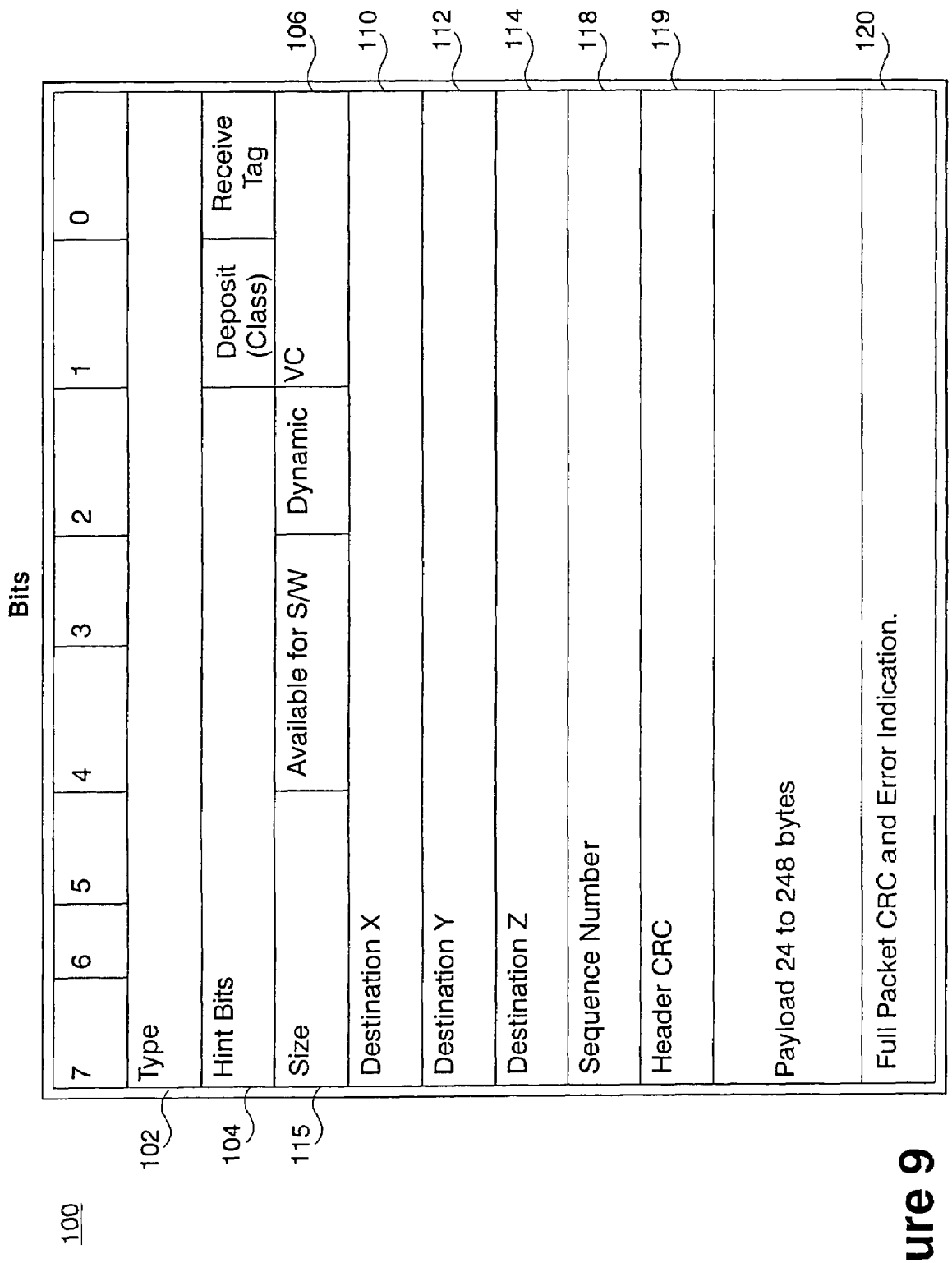
FIG. 9 depicts the format of a transport packet 100 according to a preferred embodiment of the invention.

FIG. 9 depicts the format of a transport packet 100 according to a preferred embodiment of the invention. As shown in FIG. 9, a first byte 102 includes a TYPE field and some number of FLAG bits. The TYPE field distinguishes a few basic packet types such as flow control, application message, and error recovery, that need to be handled in different ways by the routers. Similarly, the FLAG bits further distinguish the packet and can activate hardware directly without the need for decoding. The hardware design determines what features are encoded in the TYPE field and which are designated by flags. The TYPE bits essentially include the bits used for selecting which set of receive FIFOs is to hold the packet.

The second byte 104 of the transport packet contains the routing HINT bits 104 and the VC number 106. Because of the serial interconnect, it is advantageous to begin output arbitration as soon as possible using the HINT bits, of which there is one for each of the 6 possible output directions. A set HINT bit indicates that the packet still needs to progress in the corresponding direction to reach its destination. The hint bits are updated after the destination coordinates arrive and are compared with the local router coordinates. The VC field specifies which of the 4 virtual channels the packet enters the router on, and is updated at each hop based on the output virtual channel used. The third, fourth, and fifth bytes 110, 112 and 114 respectively, represent the absolute coordinates of the destination node, where the nodes are numbered as a 3-D mesh. Every node is configured with its own coordinates, so it uses these fields together with a selected output direction to update the HINT bits for the downstream router. They are also used to confirm the packet destination once it arrives.

Transport packets are variable in size from 32 to 256 bytes, in increments of 32 bytes, for example. The SIZE field 115 indicates the number of 32-byte "chunks" in the packet. The SEQUENCE NO. field 118 is used to maintain a link-level sequence number so that dropped packets may be detected. This field may not be required if another mechanism such as the end-to-end protocol provides the necessary detection. A Header CRC byte 119 is also provided for detecting packet header errors. The end of the packet 120 includes error detection and indication bits to support the link-level and end-to-end error detection and recovery schemes described in greater detail herein. Briefly, end-to-end error detection may be provided by a CRC code generated by a Local Injection circuit (see FIG. 8(c)) and checked by a Local Reception circuit (see FIG. 8(d)). Link-level error detection is provided by parity bits generated by each router's Output circuit (see FIG. 8(b)) and checked by each router's Input circuit (see FIG. 8(a)). If a corrupt packet is detected, the link-level parity code is over-written with an error indicator so that the packet is discarded when it arrives somewhere. It is understood that the detection of an error also results in a link-level re-transmission as described herein with respect to the router output circuit.

There are a number of issues that have not yet been addressed in the network architecture as described, but are being considered. It should be understood that in a preferred embodiment, there is implemented a timeout mechanism to handle missing packets, together with an associated mechanism to detect and avoid bad links or routers.

Message Passing

Global Combining Tree

Message passing on the global combining tree is performed through the use of a packet structure similar to that of the torus network. There is additional support for a small number of class broadcast operations on the tree network. The tree network is a token based network which may be also utilized for system interrupts. Messages are non-blocking across VCs. Interrupts are carried in the same data stream and may be interleaved into the data at any time, including during a packet transmission, through the use of a special "interrupt" out-of-band bit. Further details regarding generation of interrupts and barriers in a global asynchronous network may be found in herein-incorporated, commonly-owned, co-pending U.S. patent application Ser. No. 10/468/997. Messages are injected into the tree network at any node in the system and they climb up the tree until arriving at either the tree vertex or, at a final destination depending on the type of transfer.

The hardware associated with the tree is included in the compute and I/O node ASICs. The interface to the compute and I/O processors is a memory mapped FIFO. Each VC has an independent FIFO that guarantees non-blocking across VCs. The arithmetic and broadcast functions of the tree are also integrated into the compute ASIC. At this local vertex, broadcast and arithmetic operations are executed in hardware leading to very low latencies. As the tree structure is naturally "neck-down" at the physical 512 node midplane boundary, the bandwidth of the tree is not as costly in terms of cables as the nearest neighbor links. Therefore, a high bandwidth tree interface may be provided that can support 2B/processor clock in each direction simultaneously. The input stage also contains a FIFO interface that is segmented at the VC level.

Packets will be simple routed up the tree or dropped depending on if the destination in the packet matches the node ID. As shown with respect to FIGS. 1 and 5, Gb Ethernet traffic utilizes this network to send file and host data to the I/O node.

System Packaging

Figure 10:
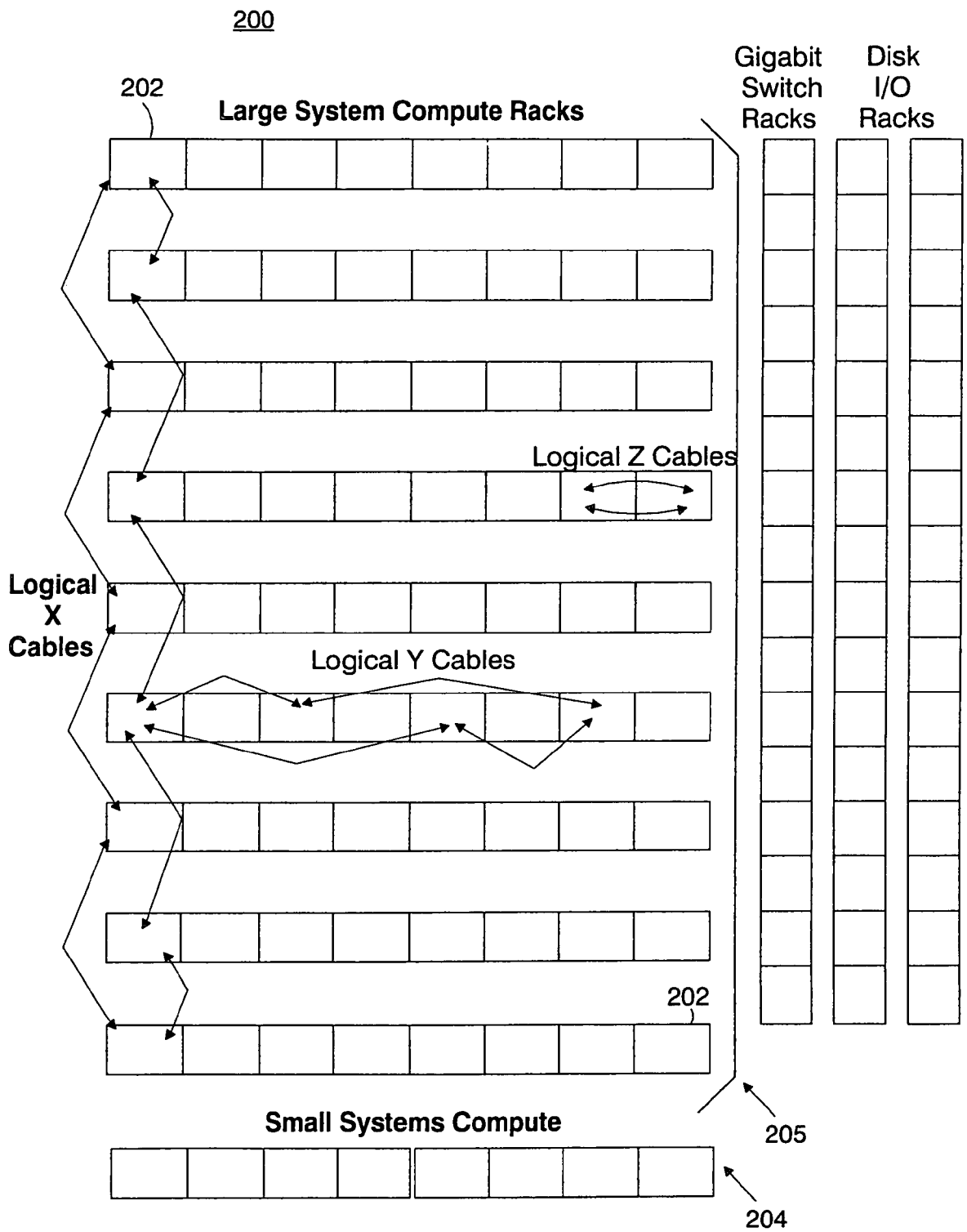
FIG. 10 is a conceptual top view depicting the ultra-scale scalable supercomputing machine of the present invention.

FIG. 10 is a conceptual top view depicting the ultra-scale scalable supercomputing machine of the present invention. In the exemplary embodiment depicted in FIG. 10, the supercomputing machine 200 of the present invention comprises 81,920 processors and eighty (80) racks 202 in total, with 72 racks of the 80 cabled as a single 73,728 processor system (which includes 8 racks of spares along with a 65,536 system) and eight (8) racks 204 cabled as two separate 4,096 processor systems. The 73,728 processor system includes 72 compute racks of electronics, arranged as nine (9) rows 205, for example of 8 racks 202 each. It is assumed that a certain wiring organization, optimized for the (x-y-z) 64×32×32 machine with a spare row. Compute racks are connected together using cables based on Spectra-strip twisted pairs, for example, as those used in enterprise servers. Each pair of racks 202 completes a torus in the Z dimension. Thus, each pair of racks contains 2048 compute ASICs organized as (x-y-z) 8×8×32. A row or aisle includes four (4) such pairs, is organized (x-y-z) 8×32×32, and completes the "y" direction. Columns complete the "x" direction. The full 73,728 processor machine is cabled physically (x-y-z) as 72×32×32 but is used logically as 64×32×32. One of the 9 aisles may be reserved as a spare and is not part of the 64 k compute node system.

Preferably, each compute rack is comprises of two (2) "midplanes", with each midplane including 512 compute processors. Midplanes are arranged vertically, one above the other, and are accessed from the front and rear of the rack. Each passive midplane includes twelve (12) link cards which accept the cables, 64 compute cards with 8 processor ASICs each, 2 or 4 I/O cards which accept the Gigabit Ethernet and/or Infiniband connections, a clock card which distributes the system clock, and a fast Ethernet switch card to consolidate the 100 Mb/s Ethernet links from each of the compute cards. Power connectors on the right and left edges of the midplane distribute 48V DC from the power supplies.

Preferably, as will be described, the supercomputing machine is air cooled. Within each compute rack hot airflow is horizontal, left to right. Room air enters the rack from the left side and exits a vertical exit plenum at the top right of the rack. Banks of cooling fans, arranged in modules, can be individually accessed and serviced while the machine is running. Further details regarding the cooling module for the supercomputer system may be found in herein-incorporated, commonly-owned, co-pending U.S. patent application Ser. No. 10/437,776 entitled "Smart Fan Module".

Each compute and I/O card contains a unique address. The 18 bit address is defined by the cards location on the backplane (9 bits), as well as a address of the backplane (9 bits). Additional bits are encoded on the cards themselves so that each processor has a unique address. This address is used, for example, to form the Ethernet address of the card, or for purposes of reporting failures through the host diagnostic codes.

Clock Distribution

In the preferred embodiment, there is provided a common, full speed clock to the 72 racks 202 in the system 200. Alternatively, a clock may be provided at two times (2×) the processor speed, to facilitate serial data communication at four times (4×) the processor speed. The invention particularly obviates the requirement for clock regeneration with a PLL on each processor to as to avoid long term phase jitter. Another motivation for a common clock is to remove the possibility of long software context switching times by keeping the local clocks of each processor at a common frequency. Initial clock synchronization through the global broadcast function is also provided.

Figure 11:
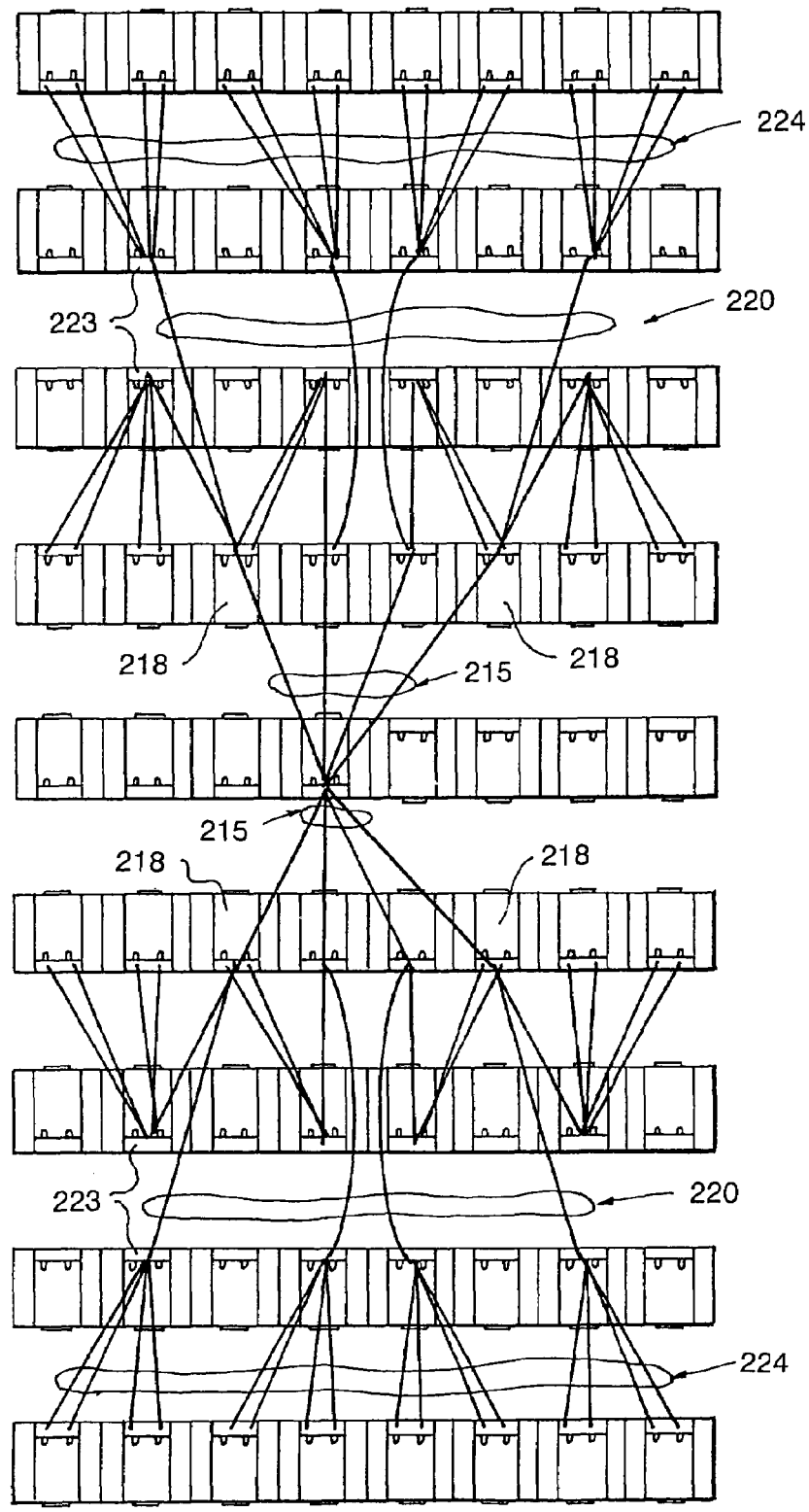
FIG. 11 illustrates the global clock distribution system according to the invention.

One exemplary means for distributing this clock is shown in FIG. 11, overlayed on a dimensionally accurate top view of the large supercomputing machine array 210. A high frequency source near the center of the array depicted as cables 215 is preferably split into nine (9) outputs using a clock splitter and distributed down differential cables of approximately 4.5 meter in length to secondary fanout boxes 218 which source cables 220. These secondary boxes 218, identical to the first except for the cable input replaces the clock source, in turn, distribute the clock to tertiary clock splitters 223 that in turn send one clock depicted as cables 224 to each midplane. On the midplane, a clock distribution card produces clocks for all cards on the midplane. Compute and link cards in turn, using the same clock splitter, to produce clocks for all ASICs on the card. The depth of the clock tree is 6 stages.

In the preferred embodiment, all clocks to the ASICs have approximately the same delay and pass through the same number of cables, connectors, buffers, etc. Using Low Voltage Positive Emitter Coupled Logic (LVPECL) clock chips based on bipolar technology, the delay through the clock buffer is nearly independent of voltage, which nearly eliminates clock jitter due to temperature variation of the different clock chips. The principle source of jitter is expected to be temperature differences, which are expected to be slow and tracked by a novel data capture scheme as described herein. The two other independent 4096 node systems have their own independent clock distribution.

Torus Cabling

As mentioned, each compute ASIC of the system is part of a 3-dimension torus connecting all compute nodes of a single system image with 6 high speed serial links. Each link is bi-directional, uses two differential signal pairs (e.g., four (4) wires total per-link) and runs with a bit rate of 4 times the frequency of the processor in each direction. With an example processor frequency of 700 MHz, the maximum data rate is 2.8 Gb/s/direction, and allows communication to adjacent neighbors in each of the 3 cardinal directions X, Y, and Z, for a total torus bandwidth of 16.8 Gb/s (2.1 Gbytes/s) per ASIC. As shown in Table 2, the compute card torus connections are arranged in a logical (x-y-z) 2×2×2 configuration. Connections in each logical dimension enter the card from the midplane through a connector, pass through two compute ASICs in series and leave the card by the same connector. Similarly, 512 compute ASICs of a midplane are connected in a logical 8×8×8 torus arrangement. Connections in each logical dimension enter the midplane from a link ASIC on a link card, pass through four compute cards and eight compute ASICs in series and return to the same link ASIC. These link chips repower the serial links for signals leaving the midplane.

TABLE 2

| Block | Number of Nodes | X-Y-Z |
| --- | --- | --- |
| Node Card | 8 | 2-2-2 |
| Midplane | 512 | 8-8-8 |
| Dual Racks | 2048 | 8-8-32 |
| Aisle | 16,384 | 64-8-32 |
| System | 65,536 | 64-32-32 |

Global Combining Tree Cabling

Figure 12A:
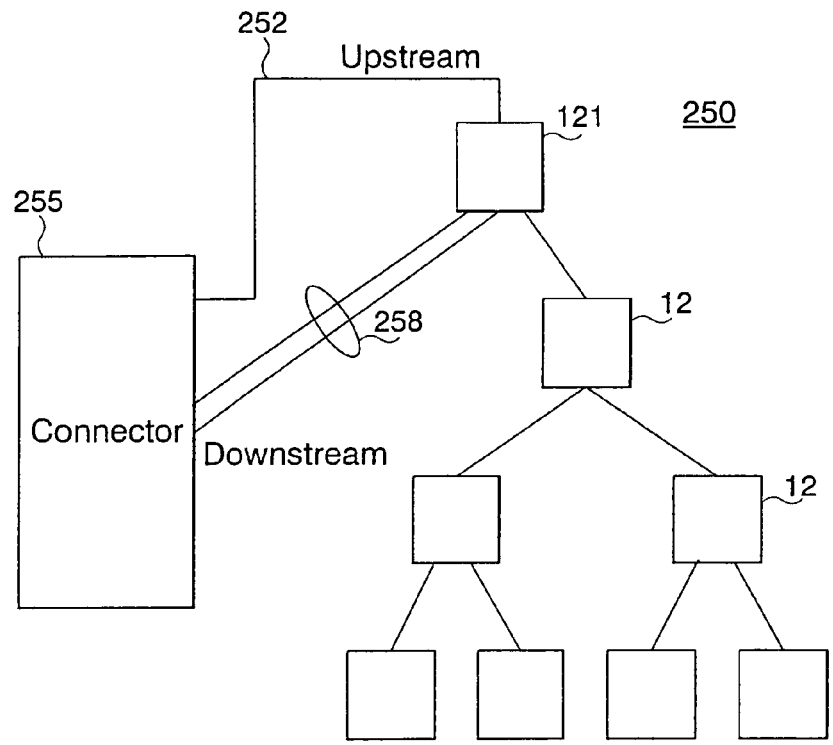
FIG. 12($a$) and 12($b$) is a schematic illustrating a compute card's processor nodes and tree connections.

As mentioned, each compute ASIC is part of a global combining tree, connecting all compute nodes 12 of a single system image. Each ASIC 20 has four re-configurable tree link connections. Each link in the tree is bi-directional, uses 8 differential signal pairs (16 wires total per link) and runs with a bit rate of 16 times the frequency of the processor in each direction, or a byte rate of twice the processor frequency in each direction. With a processor frequency of 700 MHz, the maximum data rate up or down the tree is 11.2. Gb/s/direction, or 1.4 GB/s/direction. This is 4 times the data rate of the torus link in any direction. The compute card tree link connections 250 are arranged as shown in FIG. 12(a). Each card has one upstream link 252 passing off the card through the connector 255 toward the top of the tree. Each card also has two downstream links 258 passing off the card toward the logical bottom of the tree. The head node 121 of the local tree on each compute card uses all four of its tree link connections, so as to provide two low latency downstream links to the connector and the other cards logically below it on the tree.

Figure 12B:
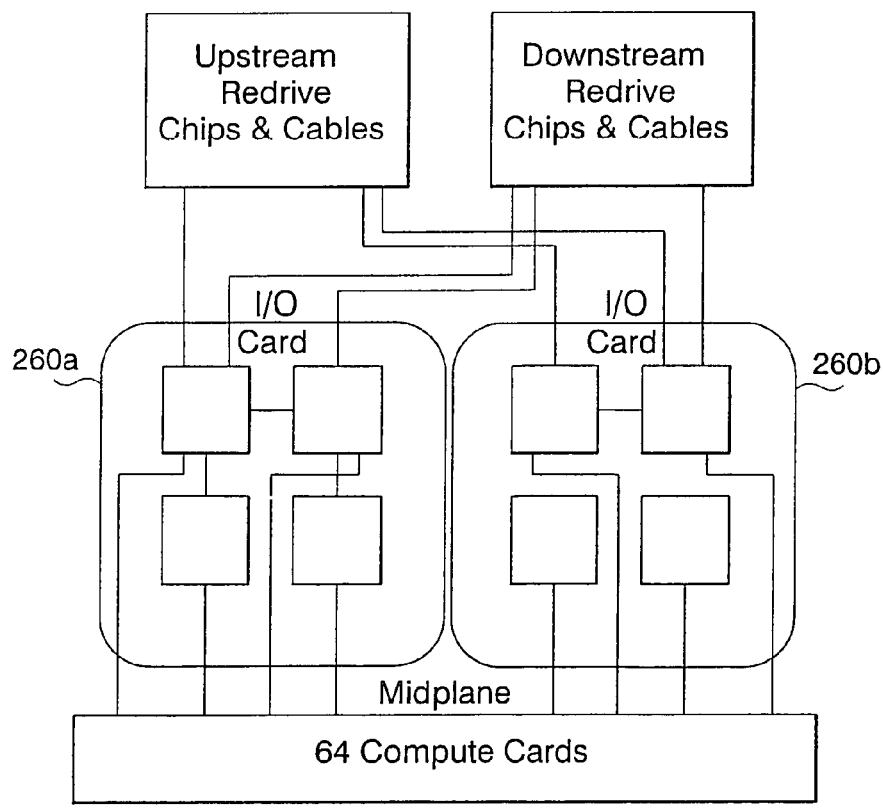

FIG. 12(b) illustrates the I/O card tree link connections. As shown in FIG. 12(b), the tree on the midplane is logically arranged so that each I/O card 260a, 260b is at the head of a local tree, with half of the midplane's processors logically beneath it. The two I/O 260a, 260b cards are wired so that four of the I/O ASICs are at the head of the midplane's tree. Which one of these four I/O ASICs is logically at the head of the tree is software configurable. These top four I/O ASICs then send upstream and downstream signals off of the midplane in a manner similar to how the top compute ASIC on a compute card sent upstream and downstream signals off of a compute card.

Rack Design

The packaging system 310 for the supercomputing machine of the invention places as many processors per rack 312 as can be air cooled. The target power required for a compute card, which includes the ASIC, a plurality of DRAM modules, and the inefficiency of the local DC-DC converters, is 10 W, for example. As the complete rack contains air movers, AC-DC power supplies, link chips, Ethernet switches, I/O cards, clocks, etc. in addition to the compute cards, this adds additional heat load. Thus, an optimal design choice in the example embodiment described places 1024 compute nodes per rack 312, with an expected total heat load of approximately 15 KW per rack. As will be described, those 1024 compute cards are configured in a manner so as to minimize the number of cables and connectors, while avoiding placement of many components per circuit card that failure of a single components results in a very expensive replacement.

Cooling

Figure 13:
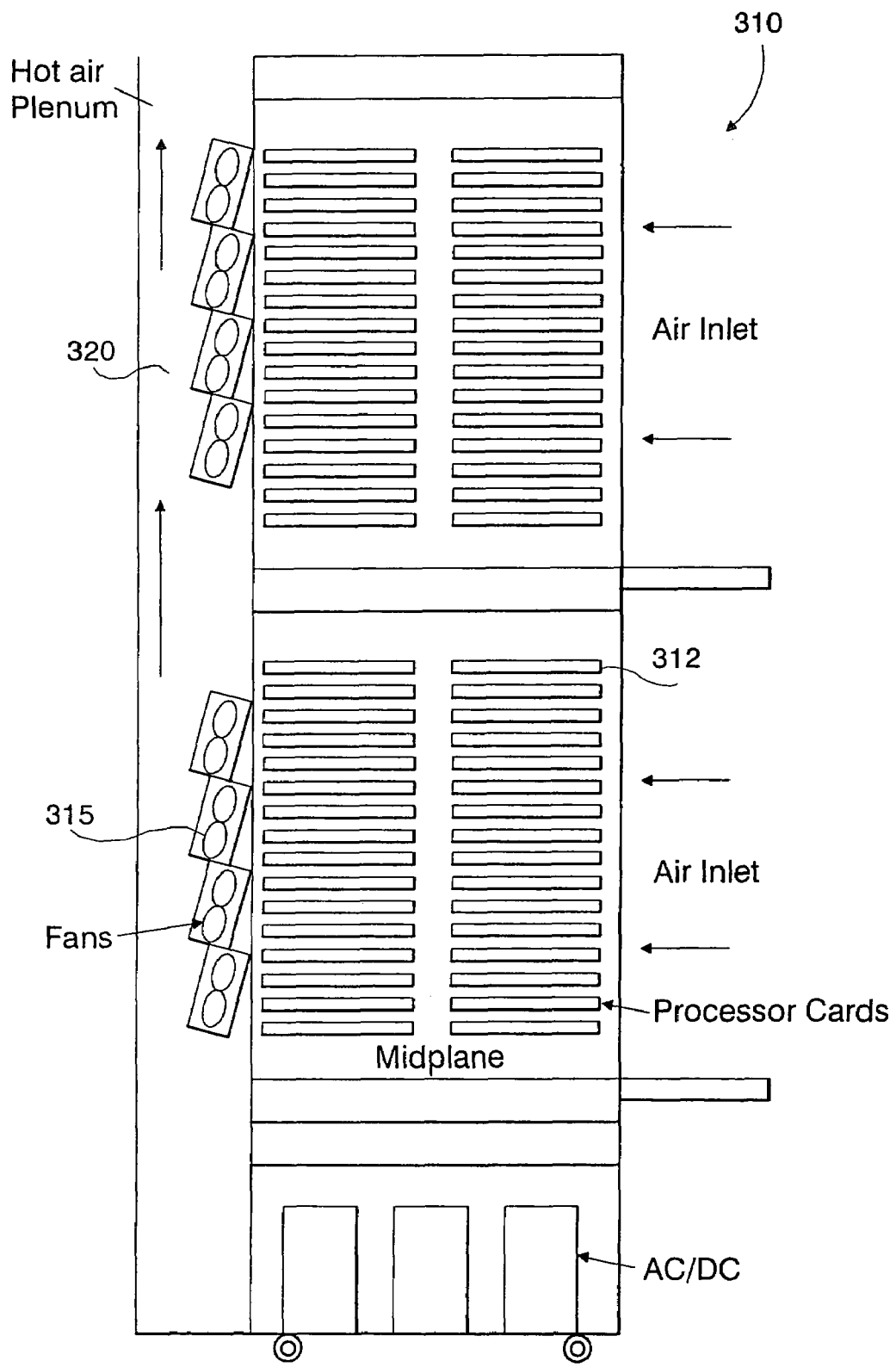
FIG. 13 depicts the basic air flow within a rack according to the invention.

The racks 312 of the system 310 are cooled by forced air convection. FIG. 13 depicts the basic air flow within a rack 312. Air is drawn into one side of the rack by an array of fans 315 mounted on the opposite side of the rack. The cool air flows past the processor cards (compute and I/O cards) which plug into the midplanes. The multiple and parallel air streams are collected by a plenum 320 on the rack, providing even and efficient cooling for the cards. The fans in the array are packaged into groups. Each group of fans is mounted inside a hot-swappable module with redundancy built-in. The fan modules can be replaced without affecting the operation of the rack. The fan speed and air temperature may be monitored and controlled during operation. Further details regarding the cooling module for the supercomputer system may be found in herein-incorporated, commonly-owned, co-pending, U.S. patent application Ser. No. 10/437,766.

Power Distribution

The system rack is powered by a distributed power supply system. Preferably, a 48.0 Volt distribution is used as this power distribution scheme due to the high efficiency for DC-DC conversion, at least for the smaller power modules.

Preferably, the intermediate of this distributed power supply system is derived from three AC/DC converters and distributed to the midplanes in the rack. The converters are connected in a 2+1 topology to provide a needed redundancy to the distributed power bus. The converters are hot-swappable and can be replaced at any time without shutting down the rack. Their status is monitored by a micro-controller accessible by the remote host.

Part of the distributed power is constant, and another switched. A non-switched power bus provides a continuous power to the fan modules, clock, and link chips. As will be further described herein, with regard to system partitioning, power to the link chips is maintained, even if the rack is being serviced, to insure that signals to neighboring racks can be passed through the message network. The link chips require clocks and, fans. The switched power bus controls the power to the processor cards. The DC/DC conversion of the power supplies is placed on the processor cards as the voltage control is precise, with high bandwidth for feedback, and localized high current. Two power supply voltages are preferably utilized, a 2.5V for the DRAM system and about 1.2V-1.5V for the ASIC. Reliability concerns are addressed by using redundant power supplies in parallel.

Midplane

Figure 14:
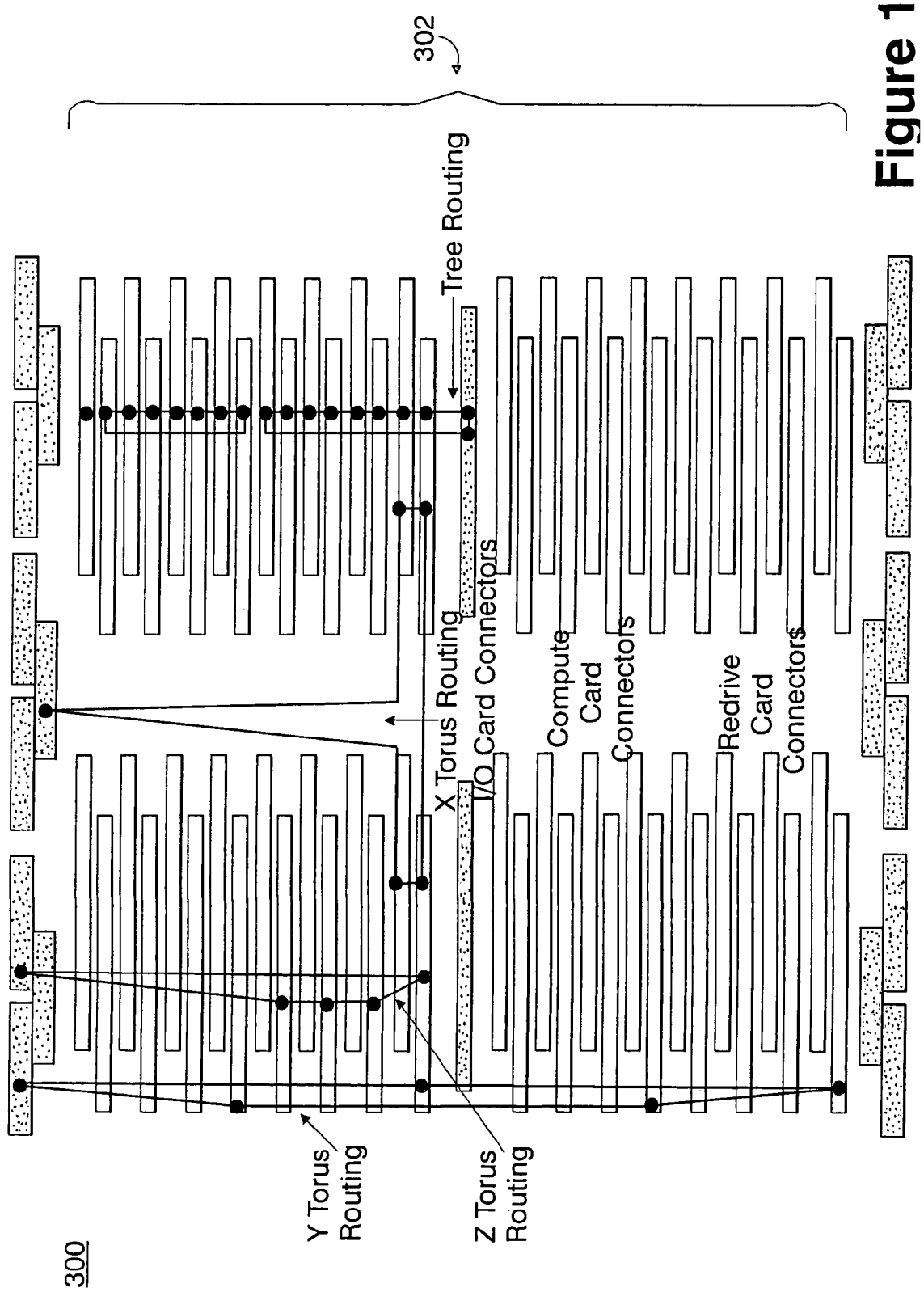
FIG. 14 depicts one possible physical routing of the torus, and tree according to the invention.

One possible physical routing of the torus and global combined tree networks is shown in FIG. 14. Conceptually, the midplane 300 includes card connections for 64 compute cards 302, 12 link (cable) cards, two I/O cards, clock, Ethernet and power supply units (for link cards). It provides high speed differential wiring for the clocks and torus, tree, and Ethernet networks.

System Partitioning

The supercomputer of the invention may be logically repartitioned by software control, thus permitting a large group of racks, physically cabled together as one system, to be logically divided into multiple systems. Each of these logically separated systems can then simultaneously run different code, or some separated systems can be serviced while others compute. Logical repartitioning therefore facilitates code development and system maintenance. The operation of the system link chip, which controls repartitioning, is now described with respect to FIG. 15.

Link Chip

Figure 15:
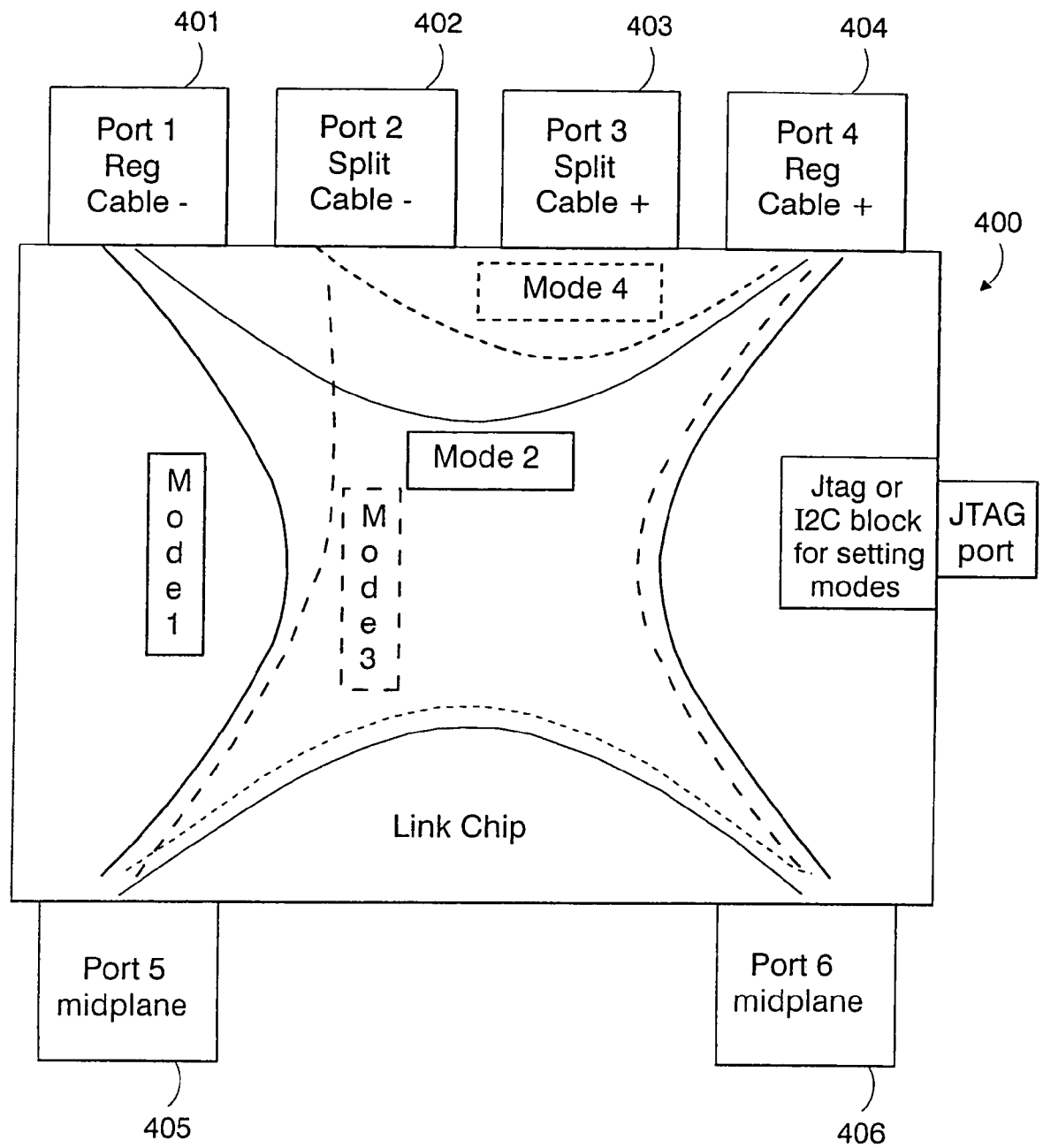
FIG. 15 depicts the system link chip and operations for controlling system repartitioning according to the invention.

As shown in FIG. 15, the torus, global combining tree and global interrupt signals networks pass through a link device 400. This link device, referred to as a link chip, serves two functions. First, it redrives signals over the cables between midplanes, improving the high speed signal shape and amplitude in the middle of a long, lossy trace-cable-trace connection between compute ASICs on different midplanes. Second, the link chip redirects signals between its different ports. This redirection function is what enables the supercomputing system to be partitioned into multiple, logically separate systems.

Regular Redirection

The link chip 400 performs two types of signal redirection, called regular and split redirection. Regular redirection removes one midplane from one logical direction of the large compute system. Regular redirection is shown in Modes indicated as modes 1 and 2 of FIG. 15. It involves ports 401, 404, 405 and 406 of the link chip 400. Ports 401 and 404 are attached to the plus direction and minus direction cables between the current midplane and the higher or lower order midplane in a particular torus logical direction, x, y or z. These cable connections are show by the arrows in FIG. 16. Ports 405 and 406 connect to a torus loop which circles within the midplane through eight compute processors in series. The routing of these midplane torus loops is described herein with respect to FIG. 10. When operating in Mode 1, the link chip 400 routes signals from the previous midplane, through the current midplane and on to the next midplane. It thereby makes the current midplane part of the larger compute system. When operating in Mode 2, the cable signals from the previous midplane through port 404 are passed directly to the next midplane through port 406, removing the current midplane from the larger compute system. Also in Mode 2, signals on the current midplane loop within the midplane through ports 405 and 406, creating a smaller compute system.

Split Redirection

Split redirection permits dividing the large 64×32×32 system into two equal 32×32×32 halves. As implemented in the link chip 400, split redirection permits a great variety of system divisions. However, due to cost and signal integrity concerns on long cables, it is preferred that split redirection is only physically cabled in the logical X direction and only on the number of rack aisles necessary to permit dividing the large system into two equal halves. Split redirection is shown in Modes 3 and 4 of FIG. 15. Eight Modes, 3 through 10, are necessary to accomplish split redirection, though only two, Modes 3 and 4, are shown in FIG. 15. In split redirection the link chip 400 redefines the cable ports which it considers to be the plus or minus cable directions to neighboring midplanes. It either redefines the plus direction port from the regular port 401 to split port 402 or 403, or it redefines the minus direction port from the regular port 404 to the split port 402 or 403. The regular cables are shown by the thin lines with arrows in FIG. 16, and the split cables are depicted as the Long Y Cables" as shown for example in row of racks labeled 425b in FIG. 16.

Partitioning

Figure 16:
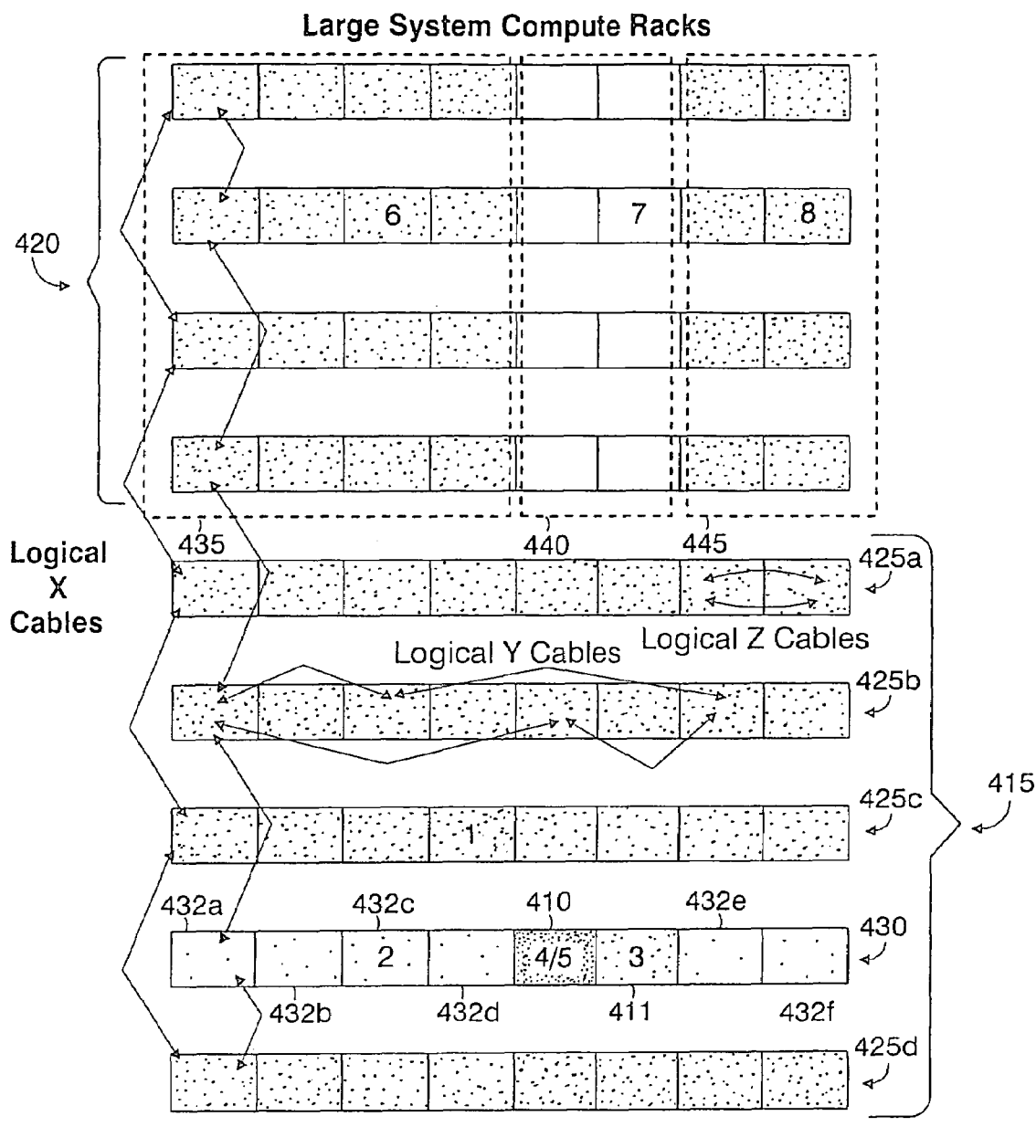
FIG. 16 depicts examples of both regular and split partitioning according to the invention, and illustrates shows how a midplane may be isolated.

Logical repartitioning enables a range of options for how the supercomputing system of the invention may be subdivided. FIG. 16 provides example illustrations of both regular and split partitioning, and shows how a midplane may be isolated from the system for service.

Split partitioning may result in dividing the large 72×32×32 cabled system into two systems of approximately equal halves, a 40×32×32 system, and a 32×32×32 system. This may be accomplished in one of two ways in order to ensure that two 32×32×32 systems may always be created when a midplane is malfunctioning, independent of where that midplane is physically located. Either the 40×32×32 system is the top five aisles and the 32×32×32 system is the bottom four aisles, or the reverse. For example, if a midplane in the rack indicated as rack 410 in FIG. 16 needs servicing, then a split partition may be used to divide the system between the top four aisles and the bottom five aisles. In this case, racks 415 comprising the (bottom five aisles of FIG. 16) form one 40×32×32 system and the racks 420 of the top four aisles form a separate 32×32×32 system. Both systems may be operated in these sizes, or they can be further subdivided using regular partitioning.

Regular partitioning is used to isolate one eight node slice from any logical direction. If a midplane in the rack 410 is malfunctioning, then regular partitioning may be used to isolate the second from bottom aisle in the logical x direction for the rest of the 40×32×32 lower system, creating the 32×32×32 system shown by racks provided in aisles 425a, 425b, 425c and 425d (indicated as system #1 in the accompanying legend) and an 8×32×32 system comprising racks shown in aisle 430. Regular partitioning of this 8×32×32 section in logical y direction isolates the racks 410 and 411 racks from the remaining racks in aisle 430, giving a 8×24×32 section (indicated as system #2 in the accompanying legend) and an 8×8×32 section (comprising racks 410 and 411). Twice regular partitioning of the 8×8×32 section in the logical z direction isolates the rack 410 and racks 432a, . . . ,432f, resulting in an 8×8×1 6 section (indicated as system #3 in the accompanying legend) and two 8×8×8 sections (indicated as system #4/5 in the accompanying legend), one of which may be serviced while all other subdivisions compute. Similar partitioning of the upper four aisles along the logical y direction results in the 32×16×32 subdivision 435 (indicated as system #6 in the accompanying legend), 32×8×32 subdivision 440 (indicated as system #7 in the accompanying legend) and 32×8×32 subdivision 445 (indicated as system #8).

Regular partitioning may additionally be used to subdivide the two small 8×16×32 (4096 or four rack), systems 204 shown at the bottom of FIG. 10. Since these two systems are physically cabled separately from the large 72×32×32 system, they cannot be combined with the large system to make an 80×32×32 system, nor can the be combined with each other. Split partitioning may additionally not be provided on the two small 8×16×32 systems.

The global combining tree and global control signals are routed through the same link chips and cables as the torus signals. Regular and split repartitioning therefore break the tree into logical subpartitions in exactly the same as the torus. Within a logical sub-partition the I/O processors on each midplane are then software reconfigured to connect the tree within the partition, as explained earlier with respect to FIG. 12(a). Further details regarding the partitioning of the supercomputer structure of the invention may be found in herein-incorporated, commonly-owned, co-pending U.S. patent application Ser. No. 10/469,002 entitled "Fault Tolerance in a Supercomputer Through Dynamic Repartitioning".

Signaling

As described herein, the supercomputer includes two separate high-speed communication networks, a 3D torus and a global combining tree. The preferred electrical design and implementation details of signaling on these networks is now described with respect to FIG. 17.

Uni-Directional and Simultaneous Bi-Directional Signaling

Figure 17:
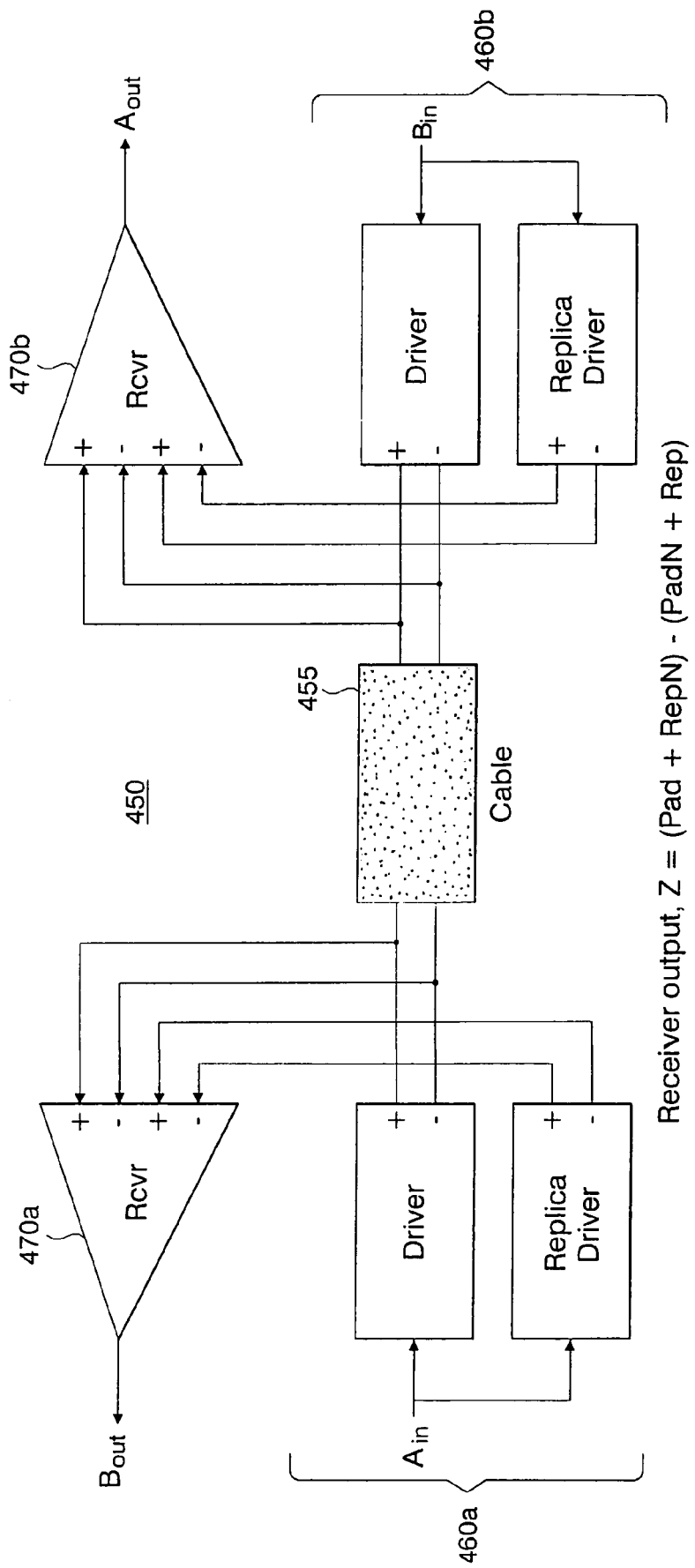
FIG. 17 is a block diagram of a pair of differential simultaneous bi-directional driver/receiver circuits 450 driving opposite ends of a cable interconnecting two nodes.

Preferably, the bandwidth of the torus network is such to enable transfer four (4) bits of data in each direction per processor clock cycle. One implementation for achieving this high-speed rate is the utilization of two single-bit unidirectional links-one in each direction. Thus, each link must operate at a data rate equal to 4× the processor clock frequency. Preferably, these connections are serial links, and transmit only data (without a separate clock). The data capture and clocking of these links is described in greater detail in herein-incorporated, commonly-owned, co-pending U.S. patent application Ser. No. 10/469,992 entitled "Data Capture Technique for High Speed Signaling". An alternative implementation uses simultaneous bi-directional (BiDi) signaling such as described in the references to Kevin Lamb, Larry R. Dennison, and William J. Dally entitled "Simultaneous Bidirectional Signaling for IC Systems," Proceedings ICCD Conference, pp. 430-433, October 1990 and, Matthew Haycock and Randy Mooney entitled "A 2.5 Bb/s Bidirectional Signaling Technology", Hot Interconnects V Proceedings, pp. 149-156, August 1997 the whole contents and disclosures of each of which are incorporated by reference as if fully set forth herein. That is, the links between each node carry signals in both directions at the same time. Thus, the data rate in each direction on a link may be reduced to 2× the processor clock frequency by using simultaneous BiDi. The slower data rate allowed by simultaneous BiDi reduces the required interconnection bandwidth, and allows a more relaxed timing budget in the data capture circuitry, at the expense of more complex driver/receiver circuitry. For these reasons, simultaneous BiDi may also be more extendable. However, additional noise due to "reverse channel" crosstalk must be contained within the noise and timing budgets. FIG. 17 is a block diagram of a pair of differential simultaneous bi-directional driver/receiver circuits 450 driving opposite ends of a cable 455 interconnecting two nodes.

As shown in FIG. 17, the simultaneous BiDi design 450 operates by applying a replica of the driven signal at each end 460a, 460b of the line to one input of a differential receiver 470a, 470b at the same respective end. This effectively sets the threshold for detection of the signal from the other end, thus canceling the contribution of the near-end driver to the received waveform. Further details regarding the implementation of bi-directional links in the supercomputer of the present invention may be found in herein-incorporated, commonly-owned, co-pending U.S. patent application Ser. No. 10/469,992.

The global tree network preferably uses identical circuit and interconnection technology as the 3D torus. Thus, the raw data rate per connection is the same. However, the global tree comprises four (4) individual data links in each direction. Therefore, the global tree is capable of transferring 16 bits per processor cycle. Due to the high data rate required on these interconnection networks, differential signaling is used for all connections. As known, differential signaling provides a variety of advantages including, improved noise margin, common mode rejection, and lower power supply (simultaneous switching) noise generation. The packaging architecture of the invention dictates that these high-speed differential interconnections are essentially of two types. The most common connections are from node-to-node through a printed circuit card or a combination of card and backplane wiring.

Clock Distribution

Serial data capture in the supercomputer of the present invention is designed to be very low power. Towards this end, data is launched with a local clock, and data captured with a local clock, the two local clocks being at the same frequency but, arbitrary phase. This avoids the requirement to send a copy of the launch clock with the data, which in the case of the serial links implemented, would increase the number of wires, and driving circuits, leaving the ASIC.

The most straightforward way to achieve this condition is to distribute a clock at the speed of the processor (full speed clock) to all processors within system. Alternatively, a low speed clock could be distributed and shifted to the desired processor frequency with in the ASIC, but the required PLL has been argued to be detrimental to data capture. An alternative is to distribute a clock at 2× the processor speed which requires extraction of the processor clock in the ASIC. This may be accomplished without a PLL and would permit accurate clock edges for driving data off the chip at 2× or ×4 the processor speed, as desired.

A clock distribution including clock fanout boards of the desired multiplicity, and cables of the required length, may be connected together to achieve the desired depth. For example, with a clock fanout of 10, five (5) levels of redrive will generate 100,000 clocks. For example, as discussed herein with respect to FIG. 11, segmentation of the electronics into cards, boards, etc. for the supercomputer requires six (6) levels of redrive. In this manner, a stable distributed clock with max skew under 100 ps, at a frequency of at least 700 MHz and hopefully 1.4 GHz, is realized.

Serial Data Capture

As the bandwidth for the serial links of 2.8 Gb/s (each direction) for the ASIC nodes and, at a minimum, a data-rate of 1.4 Gb/s in each direction, the bandwidth is bi-directional as described herein. The bi-directional requirement is handled in a number of ways, as discussed herein, in compliance with low power and low cost operating constraints. A particular challenge associated with this approach is the low power constraint. This coupled with the lack of relative phase information for the link transmission eliminates standard PLL clock and data recovery designs.

The task of accomplishing data transmission with the use of a source synchronous clock traveling with the data, without the use of a PLL is known in the arts. Preferably, in the invention, as this clock is not sent with the data due to effectively doubling the I/O and signal count, the phase extraction and data recovery is still be performed. There are a number of possible ways in which the phase information may be recovered.

Figure 18A:
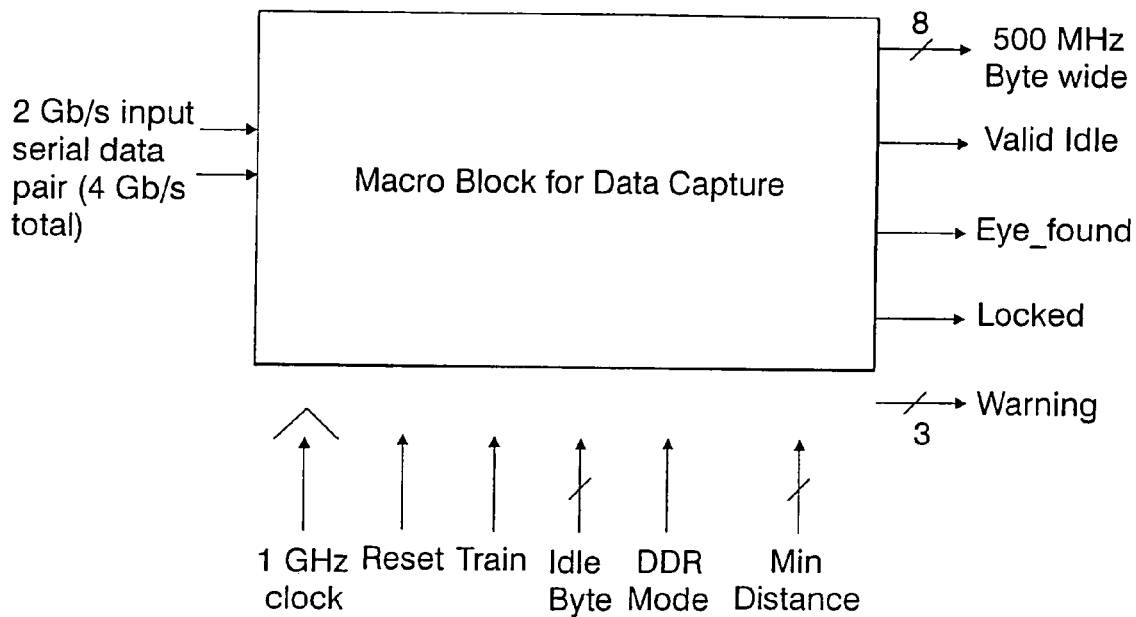
FIGS. 18($a$) and 18($b$) respectively illustrate receive macro block and send macro block for reliable, high-rate serial data capture, with low power.
Figure 18B:
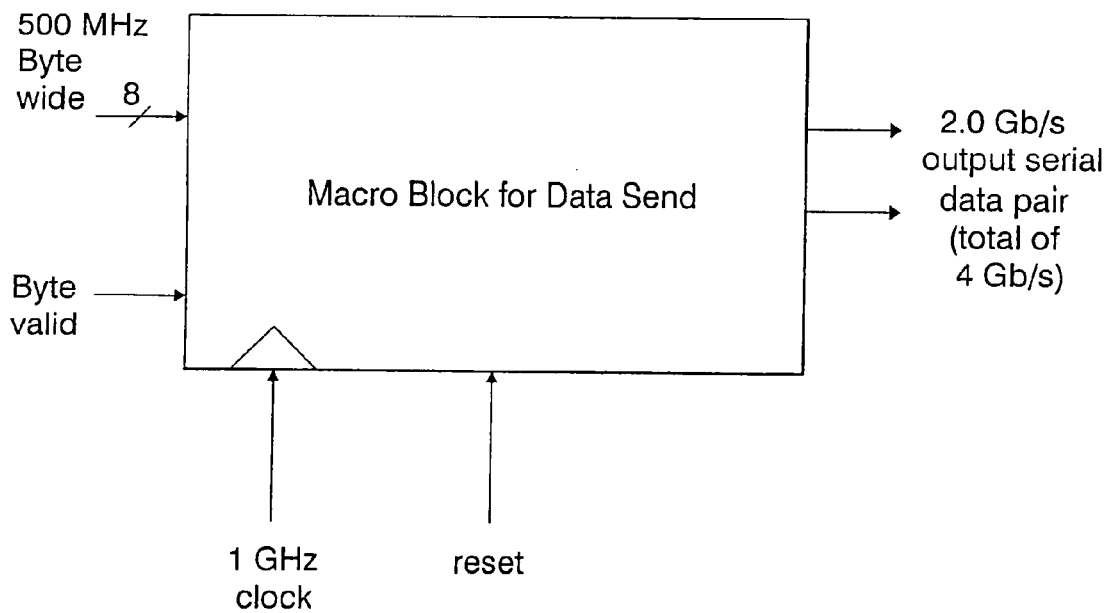

A digital data capture scheme that is preferably used for these purposes is now described with respect to FIGS. 18(a) and 18(b). FIGS. 18(a) and 18(b) respectively illustrate receive macro block 500 and send macro block 520 for serial data capture that achieve the objective of capturing data at a rate 2×-4× the clock speed, and bring it into the local clock domain, reliably, with low power, utilizing a small number of cells. As shown in FIGS. 18(a), (b), the internal clock frequency is ½ the frequency of the bit time, i.e., it is double data rate (DDR). The method may also be utilized in a SDR mode or extended to a quad data rate scheme if desired. This method works with the 700 MHz clock and simultaneous bi-directional communication at 1.4 Gb/s/pair/direction, for example, with respect to the bi-directional signaling alternative.

The latency in the receive macro block 500 is between 7 and 12 bit times depending on the byte phase of the data, however, the latency may be reduced to 3 to 4 bit times by skipping the byte output. This is reasonable approach for signal redriving when data content can be ignored.

With respect to the data capture block shown in FIG. 18(a), a method is implemented to capture data by sending the bit down a fast tapped delay line and sampling all the taps with the local clock. Each tap is compared with its neighbor to see if it is the same. The aggregate of these comparisons form a clocked string that is combined with previous clocked strings to generate a history that can be used to determine the optimal sampling points. The optimal sampling points may be found from the history string by looking for the regions where the data does not ever change between delay taps. The history is updated every local clock. There are additional "eye" pipelined registers that are infrequently updated for allowing a capture scheme to be developed which has a programmable persistence period as well as being immune to isolated bit errors. The persistence time may an be set arbitrarily long but must not be shorter that the maximum time necessary to reliably sample data edges. To accommodate bit times faster than the local clock period, both edges of the clock are used to capture DDR data. Each edge of the clock has its own associated capture registers and independent logic to find the optimal eye. This technique is therefore largely immune to asymmetries in the local and sending side clock duty cycles. Further details regarding the implementation of data capture techniques for high speed signaling in the supercomputer of the present invention may be found in herein-incorporated, commonly-owned, co-pending U.S. patent application Ser. No. 10/469,992. As the history register will change, the optimal sampling point also moves. This updating is performed on a time scale shorter than the persistence time. This function is performed in a histogram and sampling point determination unit as described in co-pending U.S. patent application Ser. No. 10/469,992.

System Software

As software is a critical component in any computer and is especially important in computers with new architectures, there is implemented a robust layered system of software that at the lowest level is very simple and efficient, yet sufficient to run most parallel applications. The system software in an exemplary embodiment, includes seven integrated subsystems, which together are termed the "Operating Environment". Each of these subsystems is comprised of distributed components, and their interfaces, that span the Host Complex, the Compute Nodes and the I/O Nodes. The subsystems include: 1) Machine Management, Configuration and Diagnosis; 2) Reliability, Availability, Serviceability (RAS); 3) Partition and Job Management; 4) Scientific/Technical Computing Kernel and Run-Time Environment; 5) File system and I/O; 6) Application Development and Debug Tools; and 7) Performance Trace and Visualization Tools.

Host Complex

The Host Complex provides the interface into the machine for application development and system administration and includes the Compute Node software including a system kernel operation and software interfaces provided to the application programmer, including message passing software; and, the I/O Node software, which interfaces the application to the Host Complex. The host complex may be as small or large as required to run the software as now described.

System Console and Partition Management

The System Console, in conjunction with the RAS Database, is responsible for the allocation of nodes to Partitions. The hardware partitioning strategy, as described herein, with respect to FIGS. 15 and 16, employs a Space Partitioning Model that creates independent and electrically isolated partitions. In the system of the invention, the number of partitions simultaneously available on the machine may range from 1 to 128. The minimum partition consists of an 8×8×8 Torus plus 8 I/O Nodes, and partitions can increase in any dimension in multiples of 8 nodes. The Host Complex software enables these partitions to be accessed via an Interactive interface, or via a batch management system for unattended operation. Batch management systems that may be used includes LoadLeveler™.

File System

One of the most important tasks of the Host Complex is to service the file input/output needs of parallel applications running on the system. In one embodiment, the hardware and software is designed to allow the file system to scale, both in terms of absolute capacity and aggregate bandwidth, independent of the computing resources provided by the machine, up to a peak sustainable bandwidth of over 1 terabit per second. A number of applications, have very modest file I/O needs, while others are insatiable. Another factor in sizing the File System is the desire of the Operating Environment to provide support for Checkpoint and Restart capability, both transparent and application assisted, without an excessive impact on overall application performance.

Figure 19:
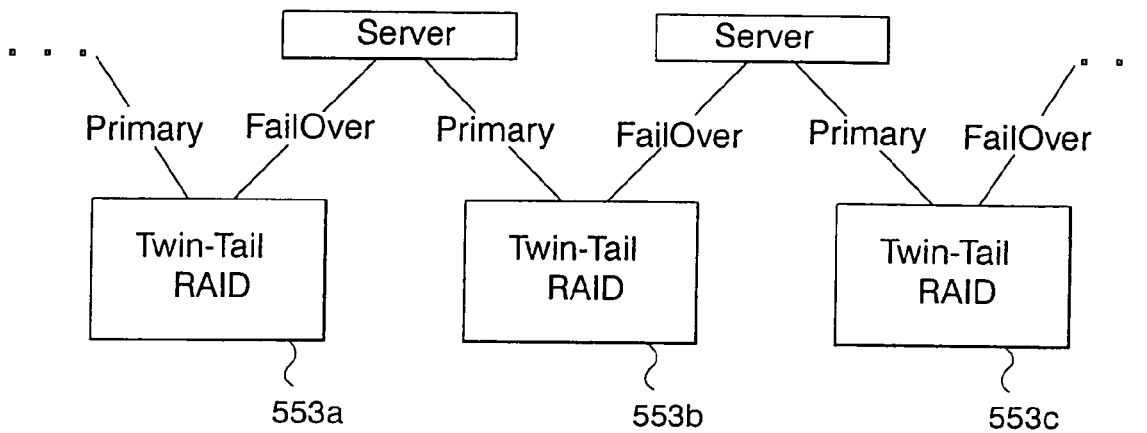
FIG. 19 illustrates the conceptual repeating structure 550 for Twin-Tail SCSI RAID with Fail-Over; and, FIG. 20 depicts the logic utilized for asynchronous global signal generation that is implemented in the global interrupt and barrier network 60 of FIG. 6.

FIG. 19 illustrates the conceptual repeating structure 550 for Twin-Tail SCSI RAID with Fail-Over. The file system of FIG. 19 is constructed from hot-swap SCSI disk cages 553*a*, *b*, etc., each including multiple disk drives in a standard rack-mount frame. These disk cages preferably include a multi-channel hardware RAID (Reliable Array of Inexpensive Disks) controller, redundant power supplies, and 2 external SCSI bus connections. The hardware RAID controller groups multiple disk drives into RAID "stripe sets", and supports several stripe-set configurations ranging from RAID-0 (simple striping without protection) through RAID-5 (block-rotational striping with parity protection). A higher level of RAID is also supported by this hardware organization, called "spanning" where multiple RAID stripsets are striped together across a larger array of disk drives. An example of this is RAID-50 where two or more RAID-5 stripe-sets are themselves striped across a larger cluster of disk drives. For purposes of the invention, RAID-5 provides the required reliability. In this configuration, the multi-disk RAID-5 stripe-sets are configured with at least 1 disk per cage available as an on-line spare. Should one of the active disk drives fail, the hardware RAID controller would transparently reconstruct the data from the failed drive onto the spare, and also notify system management software of the problem, while flashing an LED on the failed disk drive's hot-swap bay.

In addition to the disk cages, the file system 550 employs rack-mount commodity PCs. Each of these PCs contains a 2-channel SCSI controller. In a preferred configuration, one of the SCSI channels is designated the "Primary" interface to a RAID disk cage, e.g., 553*a*, and the other is placed in hot stand-by, or "Fail-Over" mode to a second RAID disk cage, e.g., 553*b*, ready to assume the file system interface should the primary PC for that RAID cage fail. In this structure, the RAID disk cages are "Twin-Tailed", meaning that their internal SCSI bus interfaces on each end to a different host depicted as servers 555, 556, etc. Further details regarding the twin-tailed failover system useful in the invention is described in herein-incorporated, commonly-owned, co-pending U.S. patent application Ser. No. 10/468,990 entitled "Twin-Tailed Fail-Over for Fileservers Maintaining Full Performance in the Presence of Failures".

There are two additional components to the Server PCs. The first is a "Remote Management" interface component such as the "Base Management Controller" (BMC) which provides the ability to remotely configure, boot, power on/off, and monitor the PC via an Ethernet or serial connection to each PC. The second component is a Gigabit Ethernet connection. This connection provides the interface, through a multiport Gigabit Ethernet Switch, to the I/O Nodes.

RAS Database

The ability to track and analyze every possible fault condition, whether transient (soft) or permanent (hard), in the supercomuter of the invention is very important To this end, the packaging plan provides system software with complete information on the health and status of every major component of the machine. In every case, this information carries with it the exact location within the machine, and where appropriate identifies the rack, midplane with in the rack, node-card on the midplane, and node on the node-card. For each Ethernet adapter in the entire system, its unique "MAC" hardware address is assigned by the rack, midplane and node-card position, thereby encoding the exact location of the device in its Ethernet address. Some of the sensors and monitors, such as those in the fans and power supplies, operate independently of the Compute and I/O Nodes, while others, such as ECC faults, provide information to the system software running on these nodes which collect the information and forward it to the Host Complex.

Any condition that falls outside the nominal range has the ability to generate an "RAS Event" (RAS for reliability, availability, and serviceability). System software running on a Host Complex gathers these RAS Events, whether from Ethernet-connected micro-controllers managing sensors and monitors, or from the node kernels on Compute Nodes and I/O Nodes, via the 100 Mb Ethernet RAS Network. This information is logged in a multi-indexed RAS Database that is maintained on the Host Complex. RAS Events that will be tracked in this database include: 1) Memory faults, including ECC corrected single-bit errors, and uncorrectable multi-bit errors, isolated by physical address; 2) Network faults, including packet retries due to CRC mis-compares, whether on the Torus or Global Tree high-speed links, or on the 100 Mbit or 1 Gbit Ethernets; 3) Voltage and power fluctuations outside nominal ranges, including rack power supplies and status of node-card DC-to-DC converters; and, 4) Temperature variations as detected within the racks or by each individual node, including fan status and RPM.

The RAS Database is utilized as follows: First, it is an on-line tool that provides system administrators, and partition management software, with a real-time picture of the health of the machine; Second, because RAS Events are isolated to individual components by their geographical location within the machine, it will be used to validate the packaging, power and cooling design and hence, improve the serviceability of the machine; and, third, by maintaining the complete "medical history" of the machine, it supports data mining analysis that over time will become predictive of the on-line availability of the machine, allowing one to schedule and plan system maintenance, possibly in advance of an actual component failure. An example of the predictive nature of seemingly innocuous events occurs in memory chips, where it has been shown that repeated soft errors, or an accelerating rate of soft errors, in a memory bank is strongly indicative of an impending hard failure. Similar analysis has been successfully applied to data cables and I/O drivers, and to hard disk drives.

Low-Level Debug Environment

In the supercomputer of the invention, each ASIC provides a self-contained low-level debug client, which supports the full IEEE 1149.1 JTAG interface. The low-level debug environment is closely coupled with the RAS and diagnostic environment. This environment provides visibility into the ASIC from a host system (Host Complex), for all architected state and devices within the chip. It also provides the ability to look into each processor and allows all states to be inspected or modified, and supports single-stepping or break-pointing. Transparently, it allows instruction to be inserted into the instruction stream that may inspect or modify state at a slightly higher level. This debug environment is supported via the 100 Mb RAS Network, which interfaces to a full IEEE 1149.1 JTAG port on-chip. Access to the JTAG debug ports occurs transparently to application operation. In some cases, it interfaces to the system kernel. Host Complex software may be based on RiscWatch™, the IMD standard embedded software development tool. Another option is the enhanced BlackWidow™ debug environment which presently used on high-end server offerings.

High-Level Parallel Debug Environment

In addition to the low-level debug environment described above, the Operating Environment additionally supports high-level debug of parallel applications. One popular tool that provides a multiprocessor application debug interface is TotalView™, developed by Etnus, LLC. which comprises two major components: the first component is the graphical user interface (GUI), which runs on a host computer as a "debug server". used to debug parallel applications running on hundreds of nodes. It provides independent views of application source code running on different nodes, and variable windows that can track the state of data in the parallel application. TotalView also supports visualization of the contents of distributed data structures in the parallel application. The second component is a "debug client" that supports a ptrace( ) interface.

It is understood that addition distributed debug environments may be implemented such as the Gnu debugger (gdb), which already supports a client-server model very similar to that of TotalView.

As most of the correctness bugs, race conditions, or addressing faults in a parallel application are removed long before the program is scaled beyond hundreds of nodes, source code level debuggers are best suited to find these types of errors. For scalability beyond hundreds of nodes, the bulk of the work in parallel programming is in performance tuning and load balancing which is best accomplished by application visualization and trace tools such as a UTE Gantt Chart which is a tool to visualize individual UTE interval files and merged UTE interval files.

Scientific and Technical Computing Kernel

The Scientific and Technical Computing Kernel proposed for the Compute and I/O Nodes, is now described.

Architecturally, within the Node ASIC, the Compute Processor and I/O Processor are identical, and have symmetric access to all on-chip devices from the hardware's point of view. The only distinction between the two processors is the strapping of one bit in the "Processor Identification Register" (PIR) of each core on the chip that provides a unique instance-number. By convention, and to help with low-level JTAG debugging, system software labels the core with PIR equal to zero as the Compute Processor, for example, and PIR equal to one as the I/O Processor, for example.

Simply stated, the job of the Compute Processor is to execute the application code without distraction. The I/O Processor's job is to off-load from the Compute Processor, all activities required of a parallel operating system, including most of the work of message transmission and reception. This functional separation, along with simple and efficient programming interfaces between the two processors, allows each processor to perform its mission without the overheads and asynchrony inherent in traditional operating systems, including interrupts, timer ticks, context swaps, protection domain crossings and most supervisor calls. Yet, this structure enables maintenance of a privileged and protected kernel context that remains responsive and survives application errors, crashes or deadlocks, as well as non-fatal RAS Events. Overall, this structure provides predictable and repeatable performance at a much finer granularity than more traditional approaches, and that leads to increased scalability of the parallel application.

The I/O Processor will spend most of its time in supervisor state, monitoring the high-speed communication link buffers and Ethernet controllers for incoming packets. It additionally monitors the application for service requests such as message transmission or file I/O, and will monitor the node itself for RAS Events. The I/O Processor can perform all these tasks while servicing the communication links at full bandwidth if the message reception matching overheads are kept simple and efficient as would be the case for one-sided communications, including that provided by MPI-2.

Overall, the organization is "Balanced" as it provides the best ratio of computation to communication for most applications. However, an alternate approach, termed "Highly Compute Bound" is available for those applications where computation and communication are not evenly distributed, but rather alternate in bursts. In this mode, an additional application thread would be created that utilizes the computational power of the I/O Processor during the time-windows when communication would be idle. This mode of operation is not without some cost, however, as sharing of data between the Compute Processor thread and the I/O Processor thread has to be explicitly managed by the application. In most cases, this would simply involve a system call that placed the L1 cache in write-through, or possibly cache-inhibited, mode. Further, any unexpected messages, are likely to generate interrupts, thereby stealing back some of the anticipated gains. Should a RAS Event occur in this mode, it would also generate an interrupt.

Virtual Memory, Cache and Prefetch Management

Despite the fact that each node will support a single application context, the Kernel takes full advantage of the virtual memory management, protection and translation facilities provided by the PC-440 processors in a number of important ways. First, the kernel protects itself against errant, or 'wild', loads and stores by an application, so that it cannot be corrupted. This will ensure that high-level debug and tracing facilities provided by the kernel remain intact, and that the Host Complex can always interact with the kernel, even if only via the RAS Network. Second, by supporting translation, the kernel is able to increase the "Availability" of the system by mapping around any bad pages of physical memory without the need to recompile or relink the application, or having to declare the node off-line. This virtual view of memory also simplifies one-sided communication and active message programming by ensuring that statically allocated data areas and function addresses are the same on different nodes that use the same executable image. Third, as will be described in greater detail herein, the kernel can control, based on application or run-time library directives, the behavior of the caches and prefetching hardware to optimize the performance of the application. Fourth, by organizing the address space into regions, dynamically allocated data and stack areas can grow and shrink without overly complicated garbage collection. This also provides an optimization for transparent checkpoint support since the kernel will know how much of which regions are subject to modification by the application.

Because the PPC-440 processor employs software management of translations in the Translation Look-aside Buffers (TLBs, or in this case 'Soft-TLBs'), the kernel need not incur the storage overhead of large translation tables. A further optimization stems from the fact that the PPC-440 contains a large number of TLB entries (64), each of which can cover a variable amount of the address space (ranging from 1 KB to 256 MB, for example). This means that, for all but the most complicated of applications, it is unlikely that these translations will ever need to be updated or replaced once established. The exception to this is when the run-time heap size, application stack size, or cache management policy requires such a change.

The Kernel additionally uses the virtual memory system to control the behavior of the memory hierarchy's caches and prefetching mechanisms. This is especially important for memory areas that are explicitly shared between the Compute Processor and the I/O Processor. It may also be used to optimize and fine-tune the behavior and performance of the memory hierarchy. In the PPC-440, each TLB entry contains the following configuration bits that are used for this purpose. These attributes are made available in the Transfer Attributes placed On the memory busses, and thus can be used to configure operation of the entire memory subsystem on a per-TLB entry basis.

U0: User-Defined Storage Attribute 0. Ignored by the 440 core.

U1: User-Defined Storage Attribute 1. The 440 core can be programmed via the MMUCR[U1TE] (U1 Transient Enable) bit to use this bit to select whether storage access should use the 'normal' or 'transient' part of the I/D Caches.

U2: User-Defined Storage Attribute 2. The 440 core uses MMUCR[U2SWOAE] (U2 Store With Out Allocate Enable) bit to control whether stores which miss the data cache allocate a line in the cache. If set, L3 should respect this policy too.

U3: User-Defined Storage Attribute 3. Ignored by the 440 core.

This provides 2 bits of information, U0 and U3, expressed on the memory bus to control the prefetching policy, or anything else of interest. Possible encoding of these bits include:

0b00: Disable prefetching at all levels for this page. See 'G' below.
0b01: Explicitly pre-programmed prefetching at L3. Disable learning mode.
0b10: Enable prefetch 'learning' mode.
0b11: Available, possibly enable an alternate prefetching policy.

Other bits in the TLB of interest, and expressed on the bus, include:
Write-Through (W): The kernel will set this bit only on explicitly shared data regions since it will impose a performance penalty.
Caching-Inhibited (I): When set, inhibit caching at L1 and L2. The L3 is coherent, albeit weakly ordered. Caching will also be inhibited for I/O space, and SRAM. Memory-Coherence-Required (M): If the snoop on L2 adds a cycle to the memory latency, the kernel will set this bit only on explicitly shared areas. The L1 will be set write-through when M is set.
Guarded (G): This bit serves as a prefetching and speculative disable, and forces in-order access. Typically set for I/O space, but also needed for certain shared SRAM areas.

Kernel RAS Management

The Kernel is responsible for reporting all RAS Events that it encounters to an RAS Database server in the Host Complex. In the case of benign events, the error may be accumulated for later reporting. Along with the type of event that occurred, the kernel also gathers as much relevant information as possible to help isolate or understand the error condition. For example, in the case of a memory error, this information would include the physical and virtual addresses at which the error occurred, and the type of segment that this address referenced. Further, should this memory error have been on a non-ECC protected device or address, that information would also be captured and reported, possibly resulting in halt or termination of the application run. Generally, no state will be discarded until after low-level debug and diagnostic tools were given the opportunity to inspect the node.

The default method of reporting RAS Event will be to send a message to the Host Complex via the 100 Mb Ethernet. Should the RAS Event indicate a problem with the Ethernet itself, the message could be forwarded to the I/O Node for reporting.

Application Checkpoint and Restart Support

The Kernel, in collaboration with the file system interface provided by the Host Complex, provides support for application-assisted checkpoint and restart. A transparent checkpointing mechanism, including hardware architecture that will assist, and improve the performance of, the kernel's ability to capture and restore the complete state of an application, is additionally provided.

A number of applications do not require any special support for checkpointing. Such applications can manage the saving and restoration of their distributed state through simple file I/O calls. Other applications may not be able to achieve a quiescent state easily, though global barriers provide a good opportunity for system-initiated transparent checkpointing. Such checkpoints could be initiated based on time, or notification from the Host Complex indicating that a checkpoint should be taken on the next global barrier.

Checkpoint and restart support interfaces with RAS Management software. If the Reliability and Availability plan requires that diagnostic or verification software be run at regular intervals, a natural point to perform this maintenance is at a checkpoint boundary. Further details regarding unique checkpointing method useful in the invention is described in herein-incorporated, commonly-owned, co-pending U.S.

patent application Ser. Nos. 10/258,515 and 10/469,996 entitled "Checkpointing FileSystem" and entitled "Fault Isolation Through No-Overhead Link Level Checksums".

Message Passing Support

The message passing software support provided by the Kernel is now described. At the lowest level, the kernel exports a System Programming Interface (SPI) designed to efficiently support the system's internal high-speed networks. For both the Torus Network and the Global Tree Network, the SPI will provide support for Point-to-Point and Collective, or Class based, communications. The SPI provides a porting base for high-level Application Programming Interfaces (APIs), such as MPI, and efficiently supports subsets of MPI-1, MPI-2 and MPI-IO.

One-Sided Messaging

As described herein by using a simple and efficient message passing protocol, the full bandwidth of all links is sustained even for short messages. With one-sided messaging, the message carries the destination, or source in the case of a "get", memory address of the data. This allows the hardware to assemble a block of data such as a matrix transpose from many small packets directly into memory without incurring excessive software overhead in handling these packets. An example of a one-sided communication protocol, which is supported, is included in MPI-2. This protocol uses a "put" and "get" model to move data to and from pre-established or 'opened' communication windows. This model works particularly well for the system because the use of communication windows provides the opportunity to manage memory coherency between the Compute and I/O Processor. Because memory coherence is managed over a window, this overhead can be amortized over a number of messages. In the supercomputing system of the invention, a "put" may be more efficient than "get" as "get" requires an added protocol message, which essentially transforms the "get" into a "put" driven from the remote node. Further details regarding coherence management utilizing put/get windows useful in the invention is described in herein-incorporated, commonly-owned, co-pending U.S. patent application Ser. No. 10/468,995.

A more powerful form of one-sided messaging that may be implemented is similar to a "put", but adds a function address to be invoked at the destination node. This form of messaging, where message arrival triggers an operation is called "Active." Active messages are particularly powerful when data must be transformed or computed in some way upon arrival. The MPI-1 provides a simple and restrictive form of Active messaging by allowing a user to define reduction functions that operate over collective communications. In the present system, this is generalized to provide the ability to choose which processor, Compute or I/O, will execute the function. These functions will execute in user-mode within the application context. This is another way that an application can take advantage of the computational power of the I/O Processor. Active messages may additionally be used internally by the system Operating Environment for kernel-to-kernel messaging. An example of this occurs when a Compute Node requests that an I/O Node service a File I/O request.

Collective Communications

When mapping collective communications onto the system networks, it must first be decided whether the particular communication is better suited to the Torus network, or to the Tree Network. Factors to consider include the topology of the communication group, the expected bandwidth requirements of the communication, whether or not the communication may take advantage of the "Global Functions" supported by the Tree, and whether the activity on one of the networks at the time may favor using the other to distribute traffic. Arbitrary groupings of nodes may be created on either network. The simplest case is when the communication is truly a broadcast over all nodes, which would clearly favor the Global Tree. However, if multicasting to a column of nodes, Class Routing on the Torus, as described herein, may be favored.

Run-Time Libraries

Preferably, the Compute Node software appears to application programmers as a familiar unix-like development environment. To achieve this, subsets of the standard set of run-time libraries for C, C++, and Fortan95, for example, are provided. To the extent possible, functions supported will maintain open standard POSIX compliant interfaces. However, it is clear that not all of the functionality provided by these libraries will be used by system applications, or even make sense in a parallel computing environment.

Additional interfaces are provided that deliver a low-level System Programming Interface (SPI) to the system that captures the functionality of the hardware architecture. The SPI thus serves as an efficient porting base for higher-level Application Programming Interfaces (APIs), including MPI (subsets of -1, -2, and -IO), and the run-times for C, C++ and Fortran95. The SPI is also used to provide application tracing and profiling support, needed to tune parallel applications. In many cases, this support will interface to environments on the Host Complex, such as the Unified Trace Environment (UTE) Visualization Tool.

As mentioned, every node in the system includes an Ethernet port (or alternatively, Infiniband™ port) integrated into the ASIC. That port may be exposed to application programs via TCP/IP. For the I/O Node, Ethernet ports may be made available directly to applications, or alternately to custom run-time environments. In general, the 100 Mb Ethernet port (FIG. 2) may be used as a RAS Network for machine management and error reporting. The external network architecture for this RAS Network, including switching and partitioning, may additionally be optimized for the expected flow and type of traffic required by the Host Complex. The I/O Node's Gigabit Ethernet is made available either by IP, or via MPI "Inter-Communicators" which hide the networking details behind standard MPI calls, while achieving the desired function of providing a flexible high-bandwidth link for external communication.

Standard parallel math libraries, such as "ScaLAPACK," which includes the BLAS and BLACS parallel math libraries, are gaining popularity, and these are supported on the supercomputing system of the invention. The communication performed by these libraries uses a very small subset of MPI. By supporting these MPI calls, the porting effort focuses on the math routines and tuning issues. Single-node math libraries, such as ESSL, or its parallel version PESSL, are also in wide use, and these libraries are available and may be ported in the system.

I/O Node Software

The kernel and run-time operating environment handles the disk and host I/O via Gigabit Ethernet to the Host Complex. Run-time libraries on the Compute Nodes accomplish file I/O operations by function-e.g., shipping I/O requests over the high-speed Global Tree network to the I/O Nodes, which will transfer the request and data to the Host Complex File System servers via the Gigabit Ethernet. As the Host Complex employs a "fail-over" strategy to ensure reliable file system I/O, the I/O Nodes have the opportunity to redirect a request from a failed host server to a standby server, transparently to the application. Moreover, by isolating the implementation details of the Host Complex File System at the I/O Node, this makes it simple to support different implementations and strategies for the file system servers, and allows flexibility in the scalability of the file system servers.

Because the I/O Node is located on the Global Tree (FIG. 5), Collective I/O operations, such as those defined in MPI-IO are particularly supported by the system. An example of Collective I/O occurs when all or many nodes in an application request to read the same part of a file. In this case, the file read would only happen once and the results would be broadcast to the requesting nodes via the Global Tree.

Preferably, the I/O Nodes do not perform device-level control over the disk drives in the Host Complex. Further, daemons may be employed in the Host Complex that interface at a functional level to I/O Node software, and at the file system level to host managed file systems. This further enhances the ability to support alternative implementations of the host file system, since the host operating system is performing the low-level file system via its native interfaces. Finally, it provides an incremental development path to implement the file system software.

Boot

A boot-up algorithm is now described as a four-step process, beginning at power-on and ending with a running kernel at each node. 1) The first step occurs automatically when power is applied to the node. In this step, each node performs a Power-On Self Test that verifies the logic and memory arrays, and then automatically configures and enables the 100 MB Ethernet to accept JTAG commands from the Host Complex. 2) A second step, initiated by the Host Complex and performed in parallel, implements the JTAG interface to check the results of the Power-On Self Test, and perform further diagnostics and configuration of each node. In this step, the status of all sensors and monitors in each rack is also verified. This step completes when a bootstrap program, and per-node personalization information, is loaded into each node via the 100 Mb Ethernet JTAG interface, and allowed to begin executing. The bootstrap program fully initializes the Compute and I/O Processors on the chip, checks embedded and DDR memory, and tests and configures the Torus and/or Global Tree networks, and the 100 Mb and/or 1 Gb Ethernets, and finally contacts the host with a status message. It is the case that much of the JTAG interactions, including the loading of the bootstrap program required during this step, is handled via Ethernet broadcast packets which significantly reduces the workload required of the Host Complex, and increase the parallelism of the booting process. 3) The third step begins with each node fully functional under software control of the bootstrap program, which uses its node personalization information to decide how to proceed next. Boot proceeds by contacting the indicated server in the Host Complex to load the full kernel via the Ethernet. Conceptually, this step is similar to the familiar "bootp" network boot operation, but is designed in accordance with the system machine and host architecture. 4) The fourth step begins when each Compute Node and I/O Node is running the full system node kernel. At this point, the I/O Nodes contact the Host Complex to load the I/O Node-specific software, described herein, that provides the File System interface and other I/O services. This software appears to the kernel as a specially constructed, privileged "application" program. The Compute Nodes, on the other hand, await contact from the Host Complex until the application program is to be loaded. It should be understood that repartitioning of the system need not require a complete reboot of all nodes in the partition, but requires that all nodes have fully quiesced usage of the internal high-speed links. Following repartitioning, the kernels still need to reset all routing and class usage configuration.

Power-On Reset State

Upon power up, each node comes up with its Ethernet port alive and configured to received unicast or broadcast packets. The Ethernet port is interfaced directly to the JTAG scan string that is commonly used to debug processors. This enables the utilization of a very mature debugging environment designed for uniprocessors on the system. Any node can be addressed and fully debugged from the host utilizing this very powerful technique. This interface may be mapped to operate while the node is still in reset allowing for an upload and debugging of all scan-registers in the ASIC.

The nodes will power-on and run all available LBIST and all available ABIST for the initial system checkout. Hardware sequencers automatically control this test at power-on, and make the pass/fail signature obtained from these diagnostics in registers available for Boot Code. An example is the MISR signature register in the 440 Core. The amount of logic that is covered by the above LBIST/ABIST determines how much additional diagnostics is needed for software check out of the system. Power-On Reset state leaves the hardware configured to accept JTAG commands across the 100 Mb Ethernet bus and will ensure that the other 10 controllers will not conflict with the 100 Mb Ethernet. In addition, after LBIST/ABIST is run, all clocks for the ASIC are left running.

The Ethernet MAC address for the 10/100 Ethernet controllers are set up via I/O terminations to the ASIC for unique addressability of each node. This enables detection of node failures and provides for parallel node boot.

Reliability, Availability, and Serviceability (RAS)

To optimize the supercomputer system for maximum uptime, redundancy of individual components that fail most frequently is provided. This is in addition to the ability to repartition the system to isolate known faulty sectors. The reliability of the system is dependent on the intrinsic failure rates of components for "hard" and "soft" or transient failures, the number of components and the way the system responds to these failures as they occur. Thus, failure protection methods for potential component failures (ASICs and components thereof, DDR, Connectors (such as card edge contacts and cable connectors), Power Supply (DC-DC and AC-DC) Air Moving Devices, etc.) are provided.

Failure Protection Methods

The node ASIC incorporates error detection and correction circuitry on the components with high failure rates due to soft and hard errors. These components include the external DDR memory, the internal EDRAM L3, the internal L2, and all SRAM arrays under designer control. The external DDR memory and internal EDRAM also include redundant bit steering. Hardware controlled scrubbing may be implemented to remove accumulated soft errors from the external DDR memory and internal EDRAM. The internal register arrays and critical dataflow busses will have parity for error detection.

Moreover, as mentioned, all power supplies utilized in the system are duplicated, i.e., N+1 redundancy is implement. The probability of having two (2) fails within the service period is exceeding small. Futhermore, all air moving devices in the present invention are N+1 redundant. For example, two fans are used to cool the covered node cards with a third fan for redundancy. When all three fans are operating, the fan speed is reduced to increase reliability. When one fails the other two speed up until the failed fan is replaced. There is a very small probability of two fans in the same fan unit failing within the service period.

All in all, there is extensive error detection and correction capabilities built into the node ASIC implemented in the invention. In the event of a failure, the system may be repartitioned to remove the fail, assuming it is restricted to no more than 1 row (9 racks) of the machine, as discussed herein. After system repartitioning, the system may be restarted from the last checkpoint.

Torus Network Reliability

The torus network reliably delivers a single copy of every packet injected into it, or it will indicate an unrecoverable error condition. Therefore, send-side software does not need to retain copies of injected messages, and receive-side software does not need to maintain sequence numbers. Network reliability is thus provided by a combination of end-to-end, and link-level, error detection. In most cases, the link-level error detection features will discover, and often recover from an error. The end-to-end error detection is used primarily to discover errors caused by the routers themselves and missed by the link-level protocol.

Link-Level Errors

The link-level error detection scheme is based on the use of multiple parity bits appended to every packet. As multiple-bit errors may occur in sequential bursts, the data bits are assigned to check bits in round-robin order. Therefore, each check bit covers every fourth data bit in non-overlapping sets. With this assignment, the probability of detecting multiple-bit errors is much greater than that of a sequential assignment scheme.

Because of virtual cut-through routing, it is a possibility that a packet detected as corrupt may have already been forwarded through multiple downstream routers. Thus, it cannot simply be dropped and re-transmitted. Instead, the router detecting the error modifies the last byte of the packet to indicate the error condition, causing the packet to be dropped by whichever router eventually receives it. In the case where a corrupt packet is entirely stored in a virtual cut-through FIFO, it is possible to drop it immediately.

In addition to marking the corrupt packet, the router detecting the error additionally causes a link-level re-transmission using the mechanism described herein with respect to FIGS. 7 and 8(a). This recovery mechanism insures that only one "good" copy of every packet will arrive at the intended receiver. Packets that are marked as corrupt are discarded automatically by a router's Local Reception circuitry, and will not be inserted into a reception FIFO.

Another possible source of link-level errors is "lost" bits, which would lead to a misrouted, malformed packet. The network will simply report this condition and allow system software to recover.

End-to-End Errors

An end-to-end error detection mechanism is employed to ensure that packets are handled correctly and not corrupted by the routers. The link-level error detection mechanism cannot discover such errors because the parity bits are stripped and re-generated at each router in order to cover modified header bits. The mechanism for end-to-end error detection is preferably a cyclic redundancy check (CRC) on the packet fields that are not modified in transit such as the packet type, destination, and payload. Detection of an end-to-end CRC error is reported by the hardware, and leads to a checkpoint rollback.

Availability

Availability within the system of the invention is defined and managed on the granularity of a single rack. That is, the "rack" including 1024 nodes is determined good or bad and managed on that basis. At Initial Program Load, this determination is handled by diagnostics. At runtime, it is handled via error detection and reporting schemes. A Configuration Matrix is built to identify the status of all racks as defective racks are not available for inclusion in functional partitions.

Applications

There are many applications that benefit from the unique characteristics of the scalable ultra-computer of the invention as many new synergies may be brought to bear upon previously difficult algorithms. In light of these applications architectural improvements that have been included in the system include most significantly: a Torus link bandwidth doubled to 4 bits/pclk/direction; Global tree network; baseline memory size increased to 256 MB/node; and, the addition of the second processor core to each node to assist in message passing.

Scientific Applications Summary

Ab initio (based on fundamental principles) quantum molecular dynamics (MD) is uniquely positioned to simulate the behavior of materials at the microscopic level, and has found applications in several fields of science. It has been called "the Killer App" for ultra-computers. The JEEP code is a state-of-the-art implementation of ab initio molecular dynamics. Unlike what is done in classical MD codes, JEEP makes no empirical assumptions about the behavior of the electronic structure and inter-atomic interactions in a material. The electrons are free to form or break bonds, and the atoms are free to move and form molecules based solely on the laws of quantum mechanics and equations of motion.

A first-principles MD code like JEEP has applications in a wide variety of subject areas of interest. One example is the understanding of materials under extreme conditions of temperature or pressure. Another example involves forming a better understanding of complex biological systems and material properties. It is desired to simulate problems with $10^3$ to $10^4$ atoms in $10^6$ to $10^7$ volume elements, a factor or about $10^2$ to $10^4$ increase in computations per time step over current calculations. In addition, $10^3$ to $10^4$ longer simulation times are required.

Materials Applications

Codes such as JEEP provide insights into warm matter physics, the interval between condensed matter physics (e.g., cold material at solid density) and plasma physics (e.g., ionized material) which region has been difficult to approach from both a theoretical and experimental standpoint. JEEP has been used to model the response of a microscopic chunk of silicon carbide (an amorphous semiconductor) as it is stretched to the breaking point. This simulation was the first time that hardness had been computed from first principles for a disordered alloy. This study allows for relating the onset of failure to the chemical properties of the material, which has been difficult to characterize both theoretically and experimentally in the past.

Shock-compressed liquid deuterium. Calculating Hydrogen EOS in unusual conditions (pressure and temperature). These probe warm matter between solids and plasmas—not condensed matter cold dense matter—falls between ½ eV and 10 eV very difficult from a scientific standpoint. Equations of State (EOS) and opacity data is weakest in this regime.

Other applications in materials science for JEEP attainable only on this class of ultra-computer include: Water under pressure (connection with experimental program); Crystal structure of carbon dioxide at high pressure: "super-hard" polymeric carbon dioxide.

Biological Applications

JEEP is currently examining what happens to a small isolated fragment of the DNA backbone in water. These groundbreaking simulations are important because they are really the first of DNA fragments in the real biological environment (aqueous solution). For example, a simulation investigates how a molecule of dimethyl phosphate from the fragment interacts with water molecules. These ab initio simulations are being compared with widely used empirical models of the interaction. It is expected that these simulations will validate or invalidate the assumptions made in standard models of DNA interactions. However, the current simulations are limited to small segment of backbone with a few base pairs and a minimal amount of water molecules. In addition, the simulations are limited to picosecond timescales. Biologically interesting timescales are hundreds of microseconds. With the system of the invention, biologically significant DNA segments can be modeled in full aqueous solution over biologically relevant timescales. With the capability of the invention, significant understanding of DNA in biologically accurate situations can be gained via simulation. This portends a potentially significant advance for biochemistry.

In another biological application of JEEP, a single DNA base pair is extracted to see how the complementary bases interact. The goal of this research is to understand what causes DNA to bind and which molecular interactions are key to binding. The hope is to discover how binding mechanisms affect the replication of DNA. This will support the understanding of the fidelity of DNA replication in the light of damage or mutation. With the extraordinary computational capability of the present invention, these detailed examinations may be accomplished for the first time. This will lead to better models for DNA binding and interactions in biologically important contexts.

JEEP Algorithm

JEEP is a proprietary algorithm currently written in C++ using MPI and OpenMP. Density functional theory (DFT) is used to describe electron motion (electron-electron and electron-nuclei interactions) around the more slowly moving atomic cores, and classical dynamics to compute motion of the atomic cores in space. The most important and time-consuming part of the simulation is the calculation of the electronic structure at each molecular dynamics step. This involves the solution of the Kohn-Sham equations, which are coupled non-linear integro-differential equations for each electronic state.

The algorithm used in JEEP is based on Fourier expansion of the solutions. The critical parts of this algorithm are three-dimensional complex Fourier transforms, orthonormalization of several thousands of long ($10^6$-$10^7$) complex vectors. An efficient implementation of these two operations is likely to ensure the efficient performance for the entire algorithm.

The supercomputer of the present invention efficiently implements the FFT, linear equations, and matrix transpose operations needed by this application. Further details regarding the performance of a three-dimensional (Fast Fourier Transform) FFT is described in greater detail in herein-incorporated, commonly-owned, co-pending U.S. patent application Ser. No. 10/468,998 entitled "Efficient Implementation of Multidimensional Fast Fourier Transform on a Distributed-Memory Parallel Multi-Node Computer".

Scientific Applications Summary

Recent research in Fermion Monte Carlo offers a major advance in capability for solving quantum many-body problems, including those that arise in electronic and atomic structure, in condensed matter, in nuclear physics, and in biology. The numerical solution of the Schrödinger Equation for many-body systems has been the subject of research for more than six decades, but so far, there have emerged no methods capable of accurate solution that involve no uncontrolled approximation. Indeed that problem is so formidable that a subject of major research interest (and a recent Nobel Prize in Chemistry) is density function theory whose premise is that the solution of the many-body equation is essentially impossible. The key difficulty is that of dimensionality: the equation that describes the state of a 20-electron system (such as two molecules of water) is a partial differential equation in 60 dimensions. There is no known way of mapping this exactly into three dimensions, and traditional methods for the numerical solution of partial differential equations fail in this high-dimensional space.

It is generally well known that Monte Carlo methods offer practical methods for the numerical treatment of mathematical problems in high dimensions. They are routinely used in radiation transport (for up to seven dimensions) and in statistical physics (up to millions of dimensions.) Methods for solving certain Schrödinger equations (for lowest states whose solutions are everywhere positive) have also been available for several decades. But the unambiguous application to most problems of physical interest have been impeded by the problem—well known in this field—called "the Fermion Sign Problem." Its full description is too technical for this brief report, but in essence it derives from the fact that many-electron systems must satisfy the Pauli Principle that the wave functions must be antisymmetric in the exchange of identical particles. The standard Monte Carlo approach builds on the fact that the Schrödinger equation in imaginary time is a diffusion equation, which is local. The Pauli principle imposes a non-local boundary equation, which is a profound impediment to Monte Carlo methods.

A new class of methods capable of overcoming this deep difficulty has been proposed as applications executed in the system of the invention. The central element of the new method is the use of correlated random walks for objects that carry algebraic signs. Very recent progress has demonstrated algorithmic changes that can speed up the performance of the programs by many orders of magnitude.

These quantum Monte Carlo computations will produce (for the first time) accurate numerical solutions to the many-fermion Schroedinger equation without any physical, mathematical, or numerical approximations. They will apply to a variety of physical systems of interest to the scientific community: atomic and molecular structure, condensed matter (such as hydrogen at high pressures) and nuclear structure.

Scientific Applications Summary

It is anticipated that dislocation simulations will be in a position to address "grand challenge" problems, such as work hardening at strains >10%, up to 100% dislocation patterning and development of plastic instabilities and flow localization, modeling dislocations in poly-crystallites, modeling the brittle-ductile transition.

The inventive architecture is very effective in addressing these problems by analyzing the algorithm for dislocation dynamics. Dislocation dynamics addresses problems in the mesoscale range, intermediate between the atomistic and the macroscopic regions. Much of the behavior of real materials is determined by the behavior of dislocations on this scale.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

The invention claimed is:

1. A scalable, massively parallel computing structure comprising:
   a plurality of processing nodes interconnected by independent networks, each node including one or more processing elements for performing computation or communication activity as required when performing parallel algorithm operations, each node comprising a system-on-chip Application Specific Integrated Circuit (ASIC) comprising two processing elements each capable of individually or simultaneously working on any combination of computation or communication activity, or both, as required when performing particular classes of algorithms; and,
   a first independent network comprising an n-dimensional torus network including communication links interconnecting said nodes in a manner optimized for providing high-speed, low latency point-to-point and multicast packet communications among said nodes or sub-sets of nodes of said n-dimensional torus network;
   a second independent network including a scalable global tree network comprising nodal interconnections that facilitate simultaneous global operations among nodes or sub-sets of nodes of said network; and,
   a third independent network includes a scalable global signal network comprising nodal interconnections for enabling asynchronous global operations among nodes or sub-sets of nodes of said network; and,
   partitioning means for dynamically configuring one or more combinations of independent processing networks according to needs of one or more algorithms, each independent network including a configurable sub-set of processing nodes interconnected by divisible portions of said first and second networks, and,
   means for enabling switching of processing among one or more said configured independent processing networks when performing particular classes of algorithms
   wherein each of said configured independent processing networks is utilized to enable simultaneous collaborative processing for optimizing algorithm processing performance.

* * * * *

UNITED STATES PATENT AND TRADEMARK OFFICE
CERTIFICATE OF CORRECTION

| | | |
|---|---|---|
| PATENT NO. | : 7,555,566 B2 | Page 1 of 1 |
| APPLICATION NO. | : 10/468993 | |
| DATED | : June 30, 2009 | |
| INVENTOR(S) | : Matthias A. Blumrich et al. | |

It is certified that error appears in the above-identified patent and that said Letters Patent is hereby corrected as shown below:

Column 1, line 2:
It Should Read:

STATEMENT REGARDING FEDERALLY SPONSORED RESEARCH

This invention was made with Government support under subcontract number B517552 under prime contract number W-7405-ENG-48 awarded by the Department of Energy. The Government has certain rights in this invention.

Signed and Sealed this
Twenty-fifth Day of June, 2013

Teresa Stanek Rea
*Acting Director of the United States Patent and Trademark Office*